United States Patent [19]
Kusumoto et al.

[11] Patent Number: 5,717,624
[45] Date of Patent: Feb. 10, 1998

[54] ANALOG MEMORY CIRCUIT AND METHOD FOR RECORDING ANALOG SIGNAL

[75] Inventors: Keiichi Kusumoto, Nishinomiya; Kenji Murata, Katano; Yutaka Terada, Osaka; Akira Matsuzawa, Yawata, all of Japan

[73] Assignee: Matsushita Electric Industrial Co., Ltd., Japan

[21] Appl. No.: 739,867

[22] Filed: Oct. 31, 1996

[30] Foreign Application Priority Data

Nov. 1, 1995 [JP] Japan .................... 7-285358

[51] Int. Cl.$^6$ .................................... G11C 27/00
[52] U.S. Cl. .................... 365/45; 365/149; 365/174; 365/188
[58] Field of Search .................... 365/45, 149, 174, 365/187, 188, 184; 257/303, 306, 307

[56] References Cited

U.S. PATENT DOCUMENTS

| | | | |
|---|---|---|---|
| 4,970,689 | 11/1990 | Kenney | 365/149 |
| 5,018,105 | 5/1991 | Miyanishi | 365/149 |
| 5,253,196 | 10/1993 | Shimabukuro et al. | 365/45 |
| 5,434,816 | 7/1995 | Levi | 365/149 |

FOREIGN PATENT DOCUMENTS 5-20888  1/1993  Japan .

*Primary Examiner*—Vu A. Le
*Attorney, Agent, or Firm*—Snell & Wilmer; Michael K. Kelly

[57] ABSTRACT

An analog memory circuit of the present invention includes: a recording circuit for recording and holding an input analog signal as a charge and for reading out the analog signal after deterioration of the analog signal caused by leakage of the charge in a holding operation is eliminated; a selecting circuit for controlling an operation of the recording circuit; and a driving circuit for supplying a predetermined constant voltage to the recording circuit, wherein the recording circuit includes: an input/output terminal for inputting and outputting the analog signal; a first capacitor having a first electrode and a second electrode, for recording and holding the analog signal as the charge; and a second capacitor connected between the second electrode of the first capacitor and a reference potential, for holding a charge leaked from the first capacitor, and wherein an amount of charge corresponding to an amount of leaked charge held in the second capacitor is restored to the first capacitor with predetermined timing.

27 Claims, 27 Drawing Sheets

FIG. 9

| | | | | | | | | |
|---|---|---|---|---|---|---|---|---|
| S1 | ON | OFF | | | | | | |

Operation: Write | Hold | Read | Hold | Write | Hold | Read | Write

ANALOG MEMORY CIRCUIT AND METHOD FOR RECORDING ANALOG SIGNAL

BACKGROUND OF THE INVENTION

1. Field of the Invention

The present invention relates to an analog memory circuit capable of writing, holding over a long time and reading an analog voltage signal.

2. Description of the Related Art

In order to realize various systems, there exists an increasing need for an analog memory circuit capable of writing, holding and reading an analog voltage signal. The analog memory circuit is required not only to realize new systems but also to remarkably reduce a circuit's area and power consumption by replacing a digital circuit, which is currently used, with an analog circuit.

Main applications of the analog memory circuit include, for example, a discrete cosine transform (DCT) circuit, which is often used for image processing, and a computer using a neural circuit network (e.g., a neural computing circuit).

In the case where the analog memory circuit is used to perform a discrete cosine transform, the power consumption and the circuit area are remarkably reduced as compared with the case where the discrete cosine transform is performed by using a conventional digital circuit. Therefore, such an analog circuit greatly contributes in the reduction of the size of an apparatus and the power consumption in the field of image communications or the like.

The computer using a neural circuit network has a possibility of performing the functions closer to those of a human brain through learning. Therefore, such a computer is expected to be realized as a computing circuit of a next generation, capable of exceeding the limit of the digital computing method up to now. In order to realize this computer, an analog memory circuit having excellent performance is desirable.

The computer using a neural circuit network has been presently realized to a barely applicable level, where an analog circuit is used for actual computation processing. However, since an analog memory circuit having a sufficient function to record an analog signal cannot be used for recording the analog signal obtained by the computation, the result of the computation performed with an analog signal must be converted into a digital signal and be subsequently recorded in a digital memory circuit. Thus, the benefits of an analog circuit, that is, a remarkable reduction of the circuit area and the power consumption, cannot be sufficiently obtained.

FIG. 29A is a cross-sectional view showing the configuration of a conventional analog memory 50 formed on an n-type silicon substrate 1. FIG. 29B is a diagram showing an equivalent circuit of the analog memory circuit 50 shown in FIG. 29A.

The analog memory circuit 50 shown in FIG. 29A includes a switch S7 and a capacitor Cm. The switch S7 is typically an n-type MOS transistor. More specifically, n-type impurity diffused regions 3 and 4 serving as a source region and a drain region, respectively, are formed in a p-type impurity diffused region 2 formed in the n-type silicon substrate 1. Above a portion of the p-type impurity diffused region 2 corresponding to a channel region 5, that is, on a region between the n-type impurity diffused regions 3 and 4, a gate electrode 7 made of polysilicon is formed over a gate insulating film 6 made of a silicon Oxide film. A gate terminal 17 is connected to the gate electrode 7. An input terminal 16 of the switch S7 is connected to the n-type impurity diffused region 3 serving as a source region. Furthermore, the p-type impurity diffused region 2 is grounded.

Furthermore, the n-type impurity diffused region 4, serving as a drain region of the switch S7, is connected to one electrode 8 of the capacitor Cm made of polysilicon. The electrode 8 is opposed to the other polysilicon electrode 10 with a silicon oxide film 9 interposed therebetween, thereby constituting the capacitor Cm. A silicon oxide film 11 is interposed between the electrode 10 and the n-type silicon substrate 1 and the electrode 10 is grounded.

As is apparent from the equivalent circuit shown in FIG. 29B, when the switch S7 is turned ON while an analog signal (for example, a signal having a potential difference between a ground potential and a predetermined source voltage) is input from the input terminal 16, the analog signal applied to the input terminal 16 charges the capacitor Cm. Then, by turning the switch S7 OFF, the magnitude of the input analog signal is recorded in the capacitor Cm as a charge.

In the configuration of the conventional analog memory circuit 50 shown in FIG. 29A, there is a potential difference corresponding to an analog signal voltage between the potential of the electrode 8 and the ground voltage supplied to the electrode 10 in the state where the analog signal is recorded in the capacitor Cm. Since the electrode 8 is connected to the drain of the switch S7 (n-type impurity diffused region 4), a potential difference corresponding to the analog signal voltage also exists between the drain region 4 and the grounded p-type impurity diffused region 2. Therefore, in the state where the analog signal is recorded in the capacitor Cm, a diode constituted as a pn junction between the n-type impurity diffused region (drain region) 4 and the p-type impurity diffused region 2 is in a reverse bias state.

In this reverse bias state, a reverse bias current $I_L$ flows from the n-type impurity diffused region 4 toward the p-type impurity diffused region 2. The reverse bias current $I_L$ causes charge stored in the capacitor Cm corresponding to the recorded analog signals to gradually flow out. Therefore, the voltage level of the analog signal recorded in the capacitor Cm generally decreases, and finally results in zero.

In the configuration of the conventional analog memory circuit 50 shown in FIG. 29A, a period of time during which the analog signal recorded in the capacitor Cm is actually held depends on to what degree the voltage level of the recorded analog signal decreases due to the flow of charge caused by the reverse bias current $I_L$. In the conventional analog memory circuit 50, the actual record holding time determined by the above factors is shorter than that required in many systems, and is typically on the order of only several seconds. However, in an application where a complicated computation should be performed using a large amount of data, for example, in the field of image processing, the recorded signal is desired to be held on the order of several minutes to several hours.

Thus, in order to actually put the analog memory circuit into a practical use, a period of time for holding the recorded signal should be prolonged.

In the conventional analog memory circuit, this problem is solved by design modification.

For example, by increasing a capacitance value of the capacitor Cm for holding the analog signal to be recorded as a charge, a period of time for holding the recorded signal can be prolonged. Specifically, since the amount of storable charge increases as the capacitance value of the capacitor Cm increases, a time period until the voltage level of the recorded analog signal falls below a predetermined voltage level can be prolonged even when the reverse bias current $I_L$ flows.

However, when the capacitance value of the capacitor Cm is increased in this manner, a time constant, which is determined by a resistance of the switch S7 in its ON state (that is, an ON resistance of an n-type MOS transistor) and a capacitance value of the capacitor Cm, is also increased. As a result, the period of time required to charge the capacitor Cm by using an analog signal to be recorded becomes long. This prevents the analog memory circuit 50 from operating at high speed.

An ON resistance of the n-type MOS transistor can be reduced by increasing a gate width W thereof. Accordingly, when the gate width W of the n-type MOS transistor is designed to be wide, a period of time for charging the capacitor Cm by using an analog signal can be shortened. On the other hand, however, an increase of the gate width W causes an increase in the area of an interface between the p-type impurity diffused region 2 and the n-type impurity diffused regions 3 and 4 serving as the source/drain regions in the configuration shown in FIG. 29A. Since the reverse bias current $I_L$ flowing across the interface increases in proportion to the area of the interface, the increase of the gate width W results in a corresponding increase in the amount of charge flowing out from the capacitor Cm. As a result, the record holding time of the analog memory circuit 50 is reduced.

In this manner, it is sufficient to increase a time constant related to the capacitor Cm so as to prolong the record holding time in the conventional analog memory circuit 50. At the same time, however, this results in the time for charging the capacitor Cm by using an analog signal to become long, and the operating speed of the analog memory circuit 50 to become low. Specifically, the charging time and the record storing time have a tradeoff relationship in the conventional analog memory circuit 50. Thus, it is difficult to realize a sufficient function while attaining both prolonged record holding time and high speed of operation.

Japanese Laid-Open Patent Publication No. 5-20888 discloses a technique for solving the problem of charge leakage in an analog memory using a capacitor. FIG. 30 is a block diagram showing the principle of the technique disclosed in this publication.

In the configuration shown in FIG. 30, analog data is recorded in a capacitor Cmem as a voltage value. An accumulator 3011 successively accumulates a supplied pulse voltage, and then outputs it as an analog accumulated voltage. A comparator 3012 compares the level of the stored voltage in the capacitor Cmem with the level of the analog accumulated voltage supplied from the accumulator 3011. When the stored voltage in the capacitor Cmem is reduced due to leakage of charge below the analog accumulated voltage supplied from the accumulator 3011, the comparator 3012 activates a switch 3013 so as to apply the analog accumulated voltage supplied from the accumulator 3011 to the capacitor Cmem and so as to clear the analog accumulated voltage obtained in the accumulator 3011. As a result, a refresh operation of the stored voltage of the capacitor Cmem is executed so as to restrain, to a certain extent, the adverse effect of leakage of charge from the capacitor Cmem.

However, the refresh operation of the capacitor Cmem in the above technique is not performed using information corresponding to the amount of actually leaked charges from the capacitor Cmem. Therefore, the refresh operation is not always performed with sufficiently high accuracy. Accordingly, there is a possibility that the accurate holding of analog data over a long period of time may not be ensured.

SUMMARY OF THE INVENTION

An analog memory circuit of the present invention includes: a recording circuit for recording and holding an input analog signal as a charge and for reading out the analog signal after deterioration of the analog signal caused by a leakage of the charge in a holding operation is eliminated; a selecting circuit for controlling an operation of the recording circuit; and a driving circuit for supplying a predetermined constant voltage to the recording circuit, wherein the recording circuit includes: an input/output terminal for inputting and outputting the analog signal; a first capacitor, having a first electrode coupled to the input/output terminal and a second electrode, for recording and holding the analog signal as the charge; and a second capacitor connected between the second electrode of the first capacitor and a reference potential, for holding a charge leaked from the first capacitor, and wherein an amount of charge corresponding to an amount of leaked charge held in the second capacitor is restored to the first capacitor with predetermined timing.

In one embodiment of the present invention, the driving circuit supplies the reference potential to the second electrode of the first capacitor in a recording operation of the analog signal, and supplies an amount of charge corresponding to the amount of charge leaked from the first capacitor to the first electrode of the first capacitor, thereby restoring the leaked charge to the first capacitor.

In another embodiment of the present invention, the driving circuit includes: an operational amplifier having an inverted input terminal, a positive input terminal and an output terminal; and a switch for connecting the inverted input terminal and the output terminal of the operational amplifier, and wherein the positive input terminal of the operational amplifier is connected to the reference potential.

In still another embodiment of the present invention, the selecting circuit includes a first switch for connecting the first electrode of the first capacitor with the output terminal of the operational amplifier included in the driving circuit; and a second switch for connecting a connection point between the first capacitor and the second capacitor with the inverted input terminal of the operational amplifier.

In still another embodiment of the present invention, the analog memory circuit further includes a switch for connecting the inverted input terminal of the operational amplifier included in the driving circuit with the reference potential.

In still another embodiment of the present invention, the analog memory circuit further includes a switch for connecting a connection point between the first capacitor and the second capacitor with the reference potential.

In still another embodiment of the present invention, the analog memory circuit further includes a third capacitor, wherein one electrode of the third capacitor is connected to the first electrode of the first capacitor, and the other electrode of the third capacitor is connected to the reference potential.

In still another embodiment of the present invention, the recording circuit further includes a switch constituted by an MOS transistor, wherein the MOS transistor includes: a first impurity diffused region of a second conductivity type formed in a semiconductor substrate of a first conductivity type; and a second impurity diffused region of the first conductivity type formed in the first impurity diffused region, and wherein the third capacitor is obtained by applying a reverse bias voltage across the first impurity diffused region and the second impurity diffused region.

In still another embodiment of the present invention, the analog memory circuit further includes a fourth capacitor, wherein one electrode of the fourth capacitor is connected to the inverted input terminal of the operational amplifier included in the driving circuit, while the other electrode of the fourth capacitor is connected to the reference potential.

In still another embodiment of the present invention, at least one of the first capacitor and the second capacitor is formed by an impurity diffused region of a second conductivity type formed in a semiconductor substrate of a first conductivity type, and an insulating film and a conductor layer which are successively formed on the impurity diffused region.

In still another embodiment of the present invention, the first capacitor and the second capacitor are formed by two impurity diffused regions of a second conductivity type formed in a semiconductor substrate of a first conductivity type, interposing a heavily doped impurity diffused region of the first conductivity type therebetween, and an insulating layer and a conductor layer which are successively formed on the heavily doped impurity diffused region and the two impurity diffused regions.

In still another embodiment of the present invention, the first capacitor and the second capacitor are formed by two conductor regions placed adjacent to each other on an impurity diffused region of a second conductivity type formed in a semiconductor substrate of a first conductivity type, and an insulating layer and a conductor layer which are successively formed on the two conductor regions.

In still another embodiment of the present invention, an MOS transistor constituting the second switch of the selecting circuit includes: a first impurity diffused region of a second conductivity type formed in a semiconductor substrate of a first conductivity type; and a second impurity diffused region of the first conductivity type formed in the first impurity diffused region, wherein a third impurity diffused region of the second conductivity type is further formed in the second impurity diffused region, and a fourth impurity diffused region of the first conductivity is further formed in the third impurity diffused region, wherein the first capacitor is a capacitor obtained by applying a reverse bias voltage across the fourth impurity diffused region and the third impurity diffused region, and the second capacitor is a capacitor obtained by applying a reverse bias voltage across the second impurity diffused region and the first impurity diffused region, and wherein the second impurity diffused region and the third impurity diffused region are electrically connected to each other.

In still another embodiment of the present invention, the recording circuit includes a switch constituted by an MOS transistor, wherein the MOS transistor includes: a lower insulating layer formed on a first impurity diffused region; a lower conductor layer formed on the lower insulating layer; an upper insulating layer formed on the lower conductor layer; and an upper conductor layer formed on the upper insulating layer, wherein the first capacitor is formed by the first impurity diffused region, the lower insulating layer and the lower conductor layer, and the second capacitor is formed by the lower conductor layer, the upper insulating layer and the upper conductor layer, and wherein the lower conductor layer is connected to an impurity diffused region forming another MOS transistor constituting the second switch of the selecting circuit.

In still another embodiment of the present invention, the driving circuit includes an inverted amplifier having an inverted input terminal and an output terminal.

In still another embodiment of the present invention, the driving circuit includes: a detecting section for detecting an amount of change in a voltage of the analog signal recorded in the recording circuit, which is caused due to an occurrence of the charge leakage, so as to supply an output signal indicating the detected amount of change in the voltage; and a supplying section for receiving the output signal of the detecting section so as to supply an amount of charge corresponding to the detected amount of change in the voltage to the first capacitor.

In still another embodiment of the present invention, the detecting section is a differential voltage detecting circuit for detecting a potential difference between two input terminals, one of the two input terminals being connected to a connection point between the first capacitor and the second capacitor included in the recording circuit, while the other input terminal is coupled to a predetermined standard potential, and wherein the supplying section is a current output circuit for outputting a current having a magnitude in accordance with an input signal, and for supplying a current having a magnitude in accordance with an output signal of the differential voltage detection circuit to the first capacitor so as to supply the charge thereto.

In still another embodiment of the present invention, the detecting section is connected between the first capacitor and the second capacitor included in the recording circuit, and has a charge movement amount detecting circuit for detecting an amount of charge transferred between the first capacitor and the second capacitor.

In still another embodiment of the present invention, the driving circuit includes: a variable impedance circuit connected between a connection point between the first capacitor and the second capacitor included in the recording circuit and a predetermined reference potential, having an impedance varying in accordance with a potential difference between a supplied input potential and the predetermined reference potential; and a converting section for detecting an amount of change in a voltage of the analog signal recorded in the recording circuit, which is caused due to an occurrence of the charge leakage, from the predetermined reference potential so as to supply a current having a magnitude corresponding to the detected amount of change in voltage across the first capacitor.

In still another embodiment of the present invention, the variable impedance circuit is further connected to the converting section.

In still another embodiment of the present invention, the reference potential is a ground potential.

In still another embodiment of the present invention, the analog signal is a differential signal containing a first signal component and a second signal component, and wherein the first capacitor records and holds the first signal component of the differential signal as a charge, and wherein the recording circuit further includes a third capacitor for recording and holding the second signal component of the differential signal as a charge, and further wherein the second capacitor holds a charge leaked from the third capacitor, and an amount of charge corresponding to the amount of the leaked charge held in the second capacitor is restored to the first capacitor and the third capacitor with predetermined timing.

In still another embodiment of the present invention, a plurality of the recording circuits are arranged in a matrix, and each of a plurality of the driving circuits is arranged for each row of the matrix so as to be connected thereto, thereby recording a plurality of the analog signals.

In still another embodiment of the present invention, the analog memory circuit further includes a plurality of storing circuits, wherein each of the plurality of the storing circuits is connected to each row of the matrix, and has a plurality of capacitors, wherein the plurality of the storing circuits have respectively different capacitance values in a predetermined proportion, and wherein the analog signals recorded in a predetermined recording circuit among the plurality of recording circuits arranged in the matrix are selectively charged to the plurality of the capacitors of the storing circuits as charge in a sequential manner, and the stored charge is distributed to the plurality of the recording circuits, thereby performing a multiplicational computation and an additional computation for the plurality of the analog signals.

According to another aspect of the invention, a method for recording an analog signal, includes the steps of: inputting an analog signal to an analog memory circuit; recording the input analog signal on a recording section in the analog memory circuit as a charge; holding the recorded analog signal over a predetermined period of time; storing a charge which is leaked from the recording section in the holding operation to a predetermined portion and then restoring an amount of charge corresponding to an amount of the stored leaked charge to the recording section; and reading out the analog signal from the analog memory circuit.

In one embodiment of the present invention, the method for recording an analog signal further includes the step of detecting the amount of charge leaked from the recording section.

In another embodiment of the present invention, the analog signal is plural, and the method includes the steps of: selectively storing a predetermined analog signal among the plurality of the recorded analog signals as a charge into a plurality of capacitors having respectively different capacitance values in a predetermined proportion in a sequential manner; and distributing the stored charge to the plurality of the recording circuits, thereby performing a multiplication computation and an additional computation for the plurality of the analog signals.

Hereinafter, the function of the present invention will be summarized.

According to the configuration of an analog memory circuit of the present invention, in the case where an analog signal is recorded in a recording circuit as a charge and then is held over a certain period of time, even if the recorded analog signal is deteriorated by occurrence of the leakage of charge, the analog signal is restored to the state where no deterioration has occurred by performing an operation for restoring, i.e., getting the amount of charge corresponding to the amount of leaked charge back to the recording circuit (hereinafter, such an operation is also referred to as "the reproduction operation") prior to actual reading of the analog signal.

In the case where the analog signal supplied from an input/output terminal of the recording circuit is recorded in the analog memory circuit of the present invention, a switch for providing connection between the input/output terminal and a first electrode of a first capacitor of a recording circuit is turned ON, while the other electrode of the first capacitor is set to a reference potential serving as a constant voltage. By this operation, the first capacitor records the analog signal input from the input/output terminal with the constant voltage supplied as a reference potential.

In addition, when the analog signal is recorded, the same constant voltage (reference voltage) is applied to both electrodes of a second capacitor included in the recording circuit. As a result, the amount of charge stored in the second capacitor is set to be a predetermined value regardless of the amount of charge stored previously. Therefore, the above operation can be referred to as an initialization operation for the charge stored in the second capacitor. For example, in the case where the reference potential is a ground potential, the amount of charge stored in the second capacitor can be always set to zero by this initialization operation.

In a holding operation, a switch connected to the electrode of the first capacitor, for example, a switch for connecting the first capacitor and an input/output terminal of an analog signal, is turned OFF. As a result, the first capacitor in which the analog signal is recorded is rendered to be in an open state. Ideally, the analog signal recorded in the first capacitor is held as it is. However, even when the switch is in an OFF state, if time for holding the analog signal becomes long, a certain amount of charge is leaked from the first capacitor through the switch due to the effect of the held voltage value. In the configuration of the analog memory circuit according to the present invention, the charge thus leaked from the first capacitor are stored in the second capacitor.

When the recorded analog signal is to be read out, the initial amount of charge in the initialization operation is restored without supplying charge to the electrodes of the second capacitor. As a result, the amount of charge leaked from the first capacitor in the holding operation can be detected. Therefore, the amount of charge corresponding to the amount of leaked charge can be supplied to the first capacitor. This reproducing operation is performed by a driving circuit.

In the analog memory circuit of the present invention, after leaked charge is restored in the first capacitor, the recorded analog signal is read out. Therefore, the recorded analog signal is output after the deterioration occurring due to the leakage of charge is eliminated.

For a reading operation in the analog memory circuit of the present invention, the amount of charge leaked in a holding operation is resupplied.

Furthermore, in the case where a driving circuit includes an operational amplifier (having an inverted input terminal, a positive input terminal and an output terminal) and a switch for connecting the inverted input terminal to the output terminal of the operational amplifier, and the inverted input terminal of the operational amplifier is connected to the reference potential, a connection point between the first and the second capacitors is set to a constant voltage level by the reference potential applied to the inverted input terminal of the operational amplifier. The setting of a constant voltage level is accomplished for a recording operation of the analog signal by turning ON the switch connected between the inverted input terminal and the output terminal of the operational amplifier. When the inverted input terminal and the output terminal are connected to each other in this way, a negative feedback loop is formed therebetween. As a result, based on the high voltage gain characteristics of the operational amplifier, the potential of the inverted input terminal is set to a reference potential supplied to the positive input terminal. By setting the potential of the connection point between the first and the second capacitors by the operational amplifier, an analog signal is recorded in the first capacitor with respect to a constant voltage point (driving voltage point) supplied by the reference potential as a standard. On the other hand, the same reference potential (constant voltage) is supplied to both electrodes of the second capacitor. As a result, as described above, the state of the charge stored in the second capacitor is initialized.

In a holding operation, a switch connected to a terminal A of the first capacitor is turned OFF, and a switch connected to a terminal B is also turned OFF. As a result, since the first and second capacitors are separated from the input terminal and the driving circuit, charge is not newly supplied to each of the capacitors. Therefore, it is possible to hold the recorded analog signal as it is.

In a reading operation, a connection point between the first and the second capacitors is connected to the inverted input terminal of the operational amplifier, while the first electrode of the first capacitor is connected to the output terminal of the operational amplifier. Then, the output terminal of the operational amplifier is connected to the inverted input terminal via the first capacitor, thereby forming a negative feedback loop there. As a result, the first capacitor included in the negative feedback loop is driven so that the potential of the inverted input terminal of the operational amplifier, which is subjected to a negative feedback, is set to the reference potential (constant voltage) connected to the positive input terminal. By this operation, the amount of charge leaked from the first capacitor in the holding operation and then stored in the second capacitor is restored to the first capacitor. As a result, deterioration caused due to charge leakage is eliminated from the recorded analog signal. Therefore, the analog signal can be read out without deterioration.

When a switch for connecting the inverted input terminal of the operational amplifier and the reference potential is further provided, an electrode on the side of the connection point between the first and the second capacitors is driven by a current from the reference potential in addition to an output current from the operational amplifier in the initialization operation of the second capacitor, which is executed when the analog signal is recorded. As a result, initialization speed of the second capacitor is improved.

Alternatively, when a switch for connecting the connection point between the first and second capacitors and the reference potential is further provided, an electrode on the side of the connection point between the first and the second capacitors is driven by a current from the reference potential in addition to an output current from the operational amplifier in the initialization operation of the second capacitor, which is executed when the analog signal is recorded. As a result, initialization speed of the second capacitor is improved.

When a third capacitor for connecting the first electrode of the first capacitor included in the recording circuit to the reference potential is further provided, various adverse effects of parasitic capacitors present at the first electrode of the first capacitor are alleviated, thereby stabilizing the holding operation of the analog signal. As an example of the parasitic capacitance, a capacitor generated by reverse biasing a p-type impurity diffused region and an n-type impurity diffused region in an MOS transistor constituting a switch is taken.

As such, when a third capacitor is generated by applying a reverse bias voltage to an pn junction between a drain (source) and a substrate (well) utilized in the MOS transistor constituting the switch included in the recording circuit to connect the first capacitor and the input/output terminal, a circuit area required to form the capacitor is reduced and a recording density can be improved.

When a fourth capacitor for connecting the inverted input terminal of the operational amplifier included in the driving circuit to a reference potential is further provided, the potential of the inverted input terminal of the operational amplifier is set to the same voltage level as the reference potential connected to the positive input terminal even when a negative feedback loop connected thereto is not constituted. As a result of this, when a negative feedback loop connected to the inverted input terminal is constituted, the inverted input terminal is immediately set to a constant voltage point determined by the reference potential. Therefore, the speed of a recording operation and a reading operation of an analog signal is improved.

For forming a capacitor included in the analog memory circuit of the present invention, it is possible to form the capacitor utilizing a pn junction formed in the periphery of the impurity diffused region of the MOS transistor constituting the switch included in the analog memory circuit. For example, by depositing an insulating layer (for example, a silicon oxide film) and a conductor layer (for example, a polysilicon layer) on an impurity diffused region corresponding to a drain (source) region of the MOS transistor, it is possible to form a capacitor between the impurity diffused region and the conductor layer. Alternatively, a capacitor can be formed by forming another impurity diffused region of one conductivity type (that is, an inverted impurity diffused region) in an impurity diffused region of the other conductivity type corresponding to a drain (source) region of the MOS transistor and by applying a reverse bias voltage to a pn junction therebetween. Moreover, another capacitor can be formed by forming another pair of impurity diffused regions in the inverted impurity diffused region and by applying a reverse bias voltage to a pn junction therebetween. According to these configurations, a circuit area required to form a capacitor is reduced, thereby improving a recording density.

Moreover, when two terminals for inputting and outputting an analog signal and two capacitors for storing an analog signal as a charge are provided, it is possible to handle an analog signal supplied as a differential signal. At this time, when another capacitor is further connected between the two capacitors, it is possible to store charge leaked from the two capacitors. Therefore, deterioration of the recorded analog differential signal can be eliminated prior to a reading operation.

When a plurality of recording circuits are arranged in a matrix and one driving circuit is provided for each row of the matrix and connected thereto, a recording operation, a holding operation, a reproducing operation and a reading operation can be performed in time series for each row of the matrix. By this configuration, a plurality of recording circuits can be driven by only one driving circuit. As a result, a circuit area required to realize an analog memory circuit and power consumption can be reduced. With this configuration, a plurality of analog signals can be recorded in the analog memory circuit.

Furthermore, a plurality of storing circuits, each including a plurality of capacitors having respectively different capacitance values in a predetermined proportion, are provided so that each of the storing circuits is connected to the matrix of the recording circuits. As a result, a multiplication and an addition can be performed for a plurality of analog signals recorded in a plurality of recording circuits.

Thus, the invention described herein makes possible the advantages of: (1) providing an analog memory circuit capable of recording an analog signal at high speed and holding the recorded analog signal over a long period of time with accuracy; and (2) providing a method for recording an analog signal having the aforementioned features.

These and other advantages of the present invention will become apparent to those skilled in the art upon reading and understanding the following detailed description with reference to the accompanying figures.

BRIEF DESCRIPTION OF THE DRAWINGS

FIG. 9 is a timing diagram showing the operation of the analog memory circuit shown in FIG. 8.

DESCRIPTION OF THE PREFERRED EMBODIMENTS

Hereinafter, an analog memory circuit of the present invention will be described by way of illustrative examples with reference to the drawings.

Example 1

Figure 1:
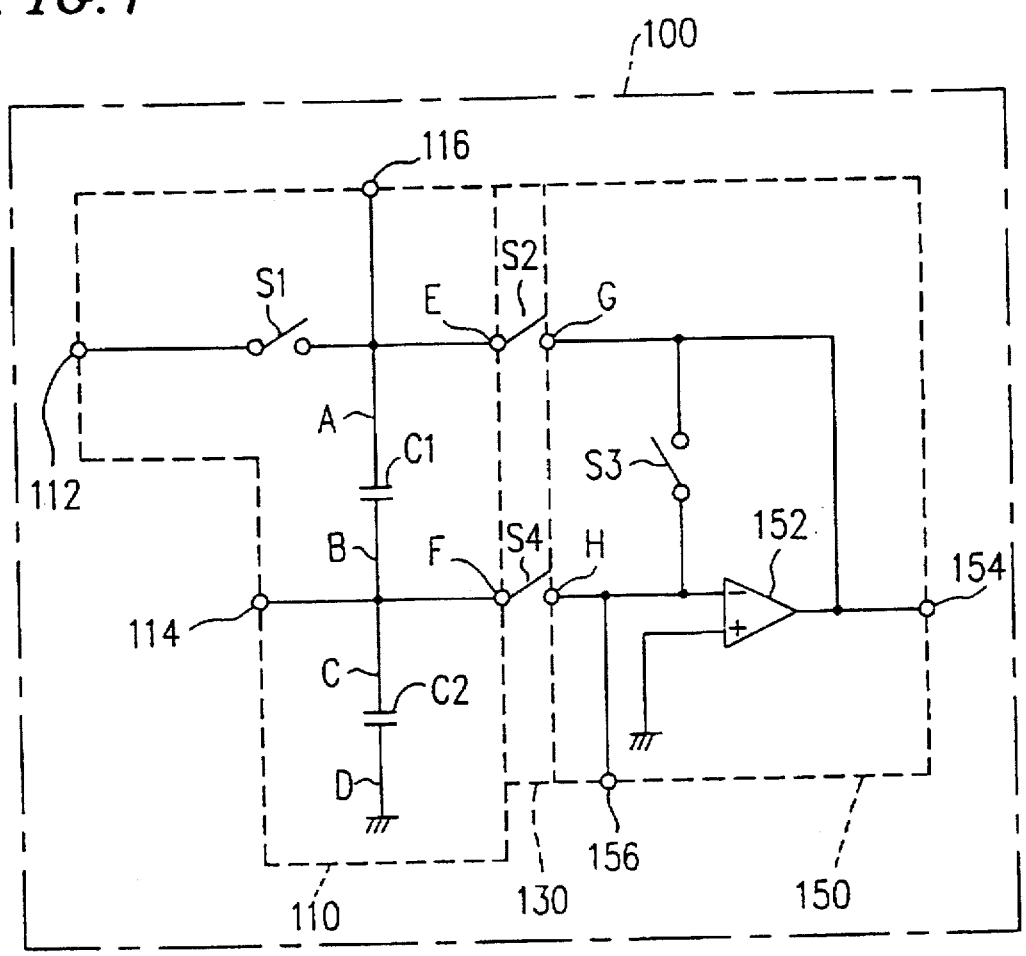
FIG. 1 is a circuit diagram showing the configuration of an analog memory circuit in Example 1 according to the present invention.

FIG. 1 is an analog memory circuit 100 of Example 1 according to the present invention.

The analog memory circuit 100 includes a recording circuit 110, a selecting circuit 130 and a driving circuit 150.

The recording circuit 110 includes an input/output terminal 112 of an analog signal, a switch S1, and capacitors C1 and C2 connected in series between one terminal of the switch S1 and a reference potential, for example, a ground potential.

One terminal of the switch S1 is connected to the input/output terminal 112, while the other terminal is connected to an electrode A of the capacitor C1. The other electrode B of the capacitor C1 is connected to an electrode C of the capacitor C2. The other electrode D of the capacitor C2 is connected to the reference potential. The reference voltage herein can be set at, for example, a ground voltage as shown in FIG. 1.

An injection terminal 114 is connected at a junction between the capacitors C1 and C2. Moreover, a holding terminal 116 is connected at a connection point between the switch S1 and the electrode A of the capacitor C1.

The selecting circuit 130 includes switches S2 and S4.

One terminal E of the switch S2 is connected at a junction between the switch S1 and the electrode A of the capacitor C1 in the recording circuit 110. On the other hand, one terminal F of the switch S4 is connected at a connection point between the capacitors C1 and C2 in the recording circuit 110.

The driving circuit 150 includes a switch S3 and an operational amplifier (op-amp) 152. An inverted input terminal of the operational amplifier 152 is connected to a terminal H of the switch S4 of the selecting circuit 130, while a positive input terminal thereof is connected to a reference potential (ground potential). Furthermore, an injection terminal 156 is connected to the negative inverted input terminal. On the other hand, an output terminal of the operational amplifier 152 is connected to an amplification output terminal 154 and to a terminal G of the switch S2 of the selecting circuit 130. Furthermore, the switch S3 is provided between the output terminal and the inverted input terminal of the operational amplifier 152.

Figure 2:
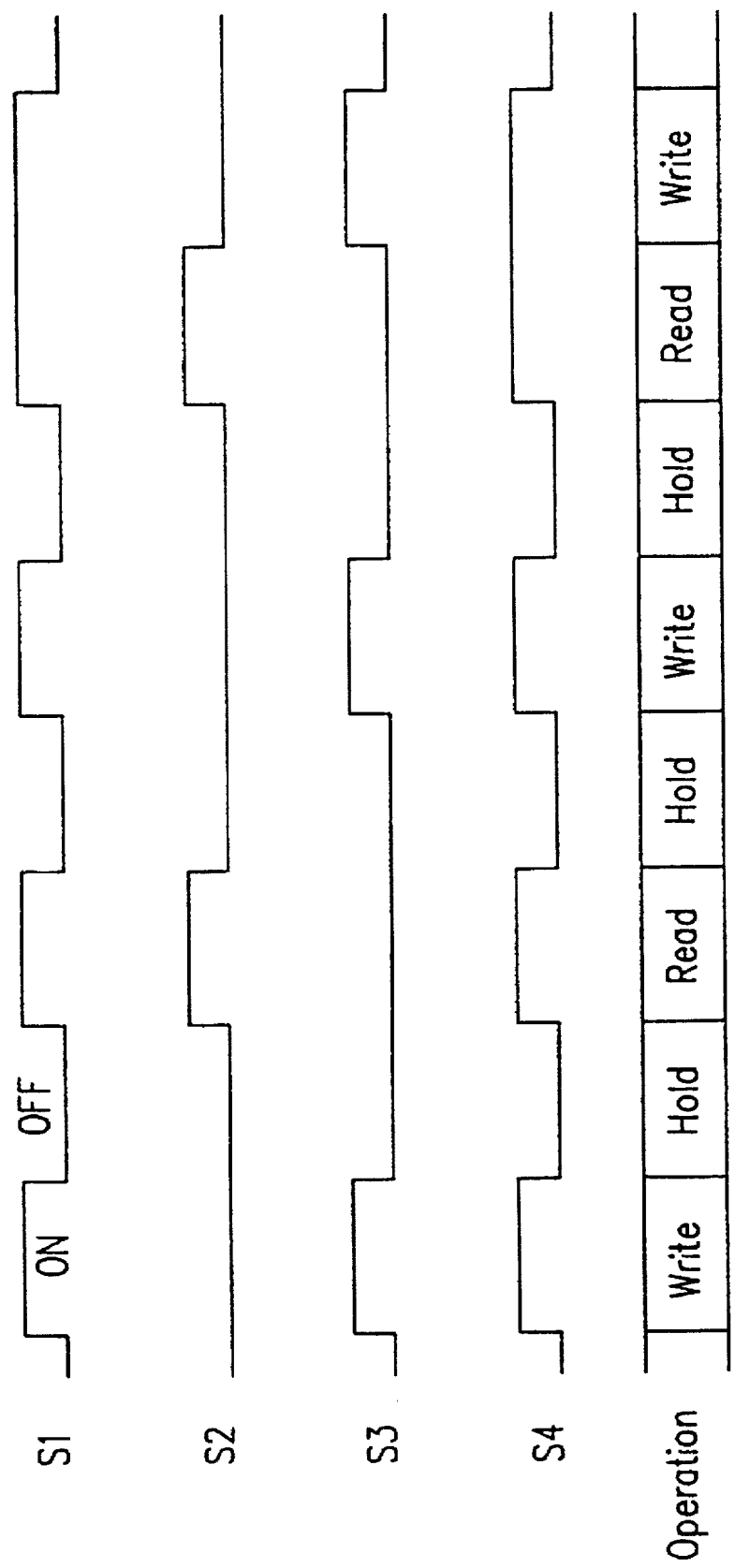
FIG. 2 is a timing diagram showing the operation of the analog memory circuit shown in FIG. 1.

The operation of the thus configured analog memory circuit 100 will be described with reference to a timing diagram shown in FIG. 2. FIG. 2 shows the ON/OFF timing of the switches S1 to S4 included in the analog memory circuit 100 and the execution timing of operations of writing, holding and reading.

First, a writing operation (recording operation) for recording an analog signal in the analog memory circuit 100 is performed.

For performing a writing operation, the switch S2 is turned OFF, while the other switches S1, S3 and S4 are turned ON. Therefore, the output terminal and the inverted input terminal of the operational amplifier 152 are short-circuited by the switch S3, so that the operational amplifier 152 operates in an imaginary ground condition. Then, the inverted input terminal of the operational amplifier 152 is set to the ground potential which serves as a reference potential. As a result, the electrode C of the capacitor C2, connected to the inverted input terminal of the operational amplifier 152 via the switch S4, is also set to the ground potential. On the other hand, since the other electrode D of the capacitor C2 is also grounded, the potentials of the electrodes C and D of the capacitor C2 become identical to each other. Therefore, the amount of stored charge in the capacitor C2 becomes zero. By this operation, a charge storing state of the capacitor C2 is initialized.

On the other hand, an analog voltage Vin is supplied to the electrode A of the capacitor C1 through the input/output terminal 112. Since the other electrode B of the capacitor C1 is connected to the electrode C of the capacitor C2 so as to be a ground potential, the amount of charge Qw1 represented by Qw1=C1×Vin is stored in the capacitor C1, where C1 is a capacitance value of the capacitor C1.

Next, a holding operation for holding the recorded analog signal is performed.

For performing the holding operation, the switches S1 to S4 are all turned OFF. As a result, the electrodes of the capacitors C1 and C2 are in an open state except for the grounded electrode D of the capacitor C2. Therefore, ideally, the charge Qw1 stored in the capacitor C1 by the writing operation is wholly stored.

However, each of the switches S1 to S4 in the actual circuit typically uses an MOS transistor. In the MOS transistor, a pn junction between the drain (source) region and the substrate (well) forms a diode. Normally, a reverse bias voltage is applied to the pn junction between the drain (source) region and the substrate (well) so as to prevent a large amount of current from flowing in a forward direction from the drain (source) region toward the substrate (well). Due to this reverse bias voltage, a reverse bias current flows from the drain (source) region toward the substrate (well).

The reverse bias voltage V and the reverse bias current I have the relationship represented by the following equation.

$$I = A_o \cdot I_o [exp(qV/mkT) - 1]$$

where m is a constant from 1 to 2; q is the charge for an electron and $q=1.6\times10^{-19}$ coulomb; k is a Boltzmann's constant and $k=1.38\times10^{-23}$ J/K; T is an absolute temperature; $A_o$ is a junction area between the drain (source) region and the substrate (well) in the diode; and $I_o$ is a value determined by an impurity concentration in the p-type impurity diffused region and an impurity concentration in the n-type impurity diffused region.

From the above expression, it is understood that the reverse bias current I increases as the reverse bias voltage V or the junction area $A_o$ increases.

In order to increase the charging speed of the capacitor C1 by using the analog signal, an ON resistance of the switch S1 (a resistance value generated between the drain and the source when the switch is turned ON) is designed to be small, so that a time constant determined by the ON resistance of the switch S1 and the capacitance of the capacitor C1 is small. However, in order to reduce the ON resistance of the switch S1, it is necessary to increase a drain (source) area of the switch S1.

Figure 3:
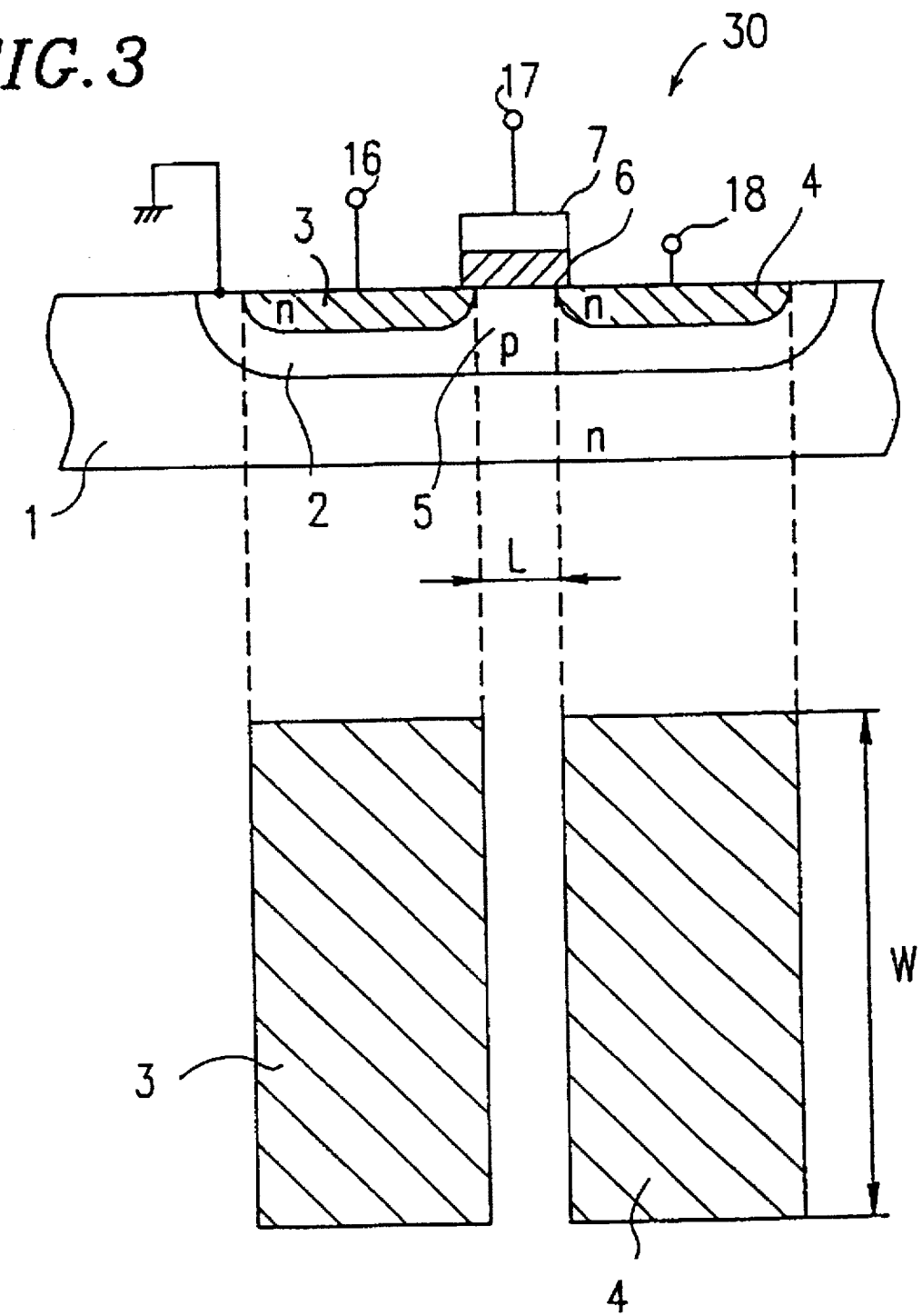
FIG. 3 is a cross-sectional diagram showing a typical configuration of an MOS transistor used as a switch included in the analog memory circuit shown in FIG. 1.
Figure 29A:
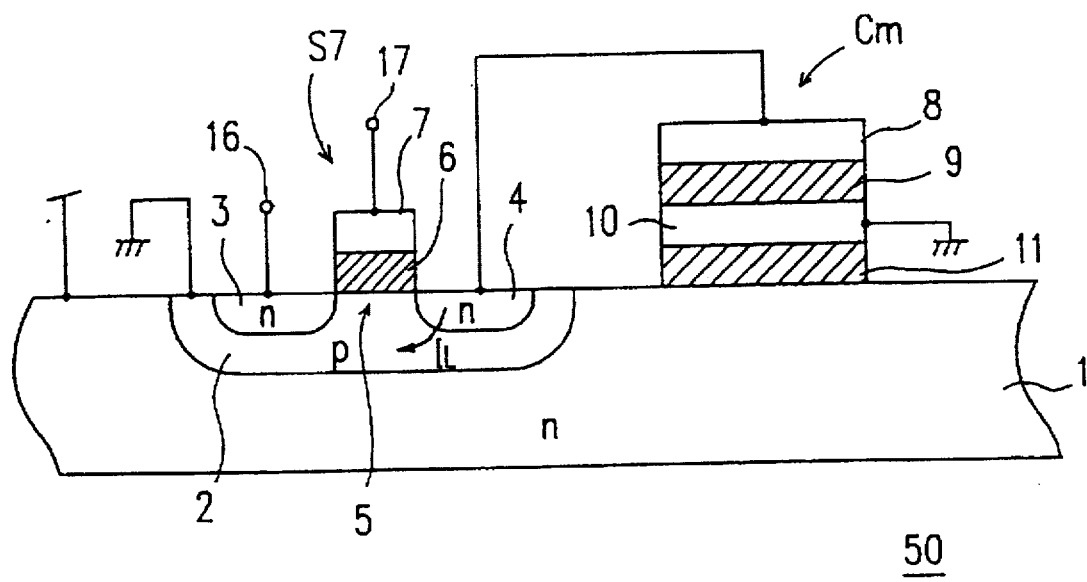
FIG. 29A is a cross-sectional view showing the configuration of a conventional analog memory circuit.
Figure 29B:
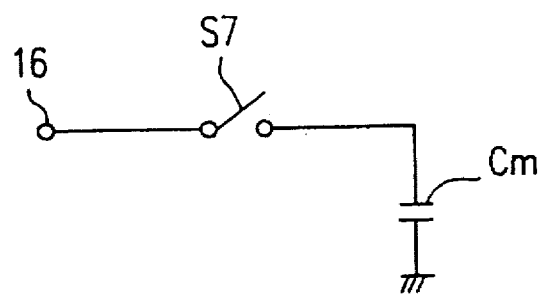
FIG. 29B is a equivalent circuit of the conventional analog memory circuit shown in FIG. 29A.
Figure 30:
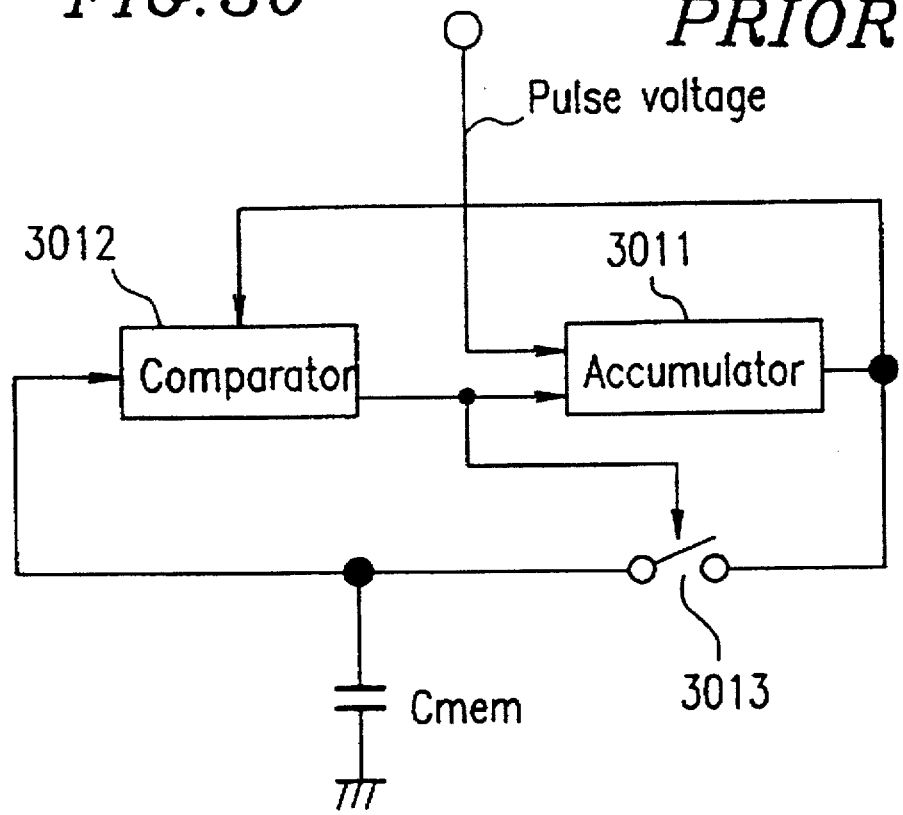
FIG. 30 is a block diagram showing the principle of a circuit configuration in a conventional analog memory circuit.

FIG. 3 is a cross-sectional view showing a typical configuration of an MOS transistor 30 which can be used as each of the switches S1 to S4 in the analog memory circuit 100 shown in FIG. 1. FIG. 3 also shows the source/drain regions 3 and 4 thereof, viewed from the above (a plan view). In the MOS transistor 30 shown in FIG. 3, the n-type impurity diffused regions 3 and 4 serving as the source/drain regions are provided opposed to each other, sandwiching a channel region 5 having a length (channel length or gate length) L therebetween. This configuration is basically the same as that of the switch S7 included in the conventional analog memory circuit 50 described with reference to FIG. 29A. Since corresponding components are denoted by the same reference numerals, the description thereof is herein omitted. In the MOS transistor 30, an output terminal 18 is connected to the n-type impurity diffused region 4 serving as a drain region.

In order to increase a drain (source) area, it is sufficient to increase a gate width W shown in FIG. 3. However, a pn junction area of the diode consisting of the drain region 4 and the well 5 correspondingly increases. Furthermore, a value of a reverse voltage generated by the held analog voltage Vin also increases. As a result of this, a large reverse current flows across the switch S1, resulting in a large amount of leaked charge Qw1 from the capacitor C1. Since the amount of charge stored in the capacitor C1 corresponds to the written analog signal, an error is adversely generated in the recorded analog signal by the leakage of charge as described above.

In the configuration of the analog memory circuit 100 shown in FIG. 1, when the amount of charge $q_L$ leaks from the electrode A of the capacitor C1 via the switch S1, charge $-q_L$ having the same amount with the opposite polarity leaks from the electrode B to be stored in the capacitor C2. This state is schematically shown in FIGS. 4A and 4B.

Figure 4A:
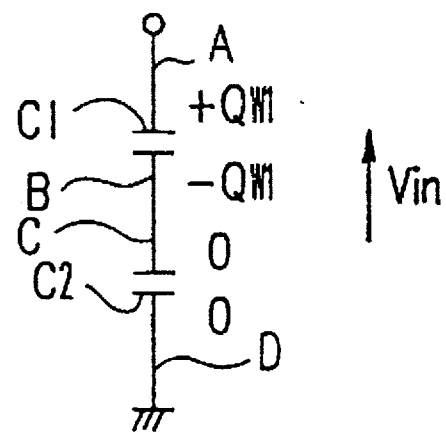
FIGS. 4A and 4B are circuit diagrams showing the state of charge stored in capacitors included in the analog memory circuit shown in FIG. 1 and the state where leakage of charge occurs.
Figure 4B:
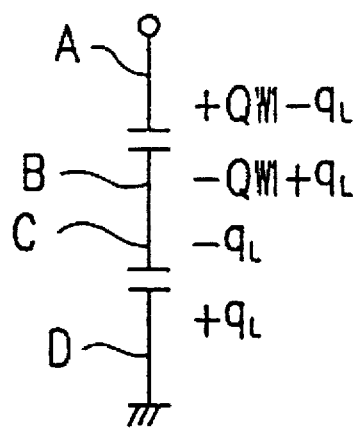

FIG. 4A shows the state of the charge distribution immediately after writing the charge Qw1 (analog signal Vin) to the capacitor C1. In this state, the charge Qw1 and −Qw1 having the same absolute value but the opposite polarity are stored in the electrodes A and B of the capacitor C1, respectively. On the other hand, FIG. 4B shows the state of the charge distribution after a certain period of time, where the charge $q_L$ has leaked from the capacitor C1. Due to the leakage of the charge $q_L$, the amounts of charge stored in the electrodes A and B of the capacitor C1 are respectively +(Qw1-$q_L$) and −(Qw1-$q_L$). Furthermore, charge −$q_L$, having the amount corresponding to the amount of leaked charge $q_L$ with the opposite polarity, are stored in the capacitor C2.

Although the charge stored in the capacitor C2 are also leaked due to a reverse current across the diode formed in the MOS transistor constituting the switch S4, the amount of charge thus leaked from the capacitor C2 is negligibly small. This is because a reverse current across the switch S4 is small and therefore a reverse direction voltage is scarcely generated. More specifically, since the electrode C of the capacitor C2 is substantially set at a ground potential, it is not necessary to significantly change its potential by the operational amplifier 152. As a result, since the gate width W of the switch S4 can be set to a minimum value, a reverse current becomes small and therefore a reverse voltage is scarcely generated.

Next, in a reading operation as seen in FIG. 2, the switches S1, S2 and S4 are turned ON, while the switch S3 is turned OFF. As a result, the electrode C of the capacitor C2 is connected to the inverted input terminal of the operational amplifier 152, while the electrode A of the capacitor C1 is connected to the output terminal of the operational amplifier 152, thereby forming a negative feedback loop. This negative feedback loop establishes an imaginary ground condition at the inverted input terminal of the operational amplifier 152. The potential of the inverted input terminal becomes equal to a reference potential (ground potential) to which the positive input terminal is connected. As a result, the amount of leaked charges $q_L$ is supplied to the electrode A of the capacitor C1. Therefore, the capacitor C1 is restored to the state where no leaked charge exists, while the capacitor C2 returns to its state immediately after the initialization. As a result, an analog signal having the same voltage level as that during the writing operation is output.

The aforementioned reading operation allows the charge which are once leaked from the capacitor C1 to be reproduced. Therefore, the above operation can refresh the recorded analog signal. More specifically, in the case where the written data is not read, but rather is held for a long period of time, a reading operation is performed in the course of the holding operation to restore the leaked charge so as to refresh the recorded analog signal. When such a reproducing operation is repeated, it is possible to hold an analog signal for a long period of time.

Figure 5:
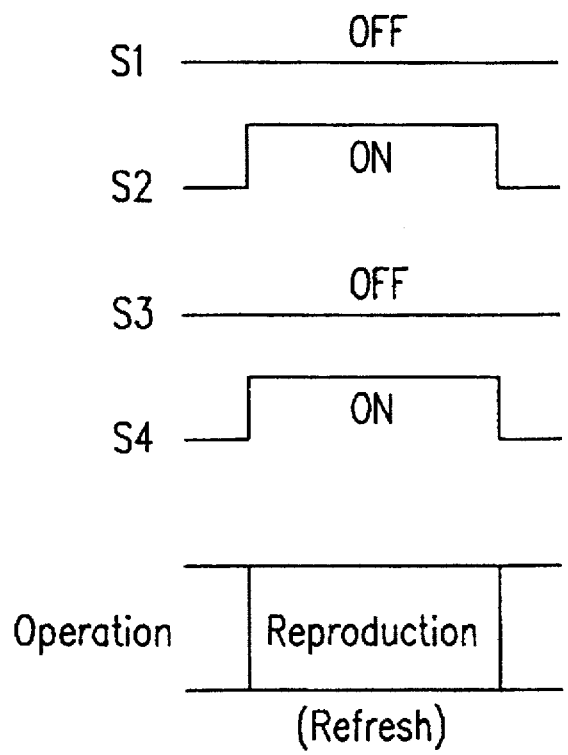
FIG. 5 is a timing diagram showing another operation of the analog memory circuit shown in FIG. 1.

As described above, in the analog memory circuit 100 of the present invention, by setting the switches S1 to S4 at their states as shown in the timing chart of FIG. 2 in the reading operation, the leaked charge is restored to refresh the recorded analog signal. Alternatively, as shown in FIG. 5, the switches S1 and S3 are turned OFF while the switches S2 and S4 are turned ON so as to perform a reproducing (refresh) operation. Since the switch S1 is in its OFF state in this case, it is possible to restore (refresh) the leaked charge irrespective of a voltage appearing on the input/output terminal 112.

The memory circuit generally performs a reading operation or a writing operation after a holding operation. Therefore, in the timing diagram shown in FIG. 2, the reading operation, the holding operation and a subsequent writing operation are successively performed in this order. However, such a holding operation after the reading operation is not necessarily required. Even when the writing operation is performed immediately after the reading operation, the same effect of recording the analog signal as that described above can be obtained.

Although the ground potential is used as the reference potential in the above description, the reference potential is not limited thereto. The reference potential is set at an arbitrary constant voltage level. For example, the electrode D of the capacitor C2 may be set at a first constant voltage level, and the positive input terminal of the operational amplifier 152 may be set at a second constant voltage level.

Example 2

Figure 6:
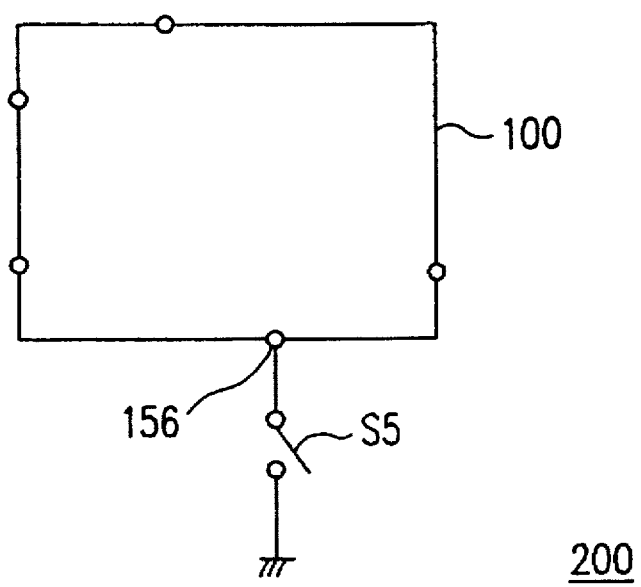
FIG. 6 is a diagram showing the configuration of an analog memory circuit of Example 2 according to the present invention.

FIG. 6 shows the configuration of an analog memory circuit 200 of Example 2 according to the present invention.

The analog memory circuit 200 has such a configuration that a switch S5 is further connected to the injection terminal 156 connected to the inverted input terminal (see FIG. 1) of the operational amplifier 152 in the analog memory circuit 100 in FIG. 1. The other electrode of the switch S5 is connected to a reference potential, in this case, a ground potential.

Figure 7:
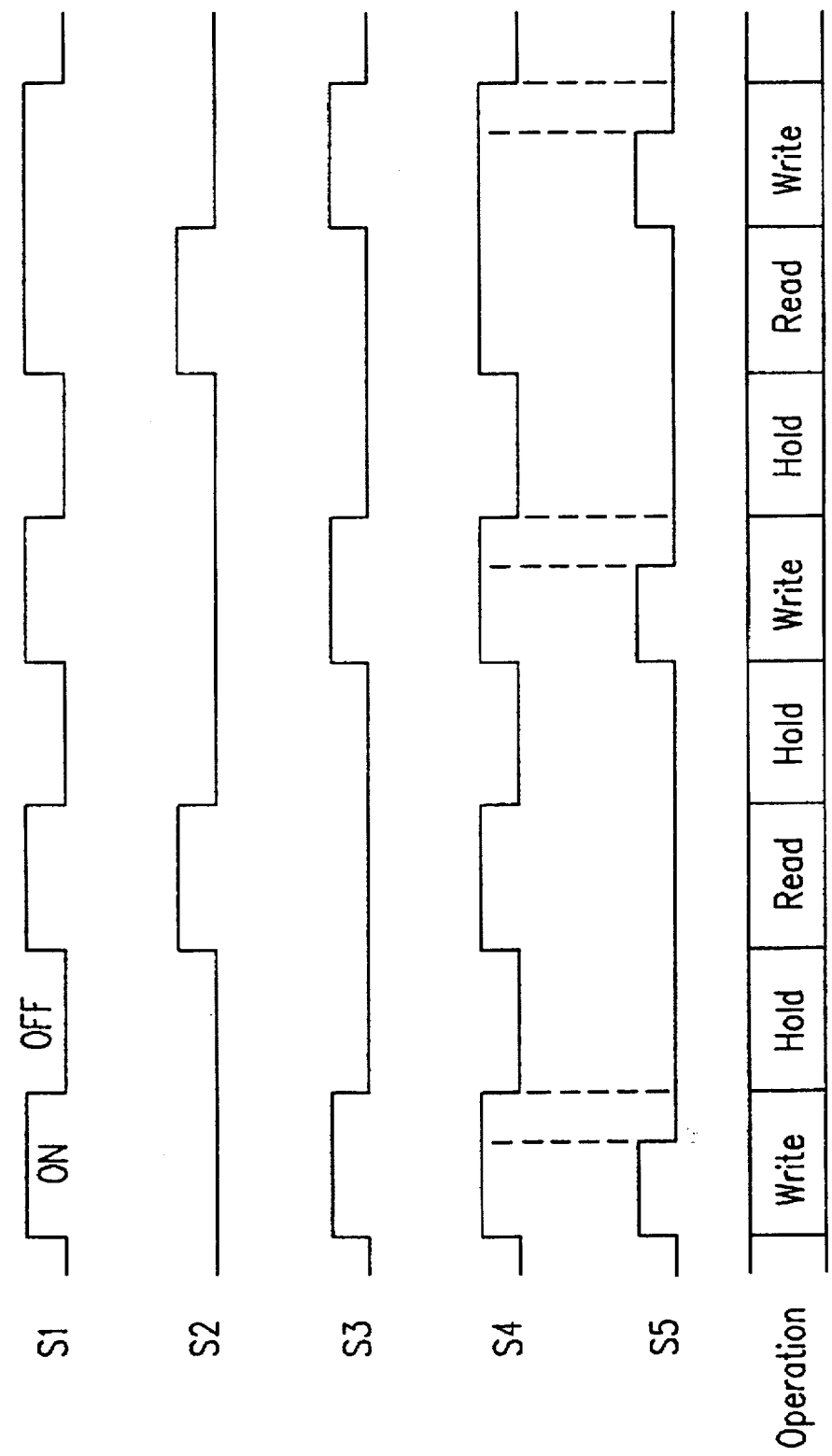
FIG. 7 is a timing diagram showing the operation of the analog memory circuit shown in FIG. 6.

The operation of the analog memory circuit 200 of Example 2 is described with reference to FIG. 7. FIG. 7 is a timing diagram showing the ON/OFF timing of the switches S1 to S5 included in the analog memory circuit 200 and the execution timing of operations of writing, holding and reading.

First, a writing (recording) operation for recording an analog signal to the analog memory circuit 200 is performed.

At this point of time, the switch S2 is turned OFF, and the switches S1, S3 and S4 are turned ON, as in Example 1. Furthermore, the switch S5 is also turned ON. As a result, the inverted input terminal of the operational amplifier 152 is driven by a current flowing through the output terminal of the operational amplifier 152 via the switch S3 along with a current from a reference potential (ground potential) connected thereto via the switch S5. As a result, the electrode C of the capacitor C2 connected to the inverted input terminal of the operational amplifier 152 via the switch S4 and driven by the above current is initialized at a high speed.

At the completion of the writing operation, the switch S5 is turned OFF before the switch S4 is turned OFF. As a result, at the initialization of the capacitor C2, an offset voltage of the inverted input terminal and the positive input terminal of the operational amplifier 152 is recorded in the capacitor C2.

Next, a holding operation for holding the recorded analog signal is performed. In order to perform the holding operation, the switches S1, S3 and S4 are all turned OFF while the switches S2 and S5 are maintained in their OFF state.

Next, in order to perform a reading operation, the switches S1, S2 and S4 are turned ON, while the switches S3 and S5 still remain in their OFF state.

In the case where the reading operation follows the holding operation, the switch S5 may be once turned ON at the time about the completion of the holding operation. As a result of this, it is possible to set the inverted input terminal of the operational amplifier 152 at a ground potential and thereby operate the operational amplifier 152 at high speed with its inverted input terminal being imaginarily grounded in a subsequent reading operation. In this case, however, the switch S5 is turned OFF again immediately before a subsequent reading operation is performed.

Figure 8:
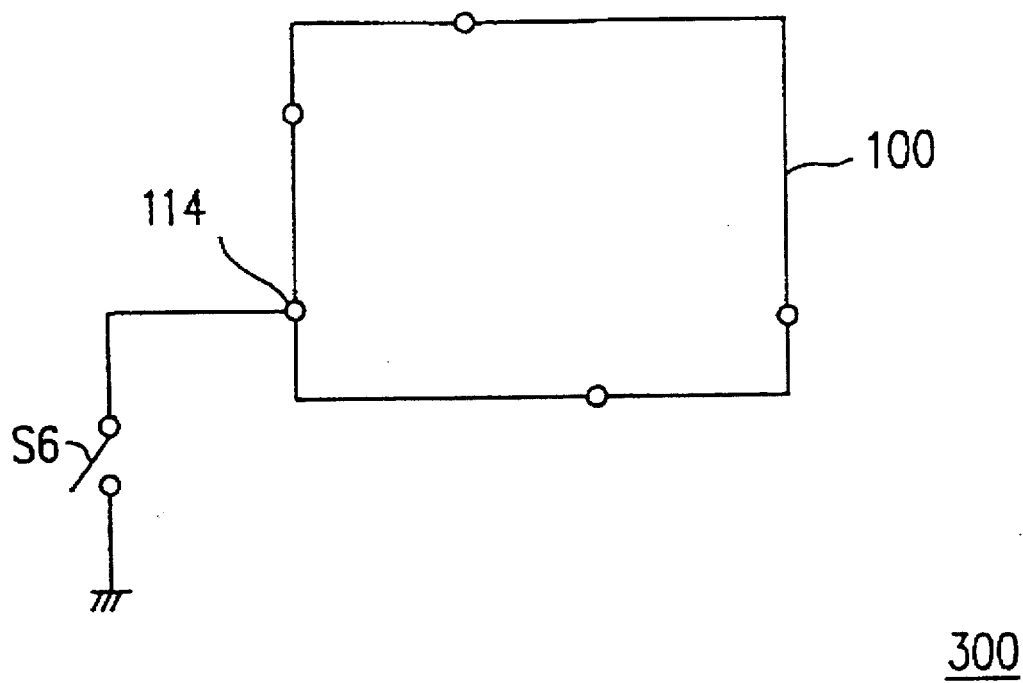
FIG. 8 is a diagram showing another configuration of an analog memory circuit of Example 2 according to the present invention.

FIG. 8 shows the configuration of another analog memory circuit 300 of Example 2 according to the present invention.

The analog memory circuit 300 has such a configuration that a switch S6 is further connected to the injection terminal 114 connected to the inverted input terminal (see FIG. 1) of the operational amplifier 152 via the switch S4 in the analog memory circuit 100 shown in FIG. 1. The other terminal of the switch S6 is connected to a reference potential, in this case, to a ground potential.

The switch S6 functions in a similar manner with the switch S5 in the analog memory circuit 200 as described above. FIG. 9 shows the ON/OFF timing of the switches S1 to S4 and S6 included in the analog memory circuit 300 and the execution timing of operations of writing, holding and reading. This timing diagram corresponds to the one in FIG. 7 except that switch S5 in FIG. 7 is replaced with switch S6. Accordingly, FIG. 9 shows substantially the same contents as FIG. 7, and the detailed description thereof is herein omitted.

Although the ground potential is used as a reference potential in the above description, the reference potential is not limited thereto. The reference potential can be set at an arbitrary constant voltage level. For example, the reference potential can be set at the same potential as that of the positive input terminal of the operational amplifier 152, or the potential close thereto.

Example 3

Figure 10:
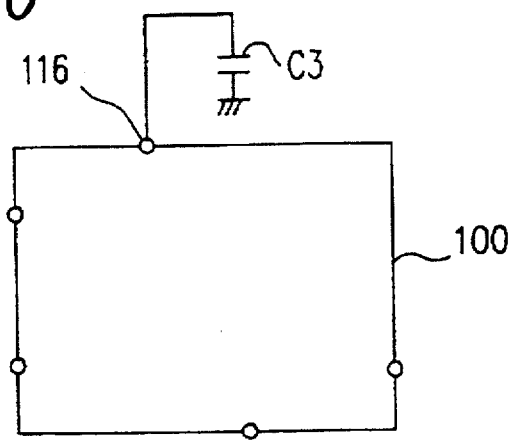
FIG. 10 is a diagram showing the configuration of an analog memory circuit of Example 3 according to the present invention.

FIG. 10 shows the configuration of an analog memory circuit 400 of Example 3 according to the present invention.

The analog memory circuit 400 has such a configuration that a capacitor C3 is further connected to the holding terminal 116 connected to the electrode A of the capacitor C1 in the analog memory 100 in FIG. 1. The other electrode of the capacitor C3 is connected to a reference potential, in this case, to a ground potential.

In the analog memory circuit 400 of Example 3, the operation of the respective switches S1 to S4 are the same as those in Example 1. Thus, returning to FIG. 2 which is referred to in Example 1, the operation of the analog memory circuit 400 is described.

First, a writing operation (recording operation) for recording an analog signal in the analog memory circuit 400 is performed.

For the writing operation, the switch S2 is turned OFF, while the other switches S1, 83 and S4 are turned ON. As a result of this, the output terminal and the inverted input terminal of the operational amplifier 152 are short-circuited by the switch S3, so that the operational amplifier 152 operates in an imaginary ground operation condition. Therefore, the inverted input terminal of the operational amplifier 152 is set to the ground potential serving as a reference potential. Therefore, the potential of the electrode C of the capacitor C2 connected to the inverted input terminal of the operational amplifier 152 via the switch S4 is also set at the ground potential. Since the other electrode D of the capacitor C2 is also grounded, the potentials of the electrodes C and D of the capacitor C2 become identical. As a result, the amount of stored charge in the capacitor C2 becomes zero.

On the other hand, the analog voltage Vin is supplied to the electrode A of the capacitor C1 via the input/output terminal 112. Since the other electrode B of the capacitor C1 is connected to the electrode C of the capacitor C2, and it is therefore set at the ground potential, and the charge Qw1 represented as Qw1=C1×Vin is stored in the capacitor C1 which has a capacitance value of C1. Furthermore, assuming that a capacitance value of the capacitor C3 is C3, an amount of charge Qw3 represented as Qw3=C3×Vin is stored in the capacitor C3.

Next, a holding operation for holding a recorded analog signal is performed.

In order to perform the holding operation, the switches S1 to S4 are all turned OFF. As a result, the electrodes of the capacitors C1 to C3 enter into an open state except for those which are grounded. Therefore, ideally, at the completion of the writing operation, the amount of charge Qw1 stored in the capacitor C1 and the amount of charge Qw3 stored in the capacitor C3 are held.

Figure 11A:
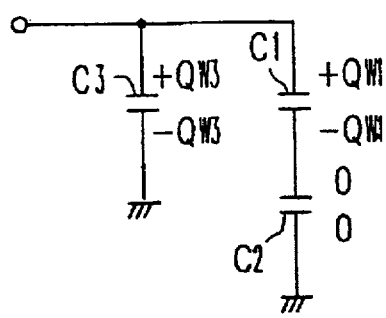
FIGS. 11A to 11C are circuit diagrams showing the states of the charge in capacitors included in the analog memory circuit shown in FIG. 10 and the state of occurrence of leaked charge.

FIG. 11A schematically shows the ideal state of the charge immediately after the charge Qw1 and Qw3, which correspond to the analog recording signal Vin, are written to the capacitors C1 and C3. The amounts of charge Qw1 and −Qw1 having the same absolute value but with opposite polarity (i.e., either positive or negative) are stored in the respective electrodes of the capacitor C1, and the amounts of charge Qw3 and −Qw3 having the same absolute value but with opposite polarity (i.e., either positive or negative) are stored in the respective electrodes of the capacitor C3. On the other hand, no charge is stored in the capacitor C2.

Figure 11B:
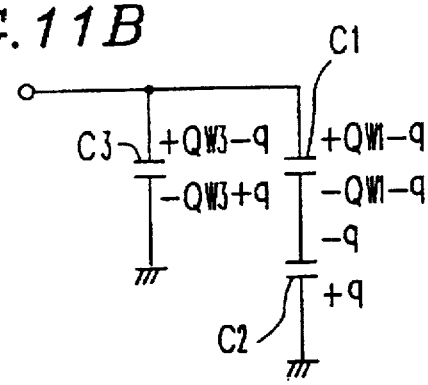

In actuality, however, part of the charge leaks from the stored charge. Therefore, the charge should be redistributed, which is not performed in the ideal state. The state where the charge is redistributed is shown in FIG. 11B. More specifically, when the amount of charge −q is distributed to the capacitor C3, the amount of charge q is distributed to the capacitor C1 and the amount of charge q is distributed to the capacitor C2.

In this manner, an additional amount of charge q due to the leakage of charge is stored in the capacitors C2 and C3 immediately after the writing operation. However, the charge q is undesirable charge which is generated by turning the switch S1 ON. It is sufficient to increase the size of the switch S1 for the purpose of improving the writing speed to the memory. However, the amount of generated charge q correspondingly increases. Without the capacitor C3, the generated charge q should be stored only in the capacitor C1, thereby rendering the operation of the analog memory unstable.

However, by providing the capacitor C3, the charge q is distributed among the capacitors. By designing the capacitors C1 to C3 so that a capacitance value of each of the capacitors C1 to C3 is greater than that of a parasitic capacitor, an unfixed distribution of the charge due to the parasitic capacitor is restrained. As a result, even when the size of switch S1 is increased so as to improve the writing speed, the operation of the analog memory is prevented from being rendered unstable by the generated charge q.

Accordingly, the degree of freedom of the design of the analog memory is increased.

Figure 11C:
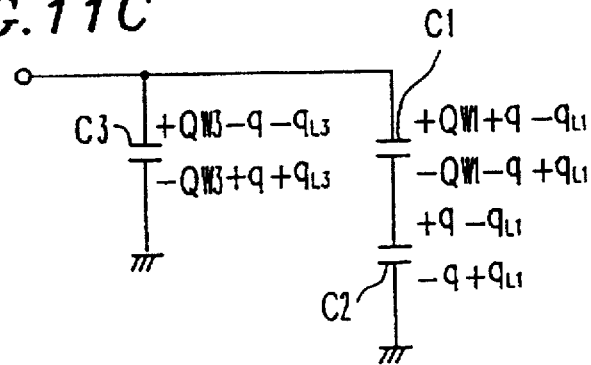

FIG. 11C shows the state where the amount of charge $q_{L1}$ is leaked from the capacitor C1 and the amount of charge $q_{L3}$ is leaked from the capacitor C3 after the lapse of a certain period of time from the state shown in FIG. 11B. After the charge leakage, the amount of charge stored in the respective electrodes of the capacitor C1 are $+Qw1+q-q_{L1}$ and $-Qw1-q+q_{L1}$. Furthermore, the amount of charge corresponding to the amount of leaked charge $q_{L1}$ is stored in the capacitor C2. Similarly, the amount of charge $q_{L1}$ leaks from the capacitor C3. As a result, the amount of charge stored in the respective electrodes of the capacitor C3 is $+Qw3-q-qL_3$ and $-Qw3+q+q_{L3}$.

Next, in a reading state, the switches S1, S2 and S4 are turned ON, while the switch S3 is turned OFF. As a result, the electrode C of the capacitor C2 is connected to the inverted input terminal of the operational amplifier 152 while the electrode A of the capacitor C1 is connected to the output terminal of the operational amplifier 152, thereby forming a negative feedback loop. This negative feedback loop establishes an imaginary ground condition at the inverted input terminal of the operational amplifier 152. The potential of the inverted input terminal becomes a reference potential (ground potential) to which the positive input terminal is connected. Thus, the amount of charge corresponding to the amount of leaked charge $q_{L1}$ is supplied to the electrode A of the capacitor C1. As a result, the capacitor C1 is restored to the state where no charge leakage exists, while the capacitor C2 returns to its state immediately after the initialization. Furthermore, in this state of the circuit, the potential level of a junction between the capacitor C3 and the terminal A of the capacitor C1 becomes the same as that of the reference potential (ground potential) via the holding terminal 116, resulting in reproduction of the leaked charge $q_{L3}$ of the capacitor C3.

As a result of this operation, an analog signal having the same voltage level as that during the writing operation is output from the analog memory circuit 400.

The above reading operation allows the charge which is previously leaked from the capacitor C1 to be reproduced. Therefore, the above operation can refresh the recorded analog signal. More specifically, in the case where the written data is not read but is held for a long period of time, a reading operation is performed in the course of the holding operation to restore the leaked charge so as to refresh the recorded analog signal. When such a reproducing operation is repeated, it is possible to hold an analog signal for a long period of time.

As described above in connection with Example 1, the memory circuit generally performs a reading operation or a writing operation after a holding operation. Therefore, in the timing diagram shown in FIG. 2, the reading operation, the holding operation and a subsequent writing operation are successively performed in this order. However, such a holding operation after the reading operation is not necessarily needed. Even when the writing operation is performed immediately after the reading operation, the same effect as that described above for the record of the analog signal can be obtained.

Although the ground potential is used as the reference potential in the above description, the reference potential is not limited thereto. The reference potential is set at an arbitrary constant voltage level. For example, the reference potential can be set at the same potential level as that of the electrode D of the capacitor C2, or as that of the positive input terminal of the operational amplifier 152.

Example 4

Figure 12:
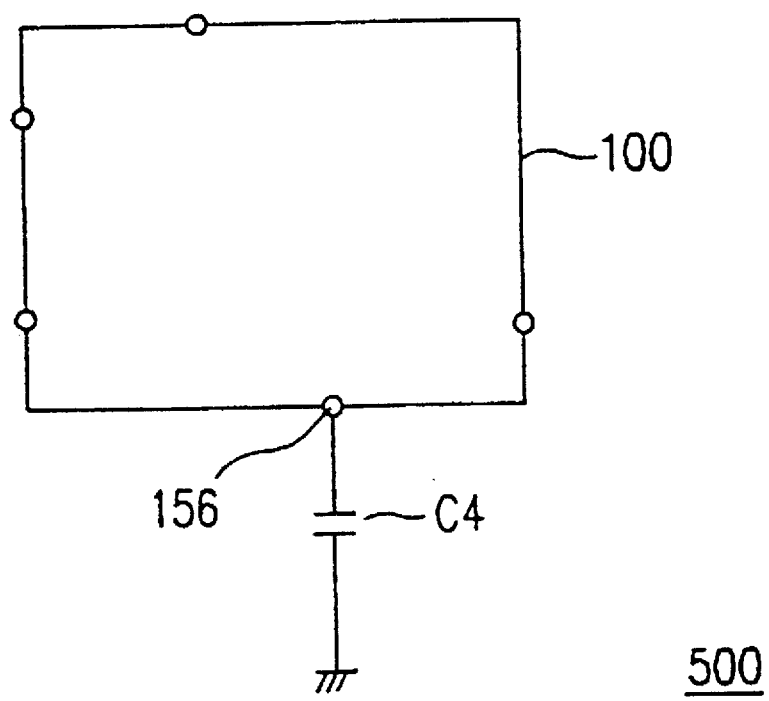
FIG. 12 is a diagram showing the configuration of an analog memory circuit in Example 4 according to the present invention.

FIG. 12 shows the configuration of an analog memory circuit 500 of Example 4 according to the present invention.

The analog memory circuit 500 has such a configuration that a capacitor C4 is further connected to the injection terminal 156 connected to the inverted input terminal of the operational amplifier 152 in the analog memory circuit 100 shown in FIG. 1. The other electrode of the capacitor C4 is connected so as to be supplied with a reference potential. For example, in FIG. 12, the other electrode of the capacitor C4 is connected to a ground potential serving as the reference potential.

Next, the operation of the analog memory circuit 500 in Example 4 will be described.

First, basically the same writing operation as that performed in the analog memory circuit 100 of Example 1 is performed. The writing operation of Example 4 differs from that of Example 1 in that the amount of charge corresponding to the potential at the inverted input terminal of the operational amplifier 152 included in the driving circuit is stored in the capacitor C4 via the injection terminal 156.

The inverted input terminal is driven to be set at the same potential as the reference potential to which the positive input terminal is connected, that is, at the ground potential in the case of FIG. 12 in order to initialize the capacitor C2. Therefore, the same potential (the ground potential) as the reference potential to which the positive input terminal is connected is held for a long period of time by the capacitor C4 which is connected via the injection terminal 156.

When the inverted input terminal of the operational amplifier 152 is in an open state, its potential is rendered to be in a float state, and therefore is likely to vary. However, by connecting the capacitor C4 thereto, it is possible to hold the potential of the inverted input/terminal (for example, at the ground potential) in a stable manner. As a result, the potential of the inverted input terminal is held over a long period of time during a holding operation.

Next, as for a reading operation, basically the same operation as that of the analog memory circuit 100 of Example 1 is performed. In Example 4, however, the degree of a voltage drop at the inverted input terminal caused by the charge leaking through the switches S3 and S4 is small as compared with Example 1. This is because the leaked charge is supplied not only from the gate capacitor at the inverted input terminal but also from the capacitor C4. As a result, the potential of the inverted input terminal in a holding period can be set to a value close to the ground potential in a stable manner. A change in the potential at the inverted input terminal in the holding period of time is only in a small range. In the case where the inverted input terminal is recharged to the ground potential supplied to the positive input terminal prior to the reading operation, a charging operation can be performed at high speed. When the potential of the inverted input terminal is the same as the ground potential of the positive input terminal, the driving capability of the operational amplifier is maximized.

The recharge of the inverted input terminal of the operational amplifier 152 prior to the reading operation is performed while the switch S3 is turned on and the switch S4 is turned OFF. The switches S1 and S2 may be either in an ON state or in an OFF state. Owing to such recharge of the inverted input terminal of the operational amplifier 152 prior to the reading operation, charge which is leaked during a holding period among the charge stored in the gate capacitor at the inverted input terminal of the operational amplifier 152 is reproduced, thereby eliminating a reading error.

Although the ground potential is used as the reference potential in the above description, the reference potential is not limited thereto. The reference potential can be set at an arbitrary constant voltage level. For example, the reference potential may be the same potential as that of the electrode D of the capacitor C2 or as that of the positive input terminal of the operational amplifier 152.

Example 5

Figure 18A:
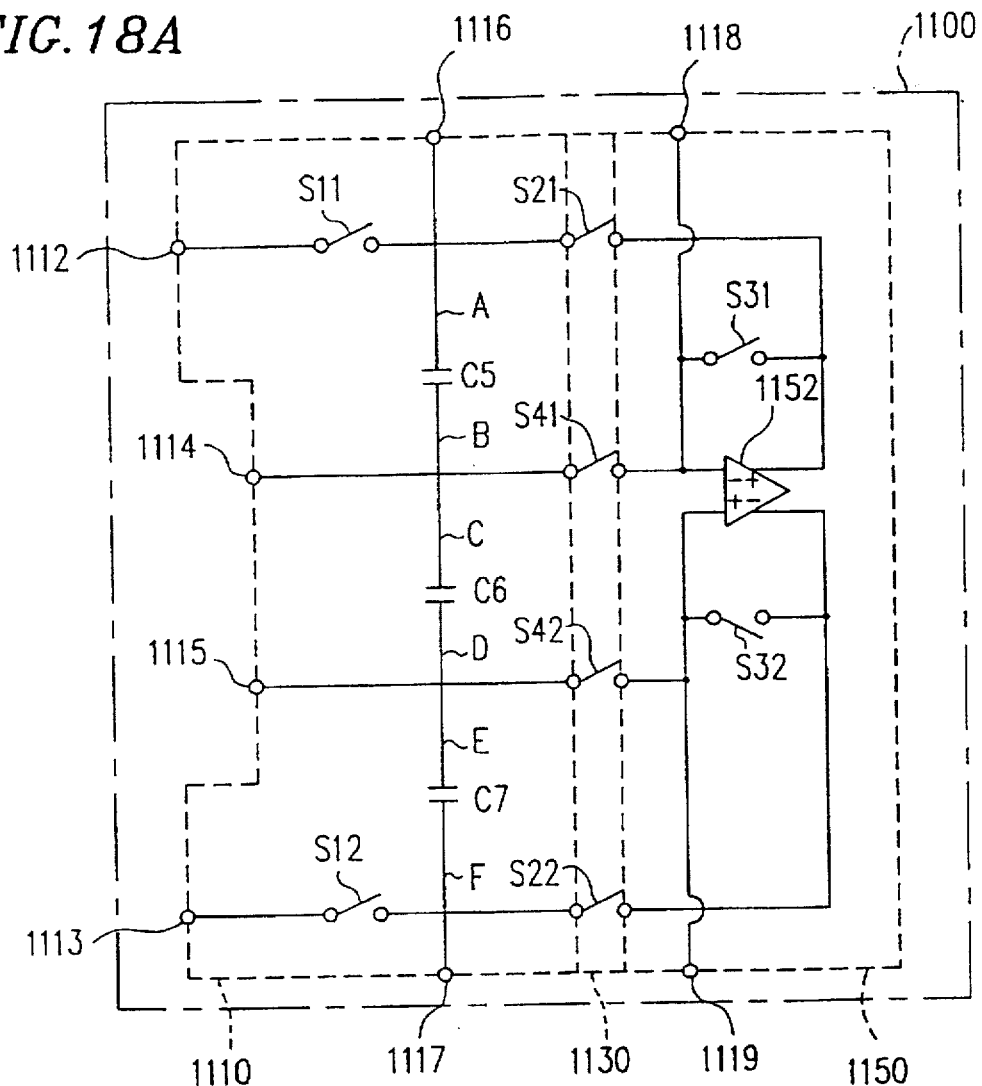
FIG. 18A is a circuit diagram showing the configuration of an analog memory circuit of Example 5 according to the present invention.

FIG. 18A is an analog memory circuit 1100 of Example 5 according to the present invention.

The analog memory circuit 1100 includes a recording circuit 1110, a selecting circuit 1130 and a driving circuit 1150.

The recording circuit 1110 includes two input/output terminals 1112 and 1113 for inputting and outputting an analog signal. The terminals 1112 and 1113 are connected to the switches S11 and S12, respectively. The other terminal of the switch S11 is connected to the electrode A of the capacitor C5, while the other terminal of the switch S12 is connected to the electrode F of the capacitor C7. The other electrode B of the capacitor C5 is connected to the electrode C of the capacitor C6. Furthermore, the other electrode D of the capacitor C6 is connected to the electrode E Of the capacitor C7.

An injection terminal 1114 is connected to the connection point between the capacitors C5 and C6. Similarly, an injection terminal 1115 is connected to the connection point between the capacitors C6 and C7. A holding terminal 1116 is connected to the connection point between the switch S11 and the electrode A of the capacitor C5. Similarly, a holding terminal 1117 is connected to the connection point between the switch S12 and the electrode F of the capacitor C7.

The selecting circuit 1130 includes four switches S21, S41, S42 and S22.

One terminal of the switch S21 is connected to the connection point between the switch S11 and the electrode A of the capacitor C5 in the recording circuit 1110. Similarly, one terminal of the switch S22 is connected to the connection point between the switch S12 and the electrode F of the capacitor C7 in the recording circuit 1110. On the other hand, one terminal of the switch S41 is connected to the connection point between the capacitors C5 and C6 in the recording circuit 1110 and one terminal of the switch S42 is connected to the connection point between the capacitors C6 and C7 in the recording circuit 1110.

The driving circuit 1150 includes switches S31 and S32 and an operational amplifier 1152.

The operational amplifier 1152 of Example 5 has a positive input terminal, an inverted input terminal, a positive output terminal and an inverted output terminal so as to handle a differential signal. The inverted input terminal is connected to a terminal of the switch S41 of the selecting circuit 1130 and then to an injection terminal 1118. The positive input terminal is connected to a terminal of the switch S42 of the selecting circuit 1130 and then to an injection terminal 1119. The positive output terminal is connected to the inverted input terminal via the switch S31, and then to an input/output terminal 1112 of the recording circuit 1110 via the switches S21 and S11. The inverted output terminal is connected to the positive input terminal via the switch S32, and then to the input/output terminal 1113 of the recording circuit 1110 via the switches S22 and S12.

The operation of the thus configured analog memory circuit 1100 of Example 5 is basically similar to that of the analog memory circuit 100 of Example 1. Specifically, the switches S11 and S12 of the analog memory circuit 1100 of Example 5 are paired so as to operate in a similar manner to the switch S1 of the analog memory circuit 100 of Example 1. Similarly, the switches S21 and S22, the switches S31 and S32, and the switches S41 and S42 are respectively paired so as to operate in a similar manner to the switches S2, S3 and S4 of the analog memory circuit 100, respectively.

The analog memory circuit 1100 of Example 5 differs from the analog memory circuit 100 of Example 1 in that the analog memory circuit 1100 operates in a differential manner so that a differential signal is recorded. More specifically, paired analog differential signals are input to the recording circuit 1110 from the input/output terminals 1112 and 1113, respectively. The analog signal input from the input/output terminal 1112 to the recording circuit 1110 is recorded in the capacitor C5 and held therein. On the other hand, the analog signal input from the input/output terminal 1113 to the recording circuit 1110 is recorded in the capacitor C7 and held therein.

A certain amount of charge is leaked from the capacitors C5 and C7 during a holding operation, which are then stored in the capacitor C6. Subsequently, the operation of the driving circuit 1150, including the operational amplifier 1152 capable of handling a differential signal allows the leaked charge to be restored in the capacitors C5 and C7, respectively. As a result, analog signals having the same voltage levels as those during recording are read from the capacitors C5 and C7.

In this manner, by providing the configuration as that of the analog memory circuit 1100 of Example 5, the analog memory circuit of the present invention can be applied to a system handling a differential signal.

In the analog memory circuit 1100 of Example 5, the charge leaked from the capacitors C5 and C7 are stored in the capacitor C6 as described above. This principle will be described in detail.

During a holding period, the switches a11 and S12 are both in an OFF state. If a certain amount of charge (positive charge) is leaked from the electrode a of the capacitor C5 via the switch S11, a corresponding amount of negative charge is supplied to the electrode F of the capacitor C7. Therefore, the amount of a current flowing out from the electrode A of the capacitor C5 due to the leakage of the charge as described above becomes equal to the amount of a current flowing into the electrode F of the capacitor C7. This is because the capacitors C5 to C7 are connected in series, and according to the Kirchhoff's law, the amount of a current flowing out from the output terminal of the circuits connected in series is equal to the amount of a current flowing into the input terminal thereof.

Therefore, the degree of a voltage drop occurring at the electrode A of the capacitor C5 holding one of the signals constituting the analog differential signal is equal to the degree of a voltage boost at the electrode F of the capacitor C7 holding the other of the signals constituting the analog differential signal. As a result, when the analog differential signal recorded in the capacitors C5 and C7 is regarded as a whole, the degrees of voltage variation (the degree of a voltage drop and the degree of a voltage boost) in the capacitors C5 and C7, which are caused by the occurrence of leakage of charge, can be made equal by providing the capacitor C6 common to the capacitors C5 and C7. As a result, it is possible to maintain the difference of the recorded analog differential signal during the holding period, thereby improving a noise resistance.

Figure 18B:
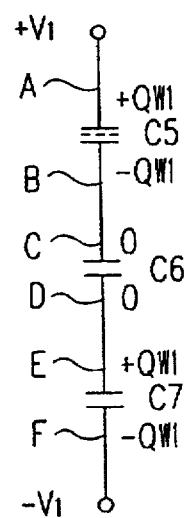
FIG. 18B is a circuit diagram showing the movement of charge in the capacitors during a writing operation, a reading operation and a reproducing operation.
Figure 18C:
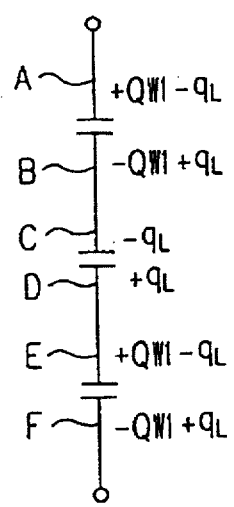
FIG. 18C is a circuit diagram showing the movement of charge in the capacitors during a holding operation.

With reference to FIGS. 18B and 18C, changes in the amount of charge stored in the capacitors C5, C6 and C7 are described. FIG. 18B shows the amount of charge during a writing operation, a reading operation and a reproducing operation, and FIG. 18c shows the amount of charges during a holding operation.

First, during a writing operation, a predetermined positive writing voltage $+V_1$ is supplied to the terminal A while a predetermined negative voltage $-V_1$ is supplied to the terminal F. The potentials of the terminals B and C are made equal to the potentials of the terminals D and E by a negative feedback operation through an imaginary ground operation of the operational amplifier 1152. As a result, the potentials at the terminals C and D of the capacitor C6 become zero. The charge to be stored in the capacitor C5 is $-Qw1$ at the terminal B and $+Qw1$ at the terminal A. The charge $+Qw1$ is stored at the terminal E of the capacitor C7, while the charge $-Qw1$ is stored at the terminal F thereof.

When the operation changes from the writing operation to the holding operation (see FIG. 18C), the charge flows out from the terminals A and F. FIG. 18C shows the movement of charges in the capacitors C5 to C7 during the holding operation. Assuming that the charge $+q_L$ is leaked from the terminal A, the charge is held at the terminals B and C, whereby the charge $-Qw1+q_L$ is stored at the terminal B while the charge $-q_L$ is stored at the terminal C. Due to the charge stored at the terminal C of $-q_L$, the charge having the same amount but with the opposite conductive type, that is, $+q_L$ is stored at the terminal D. Furthermore, the charge of $+Qw1-q_L$ and $-Qw1+q_L$ is stored at the terminals E and F, respectively. As described above, the charge moves due to the leakage of the charge in the holding operation.

According to the principle of conservation of charge, when the charge $-q_L$ flows out from the terminal A, the charge $+q_L$ having the same amount with the opposite polarity is leaked from the terminal F. Specifically, the amount of charge leaked from the terminals A and F is equal to each other.

During a reading operation and a reproducing operation, as shown in FIG. 18B, a potential difference between the terminals C and D becomes zero due to a negative feedback operation through an imaginary ground operation of the operational amplifier 1152. As a result, the amount of charge flowing out during a holding operation is restored in the capacitors C5 and C7, respectively.

Example 6

Figure 19:
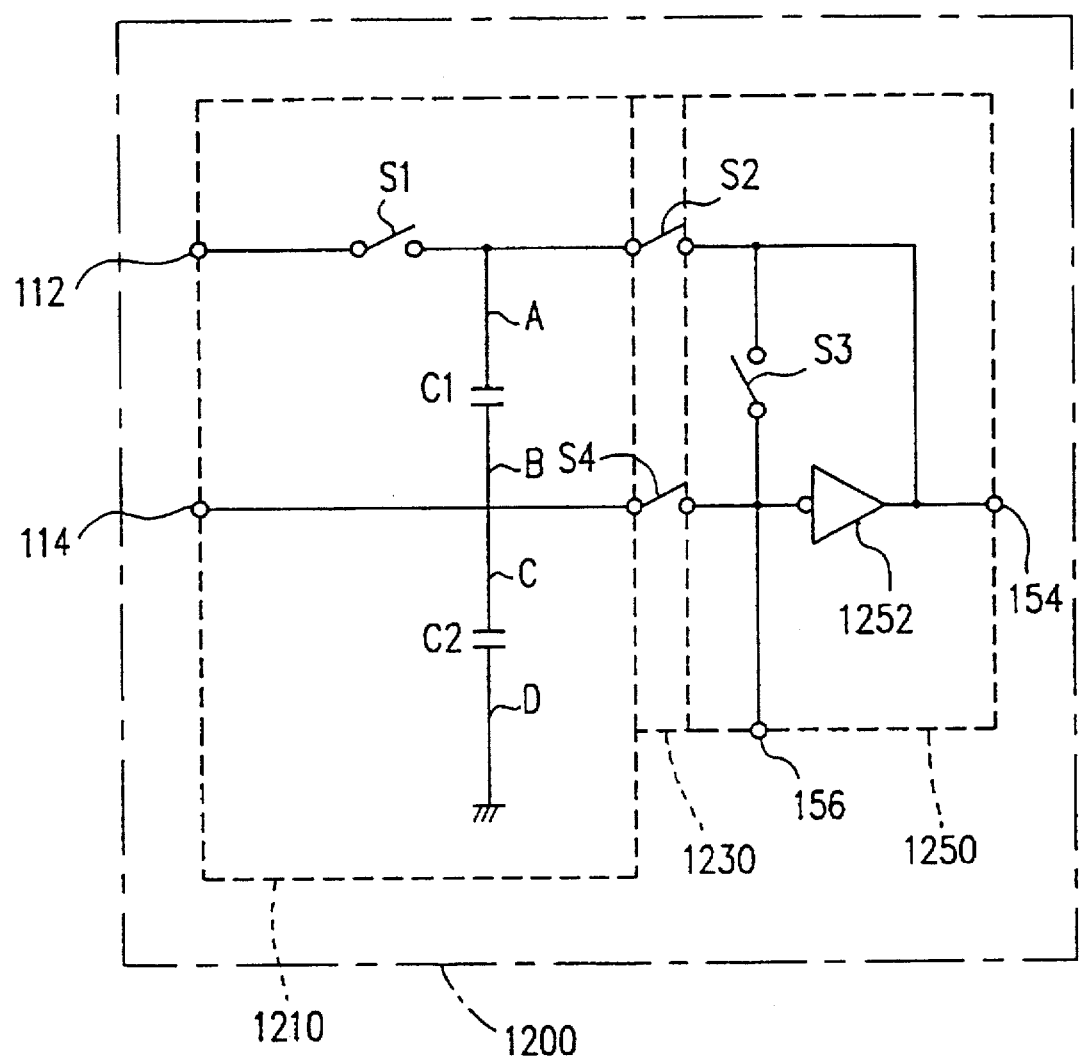
FIG. 19 is a circuit diagram showing the configuration of an analog memory circuit of Example 6 according to the present invention.

FIG. 19 shows an analog memory circuit 1200 of Example 6 of the present invention.

The analog memory circuit 1200 includes a recording circuit 1210, a selecting circuit 1230 and a driving circuit 1250.

The configuration of the analog memory circuit 1200 is basically the same as that of the analog memory circuit 100 of Example 1. The configuration of the analog memory circuit 1200 differs from that of the analog memory circuit 100 of Example 1 in that the analog memory circuit 1200 of Example 6 includes an inverted amplifier 1252 instead of the operational amplifier 152 of the analog memory circuit 100 of Example 1. Moreover, a holding terminal to be connected to the electrode A of the capacitor C1 is not provided in the recording circuit 1210.

The operation of the analog memory circuit 1200 is basically the same as that of the analog memory circuit 100 described with reference to FIG. 2. For example, each of the switches S1 to S4 operates in the same manner in accordance with the timing diagram shown in FIG. 2. Hereinafter, the operation of the analog memory circuit 1200 will be described.

First, a writing operation (a recording operation) for recording an analog signal to the analog memory circuit 1200 is performed.

At this time, the switch S2 is turned OFF, while the other switches S1, S3 and S4 are turned ON. As a result, an output terminal and an inverted input terminal of the inverted amplifier 1252 are short-circuited by the switch S3 to generate a voltage of a predetermined level (hereinafter, referred to as a "standard potential"). The standard potential is supplied to the electrode C of the capacitor C2 via the switches S3 and S4. As a result, the capacitor C2 is charged to the voltage level corresponding to a difference between the standard potential thus generated and supplied to the electrode C and a first reference potential (for example, the ground potential in the configuration shown in FIG. 19) supplied to the other electrode D.

An analog input voltage is supplied to the electrode A of the capacitor C1 via the input/output terminal 112. On the other hand, the other electrode B of the capacitor C1 is connected to the electrode C of the capacitor C2, and is supplied with the standard potential. Therefore, the capacitor C1 is charged to the voltage level corresponding to a difference of the potentials respectively supplied to the electrodes A and B.

For the holding operation, the switches S1 to S4 are all turned OFF, so that the charge stored in the capacitors C1 and C2 are held therein.

Next, for the reading and reproducing operations, the switch S3 is turned OFF, while the other switches S1, S2 and S4 are turned ON. As a result, the electrode C of the capacitor C2 is connected to the inverted input terminal of the inverted amplifier 1252, while the electrode A of the capacitor C1 is connected to the output terminal of the inverted amplifier 1252, thereby forming a negative feedback loop.

During a holding operation, the amount of charge corresponding to the amount of charge leaked from the capacitor C1 via a pn junction which is reverse-biased by the switch S1 is stored in the capacitor C2. During the reading operation and the reproducing operation, due to a gain of the inverted amplifier 1252, the electrode C of the capacitor C2 is set at the standard potential. As a result, an output voltage of the inverted amplifier 1252 is equal to the voltage level of the analog recording signal recorded during a writing operation. Specifically, the reduced voltage level of the analog recording signal due to the leakage of charges is restored, so that the analog signal value that was recorded during the writing operation can be read out.

Example 7

Figure 20A:
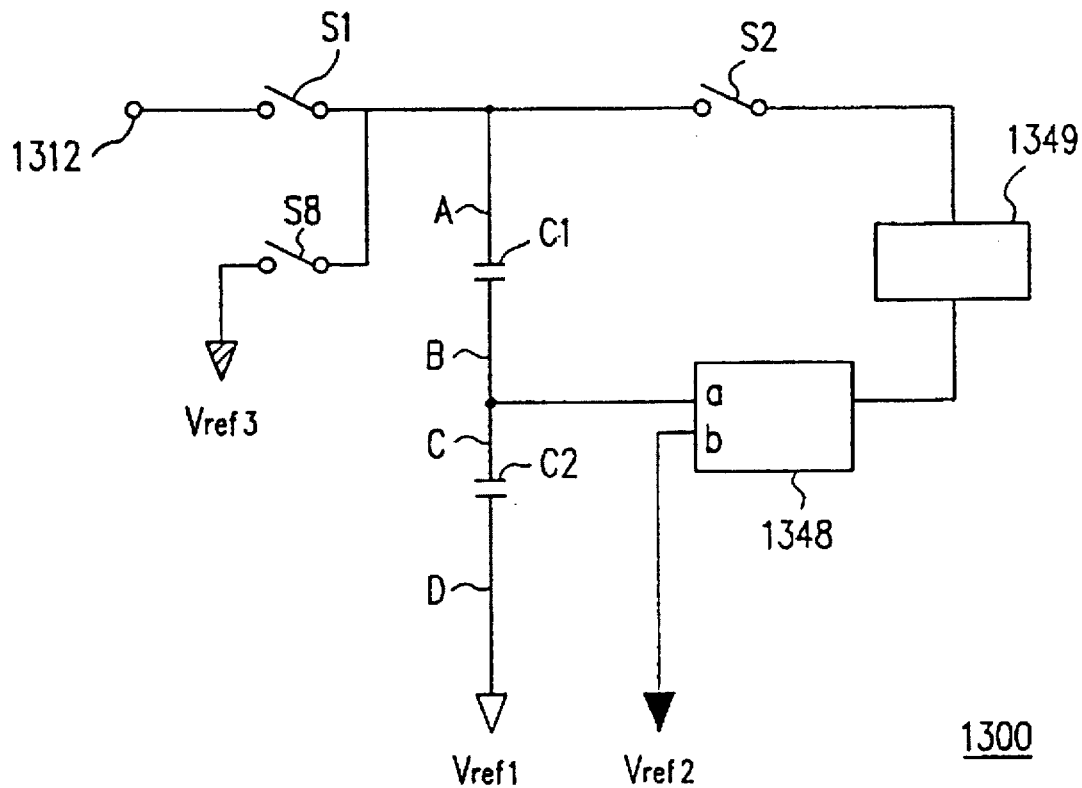
FIG. 20A is a circuit diagram showing the configuration of an analog memory circuit of Example 7 according to the present invention.
Figure 20B:
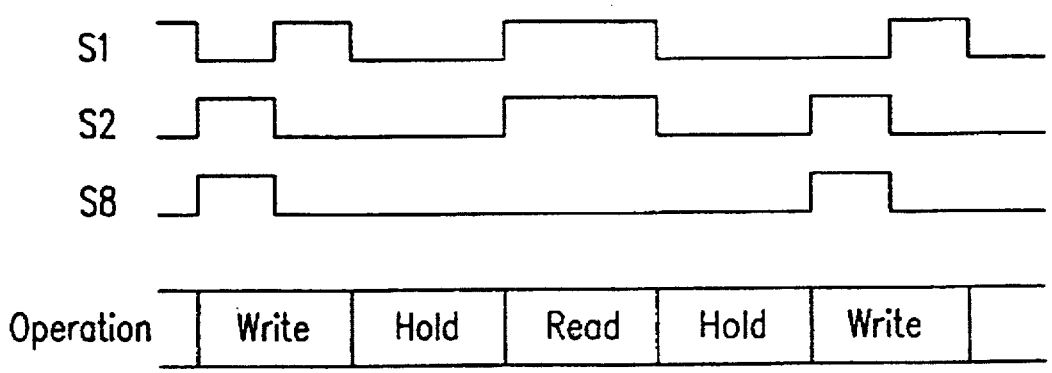
FIG. 20B is a timing diagram showing the operation thereof.

With reference to FIGS. 20A and 20B, an analog memory circuit 1300 of Example 7 according to the present invention will be described. FIG. 20A is a circuit diagram showing the configuration of the analog memory circuit 1300, and FIG. 20B is a timing diagram showing the operation thereof.

The analog memory circuit 1300 includes switches S1, S2 and S8, capacitors C1 and C2 connected in series between one terminal of the switch S1 and a first reference potential Vref1 a differential voltage detecting circuit 1348 and a current output circuit 1349.

One terminal of the switch S1 is connected to the input/output terminal 1312 of the analog signal, while the other terminal thereof is connected to the electrode A of the capacitor C1. At the same time, the electrode A of the capacitor C1 is connected to a third reference voltage Vref3 via the switch S8 and to a current output circuit 1349 via the switch S2. The other electrode B of the capacitor C1 is connected to the electrode C of the capacitor C2. The other electrode D of the capacitor C2 is connected to the first reference potential Vref1.

The connection point between the capacitors C1 and C2 is connected to one input terminal a of the differential voltage detecting circuit 1348. The other input terminal b of the differential voltage detecting circuit 1348 is connected to a second reference potential Vref2. The output terminal of the differential voltage detecting circuit 1348 is connected to the current output circuit 1349.

The differential voltage detecting circuit 1348 detects a difference between the voltages at the terminals a and b, and outputs a signal in accordance with the voltage difference. The input terminal a has a variable impedance. In the case where the potential at the electrode C of the capacitor C2 to be supplied to the input terminal a is higher than the second reference potential Vref2 to be supplied to the other input terminal b, a low input impedance is obtained at the input terminal a. As a result, a current is allowed to flow from the electrode B of the capacitor C1 and the electrode C of the capacitor C2 into the input terminal a connected thereto. On the other hand, in the case where the voltage to be supplied to the input terminal a is lower than the second reference potential Vref2 supplied to the other input terminal b, a high input impedance is obtained at the input terminal a. As a result, a current is prevented from flowing into the input terminal a.

The current output circuit 1349 receives the output signal from the differential voltage detecting circuit 1348, and outputs a current in response to the output signal. The output current is continuously output until a voltage difference between the input terminals a and b of the differential voltage detecting circuit 1348 is eliminated.

Next, the operation of the analog memory circuit 1300 having the above configuration is described with reference to FIG. 20B.

At the time when a writing operation is initiated, the switch S1 is in an OFF state, while the switches S2 and S8 are in an ON state. The electrode A of the capacitor C1 is charged to the third reference potential Vref3 level via the switch S8, while the other electrode B is charged to the second reference potential level Vref2. Next, in the latter half of the writing operation, the switch S1 is turned ON simultaneously with the switches S2 and S8 being turned OFF. As a result, the analog input signal Vin supplied to the input/output terminal 1312 is supplied to the electrode A of the capacitor C1. On the other hand, since the potential level of the electrode B remains the second reference potential Vref2, the amount of charge Qw1 represented by Qw1=C1× (Vin−Vref2) is stored in the capacitor C1, where C1 is a capacitance value of the capacitor C1.

Subsequently, in a holding operation, the switches S1, S2 and S8 are turned OFF. Therefore, in an ideal state, the charge Qw1 on the capacitor C1 is maintained. If the charge is held over a long period of time, however, a certain amount of charge $q_L$ is leaked from the electrode A of the capacitor C1 due to a reverse current of a diode constituting the switch S1. On the other hand, if the charge $q_L$ is leaked from the electrode A of the capacitor C1 via the switch S1, charge $-q_L$ having the same amount but with the opposite polarity is leaked from the electrode B at the same time. The amount of leaked charge $-q_L$ is stored in the capacitor C2.

In a reading operation, the switches S1 and S2 are turned ON, while the switch S8 is turned OFF. the charge $-q_L$ leaked during the holding operation is stored in the capacitor C2. Therefore, the potential at the electrode C of the capacitor C2 is lowered by the degree corresponding to the amount of leaked charge as compared with the second reference potential Vref2 to which the electrode C is initially set. The differential voltage detecting circuit 1348 detects the degree of the voltage drop, and outputs a corresponding signal to the current output circuit 1349. The current output circuit 1349 outputs a current in accordance with the signal supplied from the differential voltage detecting circuit 1348. The output current charges the electrode A of the capacitor C1 via the switch S2.

As the leaked charge $q_L$ is charged to the electrode A of the capacitor C1 by the thus supplied current, the charge $-q_L$ present at the electrode C of the capacitor C2 return to the electrode B of the capacitor C1. The reason for this is as follows. Since the voltage at the input terminal a of the differential voltage detecting circuit 1348 is lower than the second reference potential Vref2 supplied to the input terminal b of the differential voltage detecting circuit 1348, an input impedance at the input terminal a becomes high. As a result, the charge cannot flow into the input terminal a, and move toward the electrode B of the capacitor C1.

Owing to the above operation, the capacitor C1 is restored to the state where no leakage of the charge is present. At the same time, the capacitor C2 returns to its state immediately after initialization. As a result, an analog signal having the same voltage level as that during the writing operation is output.

The above reading operation allows the charge which are once leaked from the capacitor C1 to be restored. Therefore, the above operation can refresh the recorded analog signal. More specifically, in the case where the written data is not read but is held for a long period of time, a reading operation is performed in the course of the holding operation to restore the leaked charge so as to refresh the recorded analog signal. When such a reproducing operation is repeated, it is possible to hold an analog signal for a long period of time.

In the timing diagram shown in FIG. 20B, a holding operation is performed after the reading operation. Then, a subsequent writing operation is performed. However, as already described in association with Example 1, the holding operation after the reading operation is not necessarily required. Therefore, even by performing the writing operation immediately after the reading operation, the same effect can be obtained with regard to recording of the analog signal.

Example 8

Figure 21A:
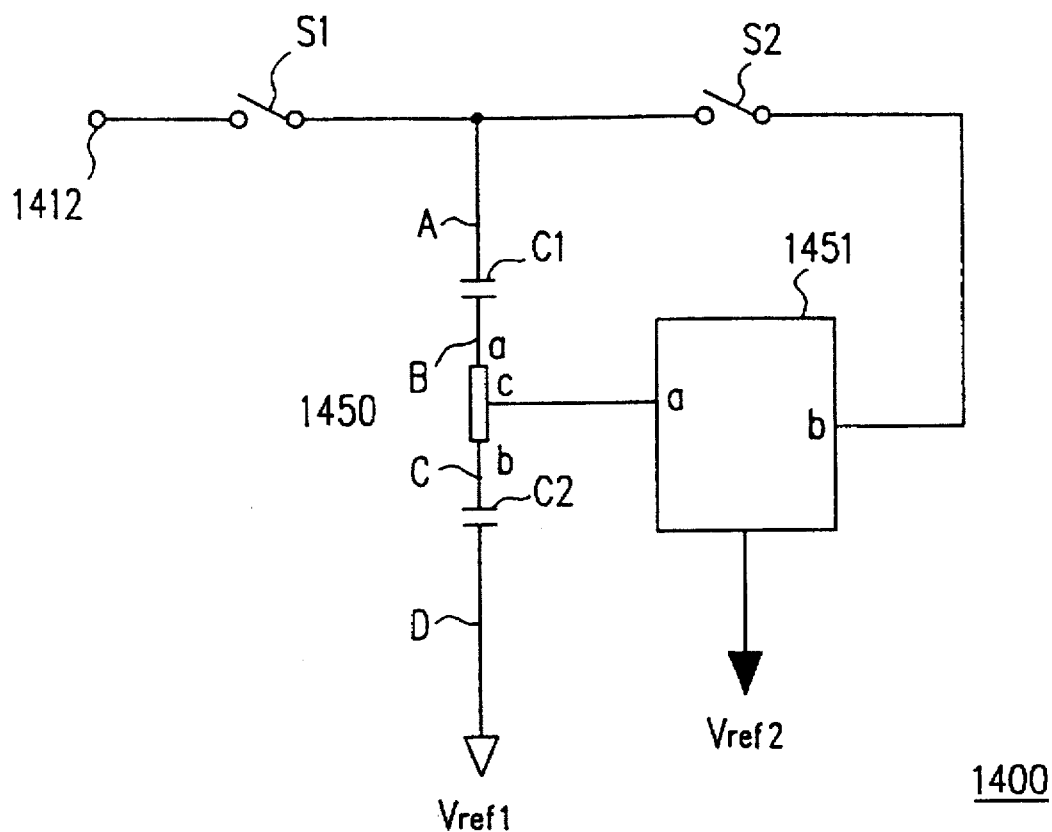
FIG. 21A is a circuit diagram showing the configuration of an analog memory circuit of Example 8 according to the present invention.
Figure 21B:
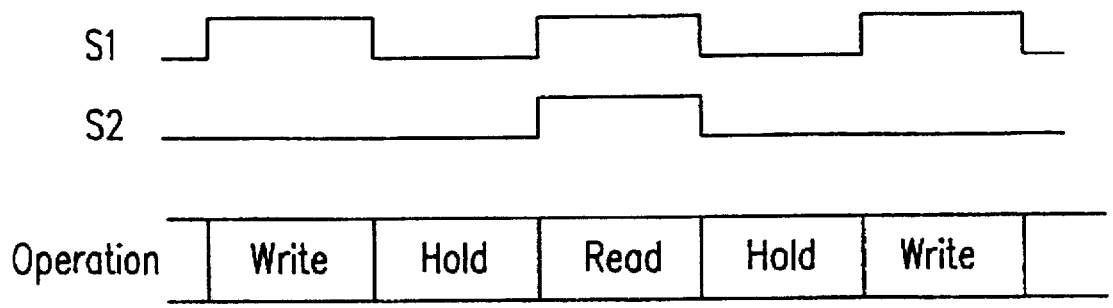
FIG. 21B is a timing diagram showing the operation thereof.

With reference to FIGS. 21A and 21B, an analog memory circuit 1400 in Example 8 according to the present invention will be described. FIG. 21A is a circuit diagram showing the configuration of the analog memory circuit 1400, and FIG. 21B is a timing chart showing the operation thereof.

The analog memory circuit 1400 includes the switches S1 and S2, the capacitors C1 and C2, a charge movement amount detecting circuit 1450, and a charge supplying circuit 1451. The capacitor C1, the charge movement amount detecting circuit 1450 and the capacitor C2 are connected in series between one terminal of the switch S1 and the first reference potential Vref1.

One terminal of the switch S1 is connected to the input/output terminal 1412 of the analog signal, while the other terminal thereof is connected to the electrode A of the capacitor C1. At the same time, the electrode A of the capacitor C1 is connected to the terminal b of the charge supplying circuit 1451 via the switch S2. The other electrode B of the capacitor C1 is connected to one terminal a of the charge movement amount detecting circuit 1450. The other terminal b of the charge movement amount detecting circuit 1450 is connected to the electrode C of the capacitor C2. The other electrode D of the capacitor C2 is connected to the first reference potential Vref1. The other terminal c of the charge movement amount detecting circuit 1450 is connected to the other terminal a of the charge supplying circuit 1451. The charge supplying circuit 1451 is further connected to the second reference potential Vref2.

The charge movement amount detecting circuit 1450 detects the amount of charge moving from the terminal a to the terminal b, and outputs a signal corresponding to the detected amount of transferred charge. In accordance with the signal obtained from the terminal c of the charge movement amount detecting circuit 1450, the charge supplying circuit 1451 outputs from the terminal b the amount of charges corresponding to the amount of charge passing through the charge movement amount detecting circuit 1450 so as to supply the charge to the electrode A of the capacitor C1 via the switch S2.

The operation of the thus configured analog memory circuit 1400 of Example 8 will be described with reference to FIG. 21B.

In the writing operation, the switch S1 is turned ON, while the switch S2 is turned OFF. At this point in time, the electrode B of the capacitor C1 and the electrode C of the capacitor C2 are charged to a constant potential Va. On the other hand, an analog input signal Vin supplied to the input/output terminal 1412 is recorded to the other electrode A of the capacitor C1. As a result, the amount of charge Qw1 represented by Qw1=C1×(Vin−Va) is stored in the capacitor C1, where C1 is a capacitance value of the capacitor C1.

Subsequently, in a holding operation, the switches S1 and S2 are turned OFF. Therefore, in an ideal state, the charge Qw1 on the capacitor C1 is maintained. If the charge is held over a long period of time, however, a certain amount of charge $q_L$ is leaked from the electrode A of the capacitor C1 due to a reverse current of a diode constituting the switch S1. If the charge $q_L$ is leaked from the electrode A of the capacitor C1 via the switch S1 in this manner, the charge $-q_L$ having the same amount with the opposite polarity is leaked from the electrode B. The charge $-q_L$ passes the charge movement amount detecting circuit 1450 to move to the electrode C of the capacitor C2. At this point of time, the amount of moved charge $-q_L$ is detected by the charge movement amount detecting circuit 1450.

In the reading operation, the switches S1 and S2 are turned ON. Since the amount of charge $-q_L$ leaked in the course of the holding operation has already been detected by the charge movement amount detecting circuit 1450, the charge movement amount detecting circuit 1450 supplies a signal corresponding to the detected amount from the terminal c to the charge supplying circuit 1451. As a result, the same amount of charge having the opposite polarity $q_L$ is output from the terminal b of the charge supplying circuit 1451 so as to charge the electrode A of the capacitor C1 via the switch S2. By the thus supplied current, the amount of charge $q_L$ leaked from the capacitor C1 during the holding operation is charged to the electrode A of the capacitor C1. Consequently, the degree of a voltage drop of a recording signal Vin caused by the leakage of charge is compensated. As a result, the original voltage level Vin is reproduced.

Thus, an analog signal having the same voltage level as that during the writing operation is output.

The above reading operation allows the charge which is once leaked from the capacitor C1 to be restored. Therefore, the above operation can refresh the recorded analog signal. More specifically, in the case where the written data is not read but is held for a long period of time, a reading operation is performed in the course of the holding operation to restore the leaked charge so as to refresh the recorded analog signal. When such a reproducing operation is repeated, it is possible to hold an analog signal for a long period of time.

In the timing diagram shown in FIG. 21B, a holding operation is performed after the reading operation. Then, a subsequent writing operation is performed. However, as already described in association with Example 1, the holding operation after the reading operation is not necessarily required. Therefore, even by performing the writing operation immediately after the reading operation, the same effect can be obtained with regard to the recording of the analog signal.

Example 9

Figure 22A:
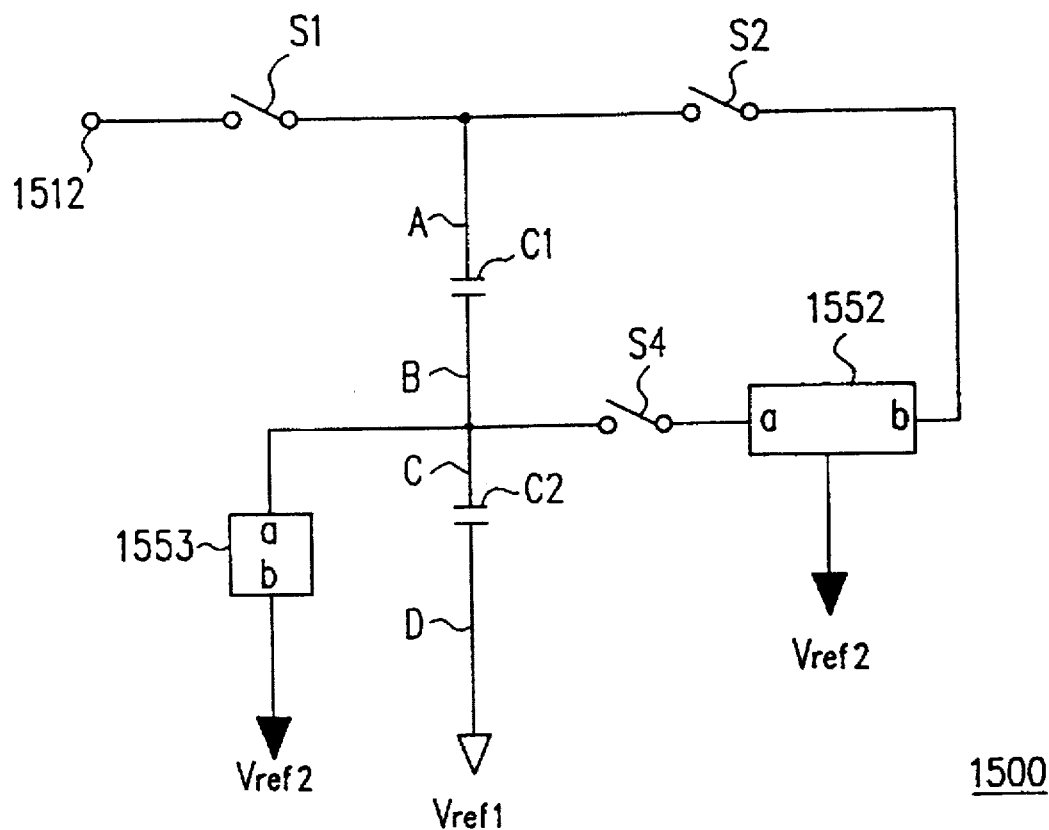
FIG. 22A is a circuit diagram showing the configuration of an analog memory circuit of Example 9 according to the present invention.
Figure 22B:
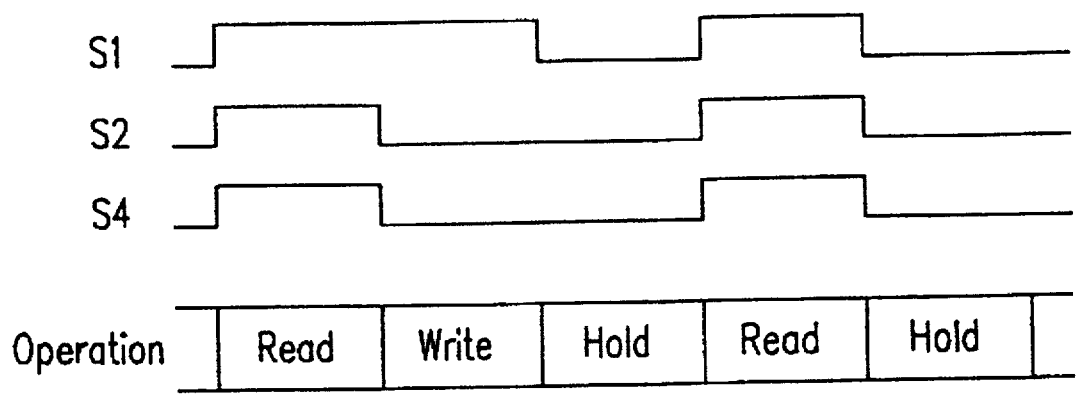
FIG. 22B is a timing diagram showing the operation thereof.

With reference to FIGS. 22A and 22B, an analog memory circuit 1500 in Example 9 according to the present invention will be described. FIG. 22A is a circuit diagram showing the configuration of the analog memory circuit 1500, and FIG. 22B is a timing diagram showing the operation thereof.

The analog memory circuit 1500 includes the switches S1, S2 and S4, the capacitors C1 and C2, a voltage-current conversion circuit 1552, and a variable impedance circuit 1553. The capacitors C1 and C2 are connected in series between one terminal of the switch S1 and the first reference potential Vref1.

One terminal of the switch S1 is connected to the input/output terminal 1512 of the analog signal, while the other terminal thereof is connected to the electrode A of the capacitor C1. At the same time, the electrode A of the capacitor C1 is connected to the voltage-current conversion circuit 1552 via the switch S2. The other electrode B of the capacitor C1 is connected to the electrode C of the capacitor C2. The other electrode D of the capacitor C2 is connected to the first reference potential Vref1.

The connection point between the capacitors C1 and C2 is connected to one terminal a of the variable impedance circuit 1553. The other terminal b of the variable impedance circuit 1553 is connected to the second reference potential Vref2.

The connection point between the capacitors C1 and C2 is further connected to the terminal a of the voltage-current conversion circuit 1552 via the switch S4. The voltage-current conversion circuit 1552 is further connected to the second reference potential Vref2.

The voltage-current conversion circuit 1552 maintains the voltage at the input terminal a thereof to the second reference potential Vref2. A current corresponding to a voltage difference between the voltage at the input terminal a and the second reference potential Vref2 is generated from the output terminal b. On the other hand, when the voltage supplied to the input terminal a of the variable impedance circuit 1553 is equal to or higher than the second reference potential Vref2 supplied to the other terminal b thereof, the variable impedance circuit 1553 has a low impedance. When the voltage supplied to the input terminal a of the variable impedance circuit 1553 is lower than the second reference potential Vref2 supplied to the other input terminal b thereof, the variable impedance circuit 1553 has a high impedance.

The operation of the analog memory circuit 1500 of Example 9 having the configuration as described above will be described with reference to FIG. 22B.

In the writing operation, the switch S1 is turned ON, while the switches S2 and S4 are turned OFF. At this point of time, the electrode B of the capacitor C1 and the electrode C of the capacitor C2 are charged to the second reference potential Vref2 by the variable impedance circuit 1553. On the other hand, an analog input signal Vin supplied to the input/output terminal 1512 is recorded to the other electrode A of the capacitor C1. As a result, the amount of charge Qw1 represented by Qw1=C1×(Vin−Vref2) is stored in the capacitor C1, where C1 is a capacitance value of the capacitor C1.

Subsequently, in a holding operation, the switches S1, S2 and S4 are turned OFF. Therefore, in an ideal state, the charge Qw1 on the capacitor C1 is maintained. If the charge is held over a long period of time, however, a certain amount of charge $q_L$ is leaked from the electrode A of the capacitor C1 due to a reverse current of a diode constituting the switch S1. If the charge $q_L$ is leaked from the electrode A of the capacitor C1 via the switch S1 in this manner, charge $-q_L$ having the same amount with the opposite polarity is leaked from the electrode B. Since the potential of the electrode C becomes lower than the initially supplied second reference potential Vref2 due to occurrence of the charge leakage, the input terminal a of the variable impedance circuit 1553 has a high impedance due to the characteristics thereof described above. Therefore, the leaked charge $-q_L$ do not flow in the variable impedance circuit 1553, but all move to the electrode C of the capacitor C2.

For a reading operation, the switches S1, S2 and S4 are turned ON. The potential at the input terminal a of the voltage-current conversion circuit 1552 is lower than the initially supplied second reference potential Vref2 due to the effect of the leaked charge $-q_L$ occurring in the course of the holding operation. The voltage-current conversion circuit 1552 detects a voltage difference, and outputs a current of the level corresponding to the detected value from the output terminal b. This output current charges the electrode A of the capacitor C1 via the switch S2. As the leaked charge $q_L$ is charged on the electrode A of the capacitor C1 by the thus supplied current, the charge $-q_L$ present at the electrode C of the capacitor C2 return to the electrode B of the capacitor C1. This is because the voltage at the input terminal a is lower than the second reference voltage Vref2 supplied to the terminal b in the variable impedance circuit 1553. As a result, the input impedance at the input terminal a increases so as to prevent the charge from flowing into the variable impedance circuit 1553.

The voltage-current conversion circuit 1552 continues to supply the output current until the potential of its input terminal a becomes equal to the second reference potential Vref2. At the time when the potential of its input terminal a becomes equal to the second reference potential Vref2, the amount of charges equal to the amount of leaked charge $q_L$ is supplied to the electrode A of the capacitor C1. As a result, the leaked charge $-q_L$ moved to be present at the electrode C of the capacitor C2 is restored to the capacitor C1. As a result, the capacitor C1 is restored to the state where no charge leakage occurred, while the capacitor C2 is returned to its state immediately after the initialization. As a result, an analog signal having the same voltage level as that in the writing operation is output.

The above reading operation allows the charge which is once leaked from the capacitor C1 to be restored. Therefore, the above operation can refresh the recorded analog signal. More specifically, in the case where the written data is not read but is held for a long period of time, a reading operation is performed in the course of the holding operation to restore the leaked charge so as to refresh the recorded analog signal. When such a reproducing operation is repeated, it is possible to hold an analog signal for a long period of time.

In the timing diagram shown in FIG. 22B, a holding operation is performed after the reading operation. Then, a subsequent writing operation is performed. However, as already described in association with Example 1, the holding operation after the reading operation is not necessarily required. Therefore, even by performing the writing operation immediately after the reading operation, the same effect can be obtained with regard to the recording of the analog signal.

Example 10

Figure 23A:
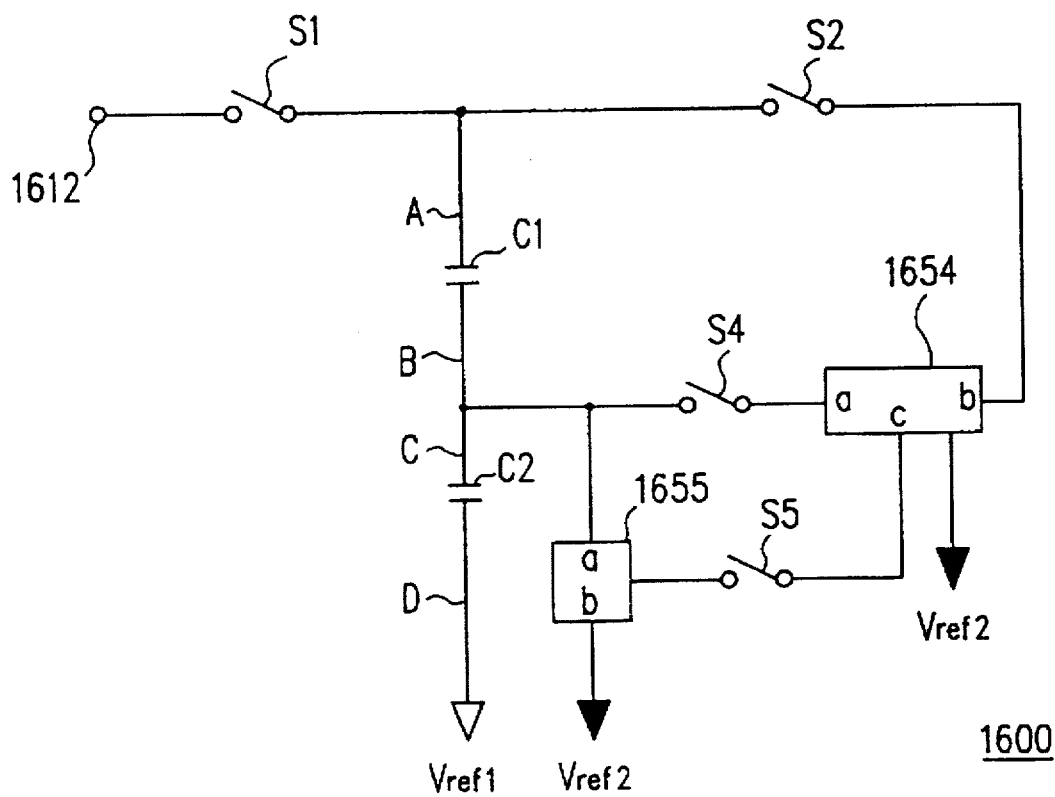
FIG. 23A is a circuit diagram showing the configuration of an analog memory circuit of Example 10 according to the present invention.
Figure 23B:
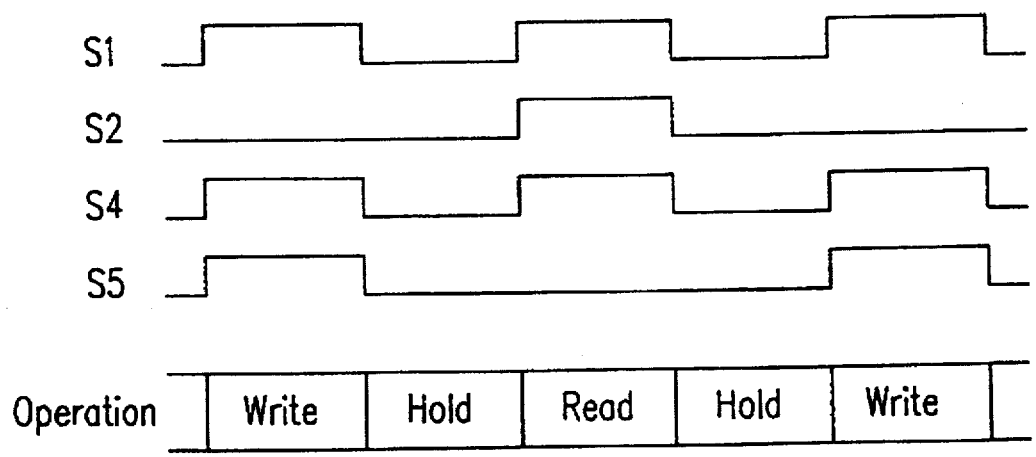
FIG. 23B is a timing diagram showing the operation thereof.

With reference to FIGS. 23A and 23B, an analog memory circuit 1600 in Example 10 according to the present invention will be described. FIG. 23A is a circuit diagram showing the configuration of the analog memory circuit 1600, and FIG. 23B is a timing diagram showing the operation thereof.

The analog memory circuit 1600 includes the switches S1, S2, S4 and S5, the capacitors C1 and C2, a voltage-current conversion circuit 1654, and a variable impedance circuit 1655. The capacitors C1 and C2 are connected in series between one terminal of the switch S1 and the first reference potential Vref1.

One terminal of the switch S1 is connected to an input/output terminal 1612 for the analog signal, while the other terminal thereof is connected to the electrode A of the capacitor C1. At the same time, the electrode A of the capacitor C1 is connected to a terminal b of the voltage-current conversion circuit 1654 via the switch S2. The other electrode B of the capacitor C1 is connected to the electrode C of the capacitor C2. The other electrode D of the capacitor C2 is connected to the first reference potential Vref1.

The connection point between the capacitors C1 and C2 is connected to one terminal a of the voltage-current conversion circuit 1654 via the switch S4 and to a terminal a of the variable impedance circuit 1655. The other terminal b of the variable impedance circuit 1655 is connected to the second reference potential Vref2. The terminal c of the voltage-current conversion circuit 1654 is coupled to the variable impedance circuit 1655 via the switch S5. The voltage-current conversion circuit 1654 is further connected to the second reference potential Vref2.

The voltage-current conversion circuit 1654 maintains the voltage at the input terminal a to the second reference potential Vref2. A current corresponding to a voltage difference between the voltage at the input terminal a and the second reference potential Vref2 is generated at the output terminal b. A voltage is output from the output terminal c. When the voltage supplied to the input terminal a of the variable impedance circuit 1655 is equal to or higher than the potential supplied to the other terminal b thereof, the variable impedance circuit 1655 has a low impedance. On the other hand, when the voltage supplied to the input terminal a of the variable impedance circuit 1655 is lower than the potential supplied to the other input terminal b thereof, the variable impedance circuit 1655 has a high impedance.

The operation of the analog memory circuit 1600 of Example 10 having the configuration as described above will be described with reference to FIG. 23B.

In the writing operation, the switches S1, S4 and S5 are turned ON, while the switch S2 is turned OFF. A voltage signal is output from the terminal c of the voltage-current conversion circuit 1654 until the voltage of the input terminal a of the voltage-current conversion circuit 1654 becomes equal to the second reference potential Vref2. This voltage signal is supplied to the input terminal b of the variable impedance circuit 1655. However, since the voltage level of this voltage signal is lower than the second reference potential Vref2, the impedance of the variable impedance circuit 1655 is lowered in accordance with the aforementioned characteristics thereof. As a result, the electrode B of the capacitor C1 and the electrode C of the capacitor C2 are charged to the second reference potential Vref2 supplied via the variable impedance circuit 1655. On the other hand, the analog input signal Vin supplied to the input/output terminal 1612 is recorded at the other electrode A of the capacitor C1. As a result, the amount of charge Qw1 represented by Qw1=C1×(Vin−Vref2) is stored in the capacitor C1, where C1 is a capacitance value of the capacitor C1.

Subsequently, in a holding operation, the switches S1, S2, S4 and S5 are turned OFF. Therefore, in an ideal state, the charge Qw1 on the capacitor C1 is maintained. If the charge is held over a long period of time, however, a certain amount of charge $q_L$ is leaked from the electrode A of the capacitor C1 due to a reverse current of a diode constituting the switch S1. If the charge $q_L$ is leaked from the electrode A of the capacitor C1 via the switch S1 in this manner, the charge $-q_L$ having the same amount with the opposite polarity is leaked from the electrode B. The potential of the electrode C becomes lower than the initially supplied second reference potential Vref2 due to occurrence of the charge leakage. Moreover, since the switch S5 is in an OFF state, no voltage is supplied to the terminal b of the variable impedance circuit 1655. As a result, the input terminal a has a high impedance due to the characteristics of the variable impedance circuit 1655 described above. Therefore, the leaked charge $-q_L$ does not flow in the variable impedance circuit 1655, but rather move to the electrode C of the capacitor C2.

For a reading operation, the switches S1, S2 and S4 are turned ON, while the switch S5 remains in an OFF state. The potential of the electrode C of the capacitor C2 is lower than the initially supplied second reference potential Vref2 due to the effect of leaked charge $-q_L$ occurring in the course of the holding operation. The voltage-current conversion circuit 1654 detects a voltage difference between the potential of the electrode C and the second reference potential Vref2, and outputs a current of the level corresponding to the detected value from the output terminal b. The output current charges the electrode A of the capacitor C1 via the switch S2. By the thus supplied current, the amount of charge corresponding to the amount of leaked charge $q_L$ is charged to the electrode A of the capacitor C1. Thus, the charge $-Q_L$ present at the electrode C of the capacitor C2 returns to the electrode B of the capacitor C1.

The voltage-current conversion circuit 1654 continues to supply the output current until the potential of its input terminal a becomes equal to the second reference potential Vref2. At the time when the potential of its input terminal a becomes equal to the second reference potential Vref2, the amount of charge equal to the amount of leaked charge $q_L$ is supplied to the electrode A of the capacitor C1. On the other hand, the leaked charge $-q_L$ moved to the electrode C of the capacitor C2 are restored to the electrode B of the capacitor C1. As a result, the capacitor C1 is restored to the state where no charge leakage occurred, while the capacitor C2 is returned to its state immediately after the initialization. As a result, an analog signal having the same voltage level as that in the writing operation is output.

The above reading operation allows the charge which is once leaked from the capacitor C1 to be restored. Therefore, the above operation can refresh the recorded analog signal. More specifically, in the case where the written data is not read but is held for a long period of time, a reading operation is performed in the course of the holding operation to restore the leaked charge so as to refresh the recorded analog signal. When such a reproducing operation is repeated, it is possible to hold an analog signal for a long period of time.

In the timing diagram shown in FIG. 23B, a holding operation is performed after the reading operation. Then, a subsequent writing operation is performed. However, as already described in association with Example 1, the holding operation after the reading operation is not necessarily required. Therefore, even by performing the writing operation immediately after the reading operation, the same effect can be obtained with regard to recording of the analog signal.

Example 11

Figure 24:
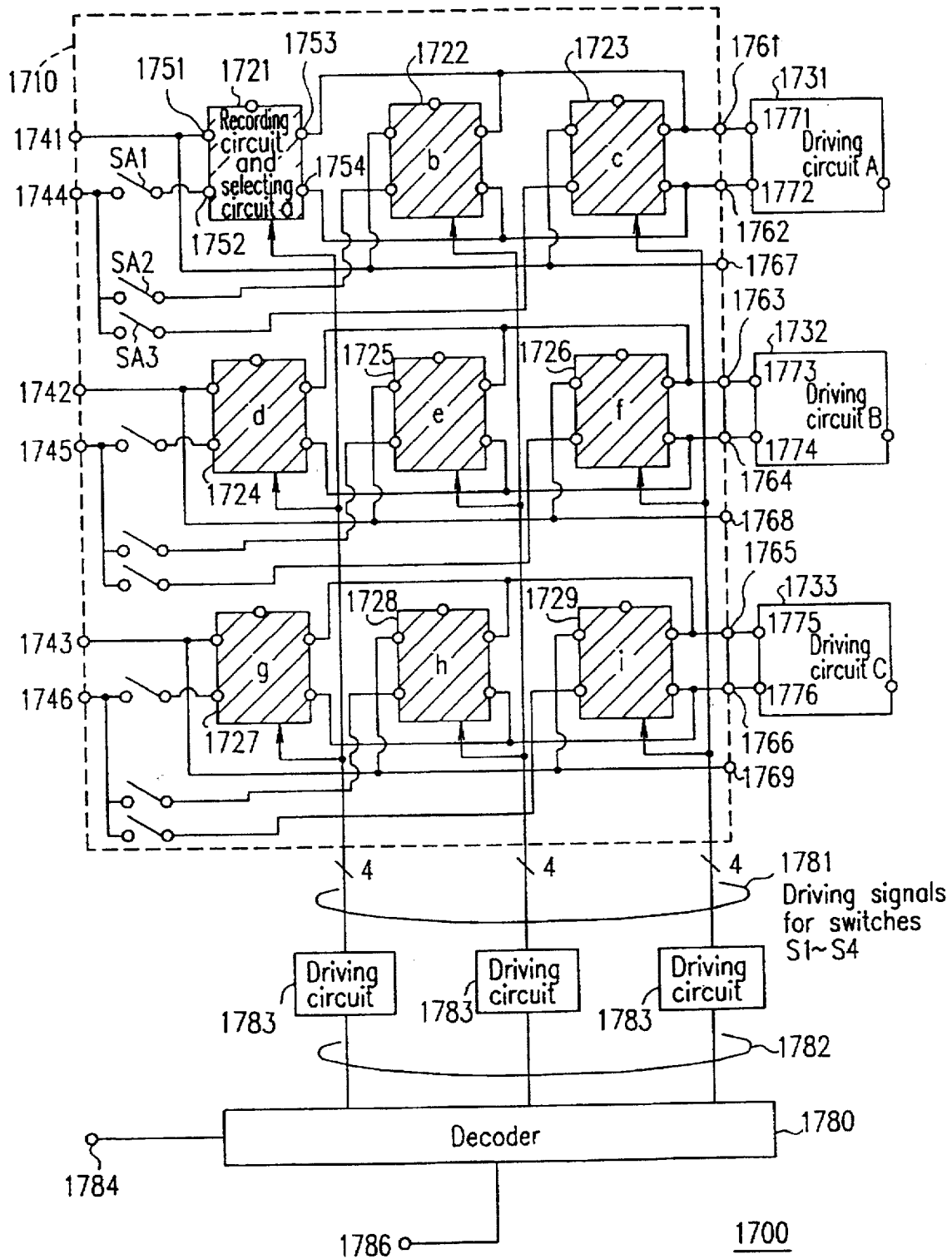
FIG. 24 is a circuit diagram showing the configuration of an analog memory circuit of Example 11 according to the present invention.

FIG. 24 is a diagram showing the configuration of an analog memory circuit 1700 of Example 11 according to the present invention.

The analog memory circuit 1700 includes an analog memory array 1710. In the analog memory array 1710, nine recording/selecting circuits 1721 to 1729 are arranged in a matrix of 3×3. Each of the recording/selecting circuits 1721 to 1729 collectively refers to the recording circuit and the selecting circuit included in the analog memory circuit of each of the aforementioned examples. For example, if the analog memory circuit 100 as shown in FIG. 1 is taken as an example, each of the recording/selecting circuits 1721 to 1729 corresponds to the recording circuit 110 and the selecting circuit 130. Since its configuration is the same as that described in association with the above-described examples, the description thereof is herein omitted.

The recording/selecting circuits 1721 to 1723 arranged in the first row are connected to a driving circuit 1731. Similarly, the recording/selecting circuits 1724 to 1726 in the second row and the recording/selecting circuits 1727 to 1729 in the third row are connected to driving circuits 1732 and 1733, respectively. These driving circuits 1731 to 1733 are driving circuits included in the analog memory circuit of each of the examples described above. For example, in the case of the analog memory circuit 100 shown in FIG. 1, each of the driving circuits 1731 to 1733 corresponds to the driving circuit 150. Since its configuration is the same as that described in association with the above-described examples, the description thereof is herein omitted.

An input analog signal supplied to the input/output terminal 1741 is input to a terminal 1751 of the recording/selecting circuit 1721. On the other hand, a signal supplied to an injection terminal 1744 is input to a terminal 1752 of the recording/selecting circuit 1721 via a switch SA1. On the other hand, terminals 1753 and 1754 of the recording/selecting circuit 1721 are connected to the terminals 1771 and 1772 of the driving circuit 1731 via terminals 1761 and 1762, respectively.

The configuration of the other recording/selecting circuits 1722 to 1729 is basically the same as that of the recording/selecting circuit 1721 described above. For example, an input analog signal input to the injection terminal 1744 is input to the recording/selecting circuits 1722 and 1723 via the switches SA2 and SA3.

Each of the recording/selecting circuits 1721 to 1729 included in the analog memory array 1710 is connected to a decoder circuit 1780. A clock signal input terminal 1784 and a selection signal input terminal 1786 are provided in the decoder circuit 1780. More specifically, a decoder output 1782 from the decoder circuit 1780 functions as enable signals for the switches S1 to S4 included in the respective recording/selecting circuits 1721 to 1729, and is connected to the driving circuits 1783 for generating the driving signals 1781 for each of the switches S1 to S4.

Selection signals D1 to D8 for selecting a predetermined circuit from a plurality of the recording/selecting circuits 1721 to 1729 included in the analog memory array 1710 are input to the selection signal input terminal 1786 of the decoder circuit 1780. The decoder circuit 1780 decodes the input selection signals D1 to D8 so as to output signals Q0 to Q7 through a decoder output 1782. As a result, a predetermined one of the recording/selecting circuits 1721 to 1729 is selected.

Figure 25:
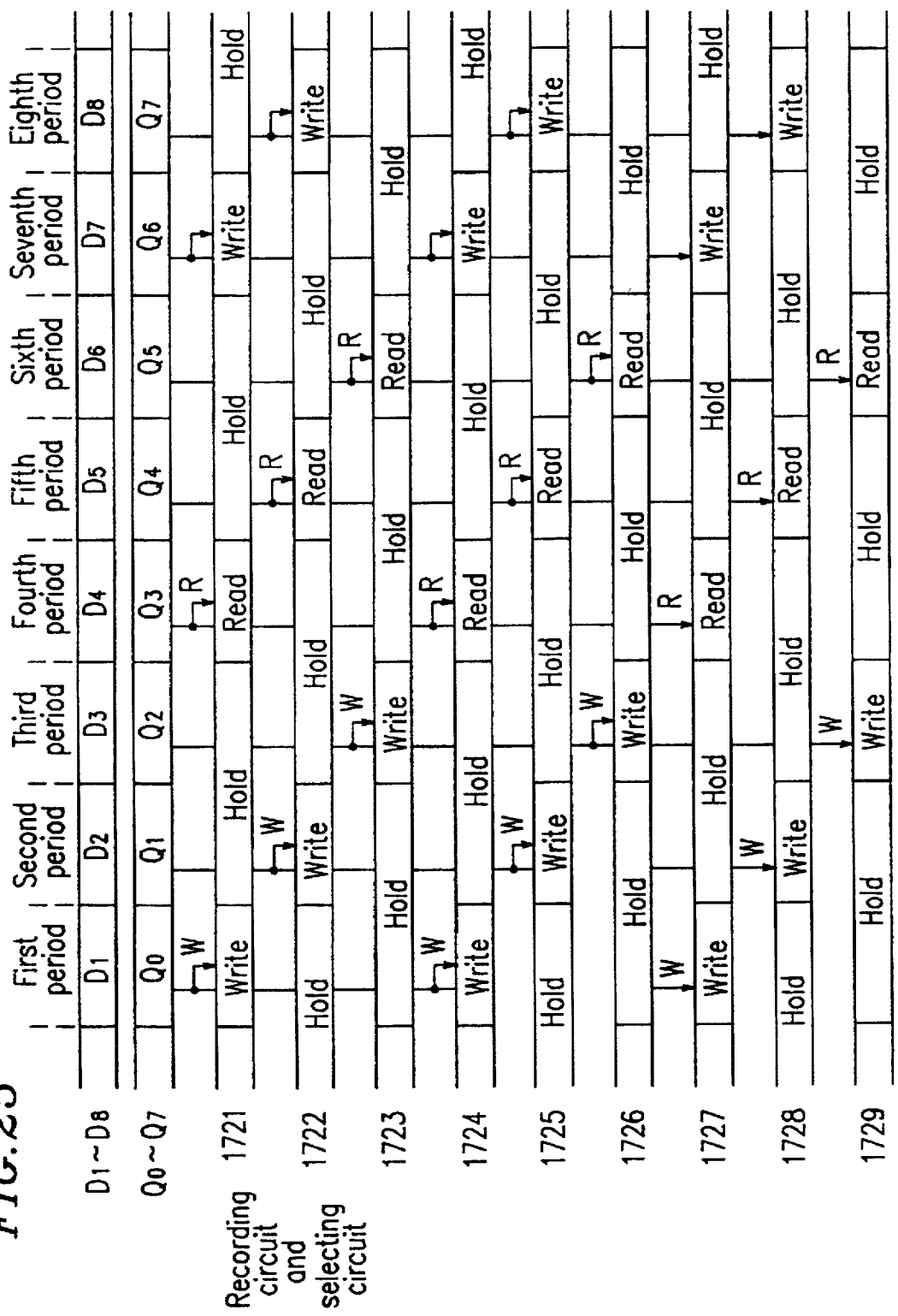
FIG. 25 is a timing chart showing the operation of the analog memory circuit shown in FIG. 24.

The thus configured analog memory circuit 1700 of Example 11 will be described with reference to FIG. 25.

In a first period, the recording/selecting circuit 1721 is connected to the driving circuit 1731 by the switch S4 (see FIG. 1) included in the recording/selecting circuit 1721 to perform a writing operation. At this point, other recording/selecting circuits 1722 and 1723 corresponding to the driving circuit 1731 are in a holding state, respectively. The switches S2 and S4 (see FIG. 1) constituting these recording/selecting circuits are in an OFF state. Therefore, the recording/selecting circuits 1722 and 1723 are separated from the driving circuit 1731.

Next, in a second period, the recording/selecting circuit 1722 is connected to the driving circuit 1731 by the switch S4 included in the recording/selecting circuit 1722 to perform a writing operation. At this point, other recording/selecting circuits 1721 and 1723 corresponding to the driving circuit 1731 are in a holding state, respectively. The switches S2 and S4 constituting these recording/selecting circuits are in an OFF state. Therefore, the recording/selecting circuits 1721 and 1723 are separated from the driving circuit 1731.

Next, in a third period, the recording/selecting circuit 1723 is connected to the driving circuit 1731 by the switch 84 included in the recording/selecting circuit 1722 to perform a writing operation. At this point, other recording/selecting circuits 1721 and 1722 corresponding to the driving circuit 1731 are in a holding state, respectively. The switches S2 and S4 constituting these recording/selecting circuits are in an OFF state. Therefore, the recording/selecting circuits 1721 and 1722 are separated from the driving circuit 1731.

In this manner, any one of the recording/selecting circuits 1721 to 1723 related to the driving circuit 1731 is connected to the driving circuit 1731 to perform either a writing operation or a reading operation. During the operation, the remaining two recording/selecting circuits perform a holding operation. As a result of this, only one driving circuit can handle a plurality of recording/selecting circuits.

When three driving circuits are provided as shown in FIG. 24, three signals can be simultaneously written or read. In such a case, as shown in FIG. 25, it is sufficient that each of the group of the recording/selecting circuits 1724 to 1726 related to the driving circuit 1732 and the group of the recording/selecting circuits 1727 to 1729 related to the driving circuit 1733 operates in a similar manner as that of the recording/selecting circuits 1721 to 1723 related to the driving circuit 1731 described above.

With such a configuration, the number of driving circuits with respect to the number of recording/selecting circuits can be reduced. Therefore, a recording density can be improved, and power consumption can be reduced.

Example 12

Figure 26:
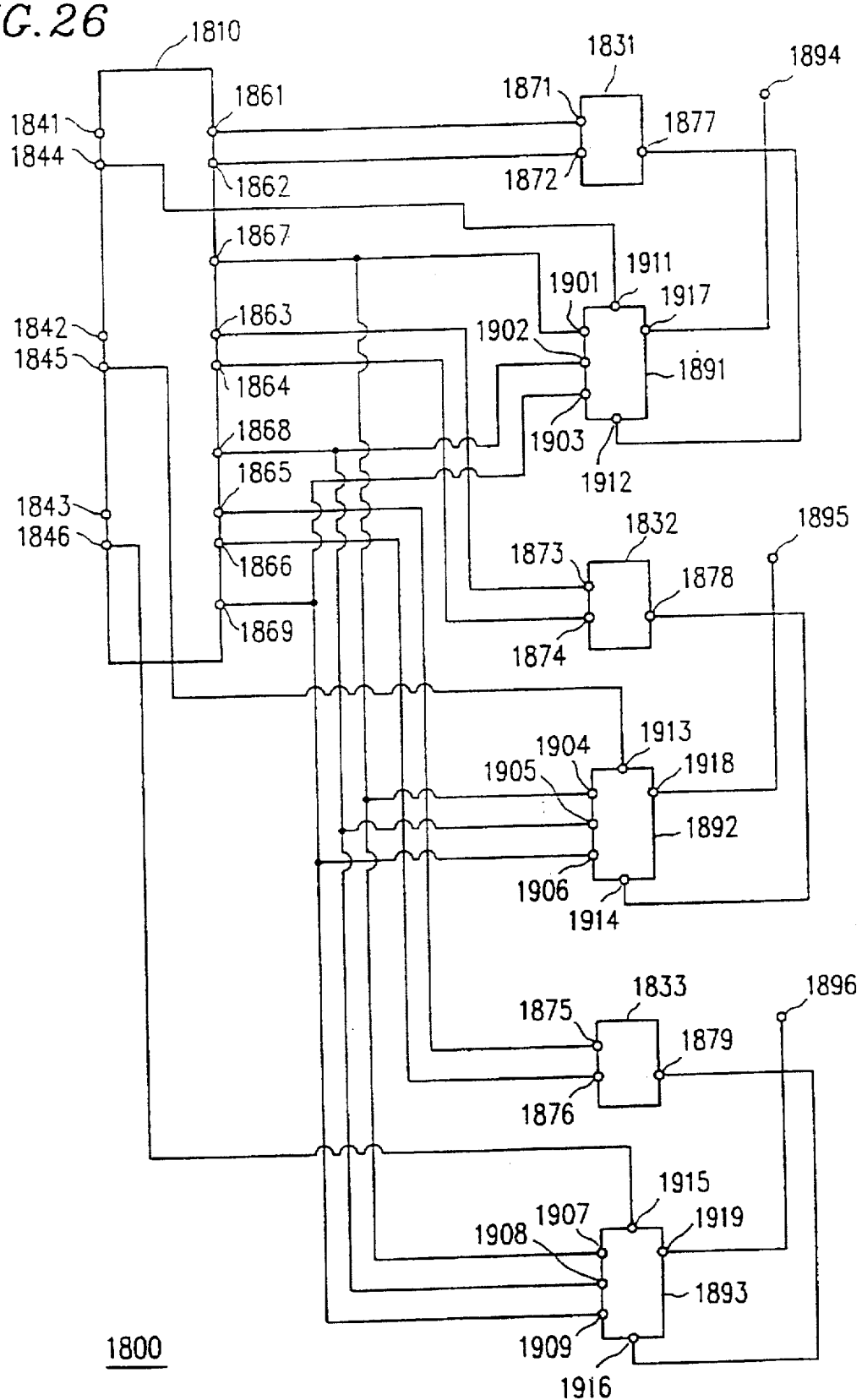
FIG. 26 is a circuit diagram showing the configuration of a computing circuit of Example 12 of the present invention.

FIG. 26 is a diagram showing the configuration of a computing circuit 1800 of Example 12 according to the present invention, which is constituted by using the analog memory circuit of the present invention.

The computing circuit 1800 includes an analog memory array 1810 having input/output terminals 1841 to 1843 and injection terminals 1844 to 1846. The analog memory array 1810 includes nine recording/selecting circuits arranged in three rows by three columns. Since the analog memory array 1810 has the same configuration as that of the analog memory array 1710 of Example 11 described with reference to FIG. 24, the description thereof is herein omitted.

Three driving circuits 1831 to 1833 respectively corresponding to driving circuits 1731 to 1733 of FIG. 24 are connected to the analog memory array 1810. The driving circuit 1831 is connected to the recording/selecting circuits of the first row in the analog memory array 1810 via terminals 1861, 1862, 1871 and 1872. Similarly, the driving circuits 1832 and 1833 are connected to the recording/selecting circuits of the second row and those of the third row via terminals 1863, 1864, 1873 and 1874 and terminals 1865, 1866, 1875 and 1876, respectively.

The computing circuit 1800 further includes three storing circuits 1891 to 1893. For example, the storing circuit 1891 is connected to the recording/selecting circuits of the first row via terminals 1901 and 1867, to the recording/selecting circuits of the second row via terminals 1902 and 1868, and the recording/selecting circuits of the third row via terminals 1903 and 1869. The storing circuit 1891 has a terminal 1917 connected to the signal input terminal 1894. An output terminal 1911 of the storing circuit 1891 is connected to the injection terminal 1844 of the analog memory array 1810. Furthermore, a terminal 1912 of the storing circuit 1891 is connected to the terminal 1877 of the driving circuit 1831.

The connection of each of the storing circuits 1892 and 1893 is achieved by the same manner as that of the storing circuit 1891. More specifically, the storing circuit 1892 is connected to the recording/selecting circuits of the first row via terminals 1904 and 1867, to the recording/selecting circuits of the second row via terminals 1905 and 1868, and the recording/selecting circuits of the third row via terminals 1906 and 1869. The storing circuit 1892 has a terminal 1918 connected to a signal input terminal 1895. An output terminal 1913 of the storing circuit 1892 is connected to the injection terminal 1845 of the analog memory array 1810. Furthermore, the terminal 1914 of the storing circuit 1892 is connected to the terminal 1878 of the driving circuit 1832. Similarly, the storing circuit 1893 is connected to the recording/selecting circuits of the first row via terminals 1907 and 1867, to the recording/selecting circuits of the second row via terminals 1908 and 1868, and the recording/selecting circuits of the third row via terminals 1909 and 1869. The storing circuit 1893 has a terminal 1919 connected to a signal input terminal 1896. An output terminal 1915 of the storing circuit 1893 is connected to the injection terminal 1846 of the analog memory array 1810. Furthermore, the terminal 1916 of the storing circuit 1893 is connected to the terminal 1879 of the driving circuit 1833.

The configuration of each of the storing circuits 1891 to 1893 will be described, taking the storing circuit 1891 shown in FIG. 27 as an example.

The storing circuit 1891 includes three capacitors 1931 to 1933. Assuming that a capacitance value of the capacitor 1933 is C, a capacitance value of the capacitor 1932 is set at a doubled value, that is, 2C, and a capacitance value of the capacitor 1931 is set at a quadrupled value, that is, 4C. These capacitors 1931 to 1933 are connected to the terminals 1901 to 1903, 1911 and 1912 by eighteen switches, i.e., SW1 to SW18. Furthermore, the storing circuit 1891 includes a clock generating circuit 1920 connected to the terminal 1917 which is further connected to the exterior signal input terminal (see FIG. 26). The clock generating circuit 1920 transmits a plurality of switch control signals 1921 based on the externally input clock signal to control the operation of the eighteen switches SW1 to SW18.

Figure 27:
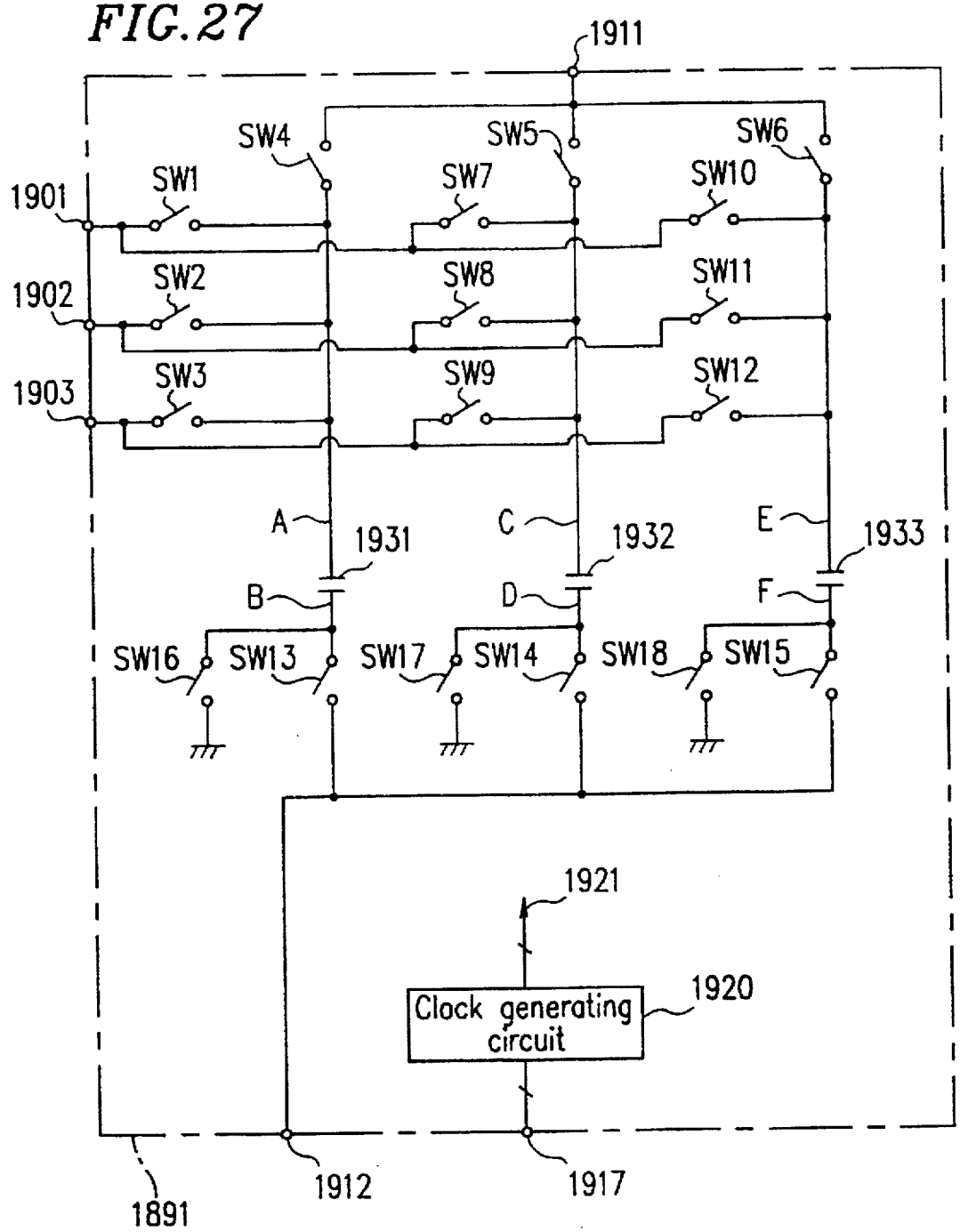
FIG. 27 is a circuit diagram showing the configuration of a storing circuit included in the computing circuit shown in FIG. 26.

Each of the other storing circuits 1892 and 1893 is the same as that shown in FIG. 27.

Figure 28:
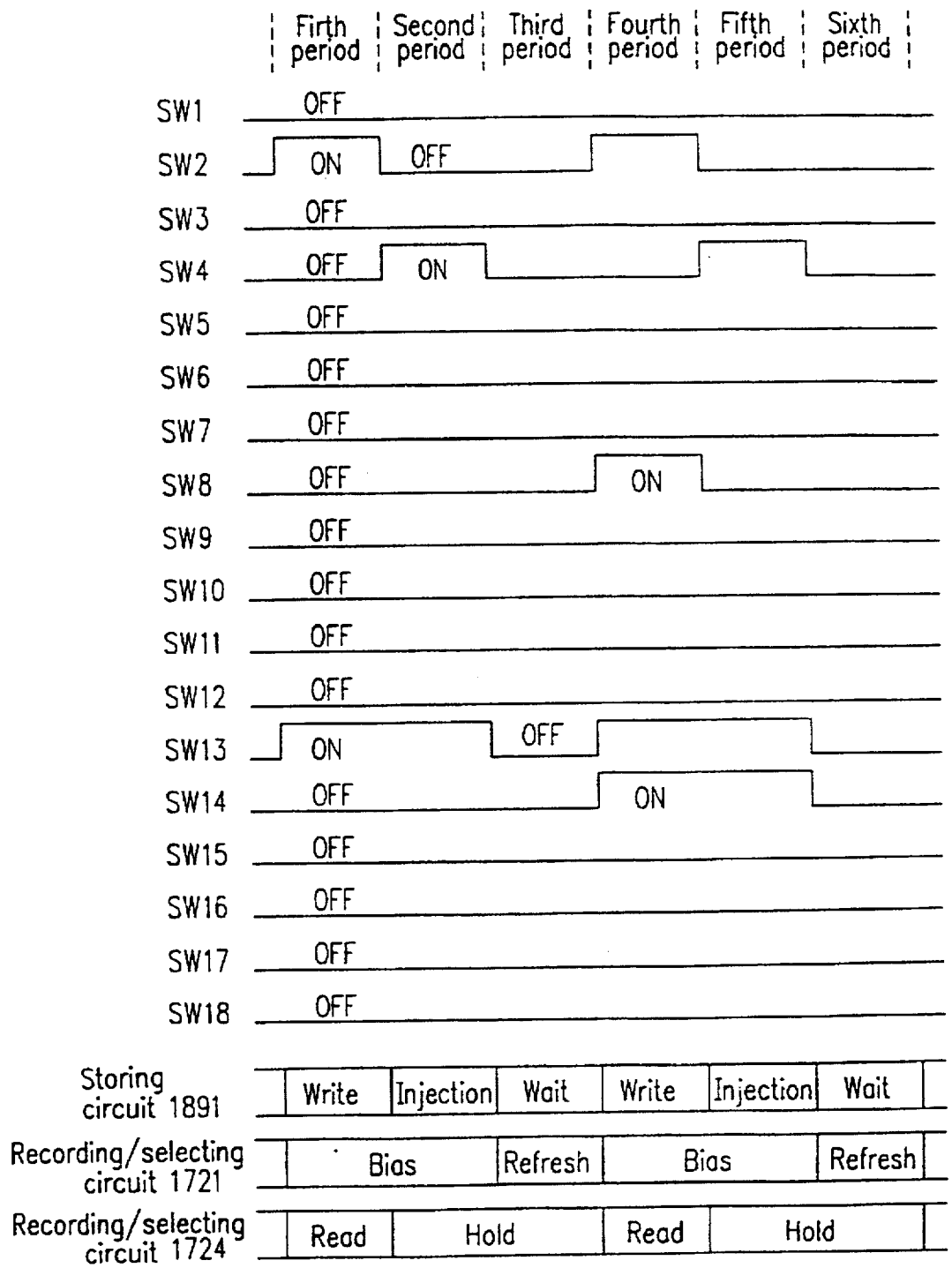
FIG. 28 is a timing diagram showing the operation of the computing circuit shown in FIG. 26.

The operation of the thus configured computing circuit 1800 of Example 12 will be described with reference to FIG. 28. FIG. 28 shows the operational state of the switches included in the storing circuit 1891. The reference numeral denoting the recording/selecting circuits in the following description correspond to the reference numerals in the configuration shown in FIG. 24.

In a first period, the switches SW1, SW3 to SW12, SW14 to SW18 are turned OFF, while the switches SW2 and SW13 are turned ON. At this point of time, the first recording/selecting circuit 1721 in the first row performs a bias operation. In the bias operation, the switches S1, S2 and S4 included in the recording/selecting circuit 1721 are turned OFF. Furthermore, the switch S3 constituting the driving circuit 1831 connected to the recording/selecting circuit 1721 is turned ON. Therefore, while the recording/selecting circuit 1721 performs a bias operation, the other recording/selecting circuits 1722 and 1723 in the first row in the analog memory array are in a holding state. On the other hand, the first recording/selecting circuit 1724 in the second row in the analog memory array performs a reading operation. Therefore, the other recording/selecting circuits 1725 and 1726 in the second row in the analog memory array are in a holding state.

In such an operating state of the recording/selecting circuits 1721 and 1724, a signal recorded in the recording/selecting circuit 1724 is output to the terminal 1902 of the storing circuit 1891, and is then supplied to the electrode A of the capacitor 1931 having a capacitor value of 4C via the switch SW2. On the other hand, a signal from an amplifier output terminal of the driving circuit 1731, that is, a voltage set to a level to which the positive input terminal of the operational amplifier is grounded, is supplied to the terminal 1912, and is applied to the other electrode B of the capacitor 1933 via the switch SW13. Therefore, a voltage corresponding to a voltage difference between the voltage of the analog signal recorded in the recording/selecting circuit 1724 and the voltage to which the positive input terminal of the operational amplifier is grounded is applied to the capacitor 1931, thereby performing the charging.

On the other hand, since no voltage is applied to the other two capacitors 1932 and 1933, no charge is stored therein.

In a second period, the switches SW1 to SW3, SW5 to SW12, and SW14 to SW18 are turned OFF, while the switches SW4 and SW13 are turned ON. At this point of time, the recording/selecting circuit 1721 and the driving circuit 1731 perform a bias operation, and the recording/selecting circuit 1724 performs a holding operation.

In the stored circuit 1891, a voltage of the electrode B of the capacitor 1931 is a voltage to which the positive input terminal of the operational amplifier is grounded. The other electrode A is connected via the switch SW4 to the electrode C of the capacitor C2 constituting the recording/selecting circuit 1721 which is connected by the switch SA1 shown in FIG. 24, thereby distributing the charges to the electrode A. However, since the switch SA1 is turned ON and the switches SA2 ad SA3 are turned OFF, one-fifth of the amount of charge stored in the capacitor 1931 of the storing circuit 1891 is injected to the capacitor C2.

In a third period, when the recording/selecting circuit 1721 and the driving circuit 1831 start a reproduction operation (refresh operation), the charge injected to the capacitors 1931 to 1933 of the storing circuit 1891 during the second period are added to each other. In the above-described case, the amount of charge to be added is one-fifth the amount of charge stored in the capacitor 1933 in the second period. Therefore, a signal obtained by adding a value corresponding to one-fifth of the recording signal of the recording/selecting circuit 1724 to a recording signal of the recording/selecting circuit 1721 is output in this third period.

As described above, in the computing circuit 1800 of Example 12, a value obtained by multiplying the recording signal of one of the recording/selecting circuits constituting the analog memory array 1819 by a predetermined value is added to the recording signal of another recording/selecting circuit. Then, computation processing is performed. In the above description, the storing circuit 1891 includes the capacitors 1931 to 1933 respectively having capacitance values of C, 2C and 4C. Furthermore, when a capacitor having another capacitance value is provided, various computations can be achieved by performing the addition of a value obtained by multiplying the recorded signal by various values.

Example 13

Next, with reference to FIG. 13, an example of the configuration of a capacitor to be included in the analog memory circuit of the present invention will be described. The following description is applicable to any one of the analog memory circuits of the examples described above. Although this configuration is applicable to any capacitor included in each of the analog memory circuits, this configuration is particularly effective for the application to the capacitors C1, C2 and C3.

In the analog memory circuit in each of the examples described above, the operational amplifier 152 generates an output voltage based on the amount of charge mainly stored in the capacitors C1 to C3 in the series of a writing operation, a holding operation, a reading operation and reproduction operation. Therefore, if the capacitor has a large voltage dependence of a capacitance value due to its configuration, an error does not occur when the recorded signal is to be read. Thus, the capacitor 600 having the configuration as shown in FIG. 13 can be used as a capacitor constituting the analog memory circuit of the present invention.

Figure 13:
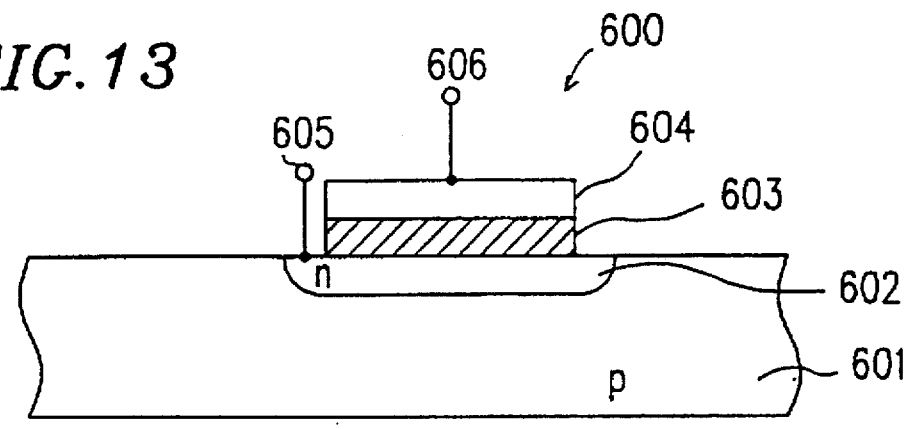
FIG. 13 is a cross-sectional view showing an example of the configuration of the capacitor included in the analog memory circuit of the present invention.

The capacitor 600 shown in FIG. 13 includes a p-type semiconductor substrate, for example, a p-type silicon substrate 601. An n-type impurity diffused region 602 is formed in the upper region of the p-type silicon substrate 601 so as to serve as a lower electrode 602. A silicon oxide film 603 is formed on the n-type impurity diffused region 602 as an insulating film. Furthermore, a polysilicon layer 604 is formed on the silicon oxide film 603 so as to serve as an upper electrode 604. Terminals 605 and 606 are connected to the lower electrode 602 and the upper electrode 604, respectively.

A capacitance value of the thus configured capacitor 600 is generally greatly varied by the voltage signals supplied to the terminals 605 and 606. However, even when the capacitor 600 having such a large voltage dependence of the capacitance value is used as a capacitor constituting the analog memory circuit of the present invention, the analog potential is reproduced based on the amount of charge stored in the capacitor. Therefore, a reading error does not occur.

Since the capacitor C4 described in Example 4 is always charged to a constant voltage, the voltage dependency of the capacitance value does not generate a reading error.

When the capacitor included in the analog memory circuit of the present invention is constituted as a capacitor 600 described above, it is not necessary to form a double-layered polysilicon layer structure as in the capacitor of the conventional analog memory circuit. Therefore, the analog memory circuit of the present invention including the analog memory can be fabricated by the same fabrication process as that of a digital LSI. As a result, the analog memory can be present along with various systems on the same chip.

Figure 14:
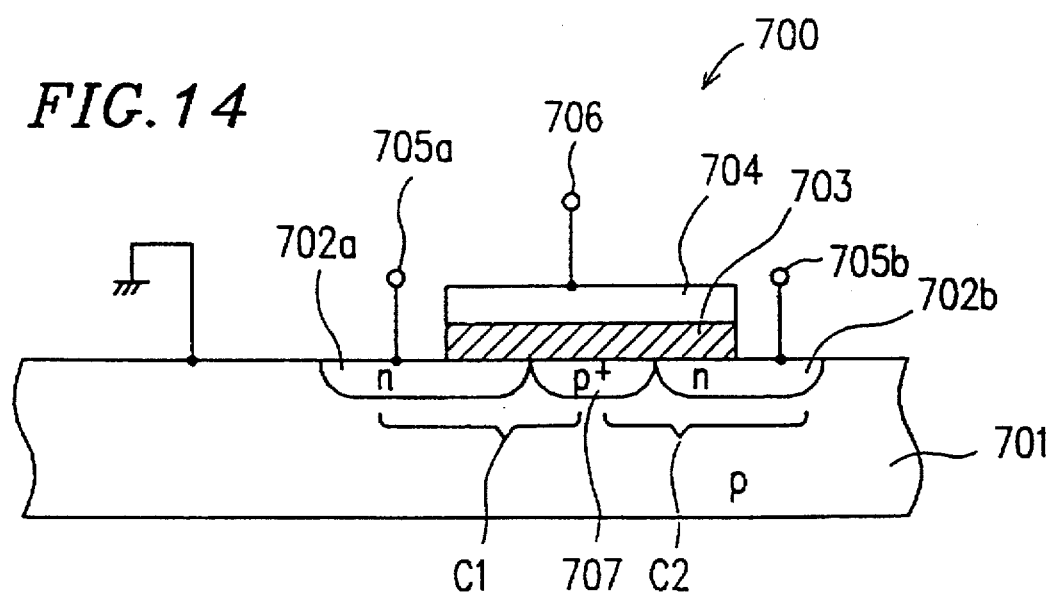
FIG. 14 is a cross-sectional view showing another example of the configuration of the capacitor included in the analog memory circuit of the present invention.

Next, with reference to FIG. 14, another capacitor configuration 700 applicable to the analog memory circuit according to the present invention will be described.

In the capacitor configuration 700, a pair of n-type impurity diffused regions 702a and 702b are formed on a p-type semiconductor substrate, for example, a p-type silicon substrate 701, which is grounded to a ground potential. A terminal 705a is connected to the n-type impurity diffused region 702a, while a terminal 705b is connected to the other n-type impurity diffused region 702b. A $p^+$-type impurity diffused region (a heavily doped p-type impurity diffused region) 707 is formed between the two n-type impurity diffused regions 702a and 702b so as to electrically separate the two regions from each other. Furthermore, a silicon oxide film 703 is formed on these three impurity diffused regions 702a, 702b and 707. Then, a polysilicon layer 704 is formed on the silicon oxide film 703. A terminal 706 is connected to the polysilicon layer 704.

In the thus configured capacitor configuration 700, the n-type impurity diffused region 702a is used as a lower electrode 702a corresponding to the electrode A of the capacitor C1, and the n-type impurity diffused region 702b is used as a lower electrode 702b corresponding to the electrode D of the capacitor C2. The polysilicon layer 704 is used as an upper electrode 704 corresponding to the electrode B of the capacitor C1 and the electrode C of the capacitor C2, which is shared by the capacitors C1 and C2.

In this configuration, charge is generally leaked from the lower electrodes (n-type impurity diffused regions) 702a and 702b in a gradual manner due to a reverse current flowing across the p-type silicon substrate 701 and the lower electrodes 702a and 702b. In the analog memory circuit of each of the examples described above according to the present invention, however, a reading operation is performed by using the charge stored in the upper electrode (polysilicon layer) 704 shared by the electrode B of the capacitor C1 and the electrode C of the capacitor C2. Since the leakage of charge does not occur from the upper electrode 704, an error is not generated when the analog recording signal is read.

With the thus formed capacitor configuration 700 described above, a circuit area can be reduced. Therefore, a recording density can be improved.

Figure 15A:
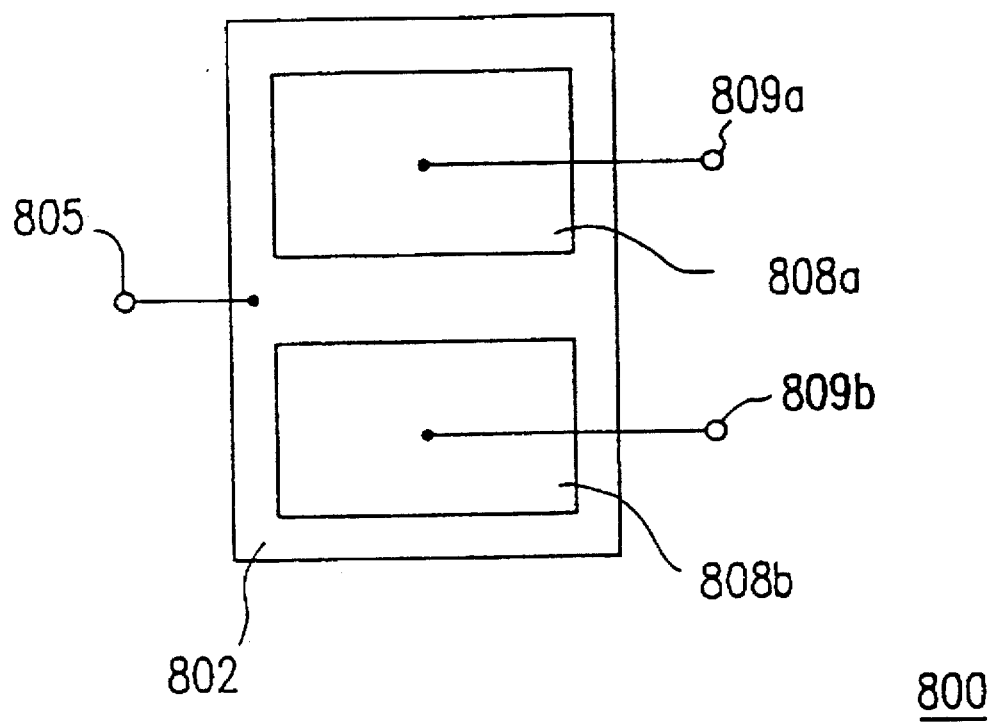
FIG. 15A is a plan view showing still another example of the configuration of a capacitor included in the analog memory circuit of the present invention.
Figure 15B:
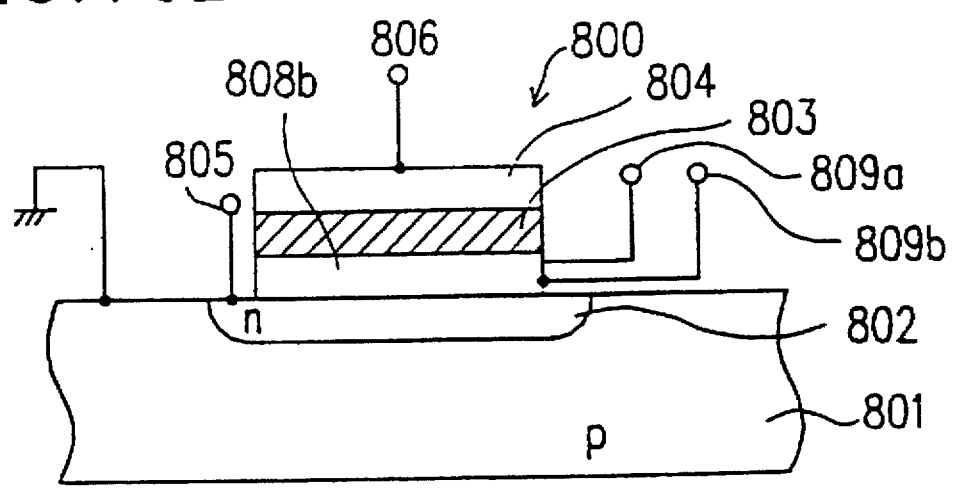
FIG. 15B is a cross-sectional view of the configuration shown in FIG. 15A.

FIGS. 15A and 15B show still another capacitor configuration 800 applicable to the analog memory circuit of the present invention. FIG. 15A is a plan view showing the capacitor structure 800, and FIG. 15B is a cross-sectional view thereof.

In the capacitor configuration 800, on a grounded p-type semiconductor substrate, for example, a p-type silicon substrate 801, an n-type impurity diffused region 802 is formed. A terminal 805 is connected to the n-type impurity diffused region 802, and is connected to a constant voltage.

The polysilicon layer formed on the n-type impurity diffused region 802 is patterned into a predetermined shape so as to form two polysilicon regions 808a and 808b serving as lower electrodes 808a and 808b, respectively. Terminals 809a and 809b are connected to the lower electrodes 808a and 808b, respectively (note that FIG. 15A shows this state). Furthermore, the silicon oxide film 803 serves as an insulating film and is formed on the lower electrodes 808a and 808b. A polysilicon layer 804 is formed as an upper electrode so as to cover the silicon oxide film 803. A terminal 806 is connected to the polysilion layer 804.

In the thus configured capacitor configuration 800, the lower electrode 808a corresponds to the electrode A of the capacitor C1, and the lower electrode 808b corresponds to the electrode D of the capacitor C2. The polysilicon layer 804 is shared by the capacitors C1 and C2 so as to correspond to the electrode B of the capacitor C1 and the electrode C of the capacitor C2. In this configuration, charge leakage from the upper electrode 804, which is supposed to hold the charge, does not occur due to a reverse current across the diode. Therefore, an error is not generated when the analog recording signal is read.

The conductivity types of the impurity diffused regions and the substrate in the above description can be exchanged with each other.

Although the insulating film is made of a silicon oxide film and the electrode is made of polysilicon in the above example, the materials thereof are not limited thereto. For example, a silicon nitride ($Si_3N_4$) film or an $SiO_2$—$P_2O_5$ film can also be used as an insulating film. The materials of the electrode may include molybdenum (Mo) or tungsten (W).

Furthermore, the substrate is not limited to a silicon substrate. For example, a substrate made of another material, for example, germanium (Ge) or GaAs can be used.

Example 14

Figure 16:
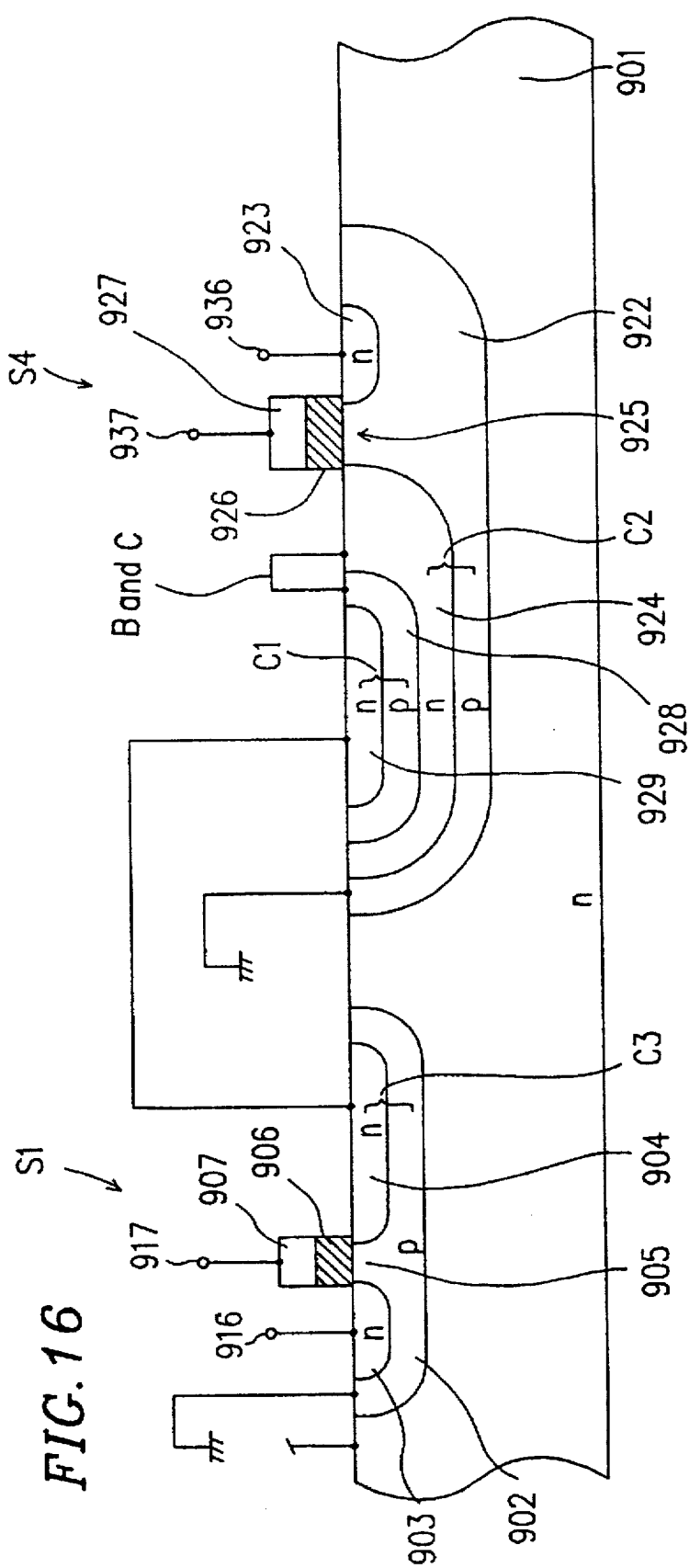
FIG. 16 is a cross-sectional view showing an example of the configuration of an analog memory circuit according to the present invention.

Next, an example of the configuration of the switches S1 and S4 and the capacitors C1 to C3 included in the analog memory of the present invention will be described. FIG. 16 is a cross-sectional view showing the state where the switches S1 and S4 and the capacitors C1 to C3 are formed on a semiconductor substrate 901.

In the configuration shown in FIG. 16, the switches S1 and S4 are both n-MOS transistors. More specifically, each of the switches S1 and S4 has a similar configuration to that of the MOS transistor previously described with reference to FIG. 3. The components having the corresponding functions are denoted by the corresponding reference numerals, and the detailed description thereof is omitted.

An n-type impurity diffused region 904 serving as a drain region of the switch S1 is connected to an n-type impurity diffused region 929 described below. This drain region (n-type impurity diffused region) 904 and the p-type impurity diffused region 902 serving as a well are reverse biased for the operation of the analog memory circuit. A capacitor is formed at a pn junction between the n-type impurity diffused region 904 and the p-type impurity diffused region 902. This capacitor formed at a pn junction between the n-type impurity diffused region 904 and the p-type impurity diffused region 902 functions as the capacitor C3 previously described with reference to FIG. 10.

On the other hand, a p-type impurity diffused region 928 is formed in an n-type impurity diffused region 924 serving as a drain region of the switch S4. Furthermore, an n-type impurity diffused region 929 is formed inside the p-type impurity diffused region 928. The n-type impurity diffused region 924 and the p-type impurity diffused region 928 are connected to each other. The capacitor formed at a pn junction between the p-type impurity diffused region 928 and the n-type impurity diffused region 929 formed therein by reverse biasing the junction is used as the capacitor C1. The capacitor at a pn junction formed by reverse biasing the p-type impurity diffused region 922 functioning as a well of the switch S4 and the n-type impurity diffused region 924 functioning as a drain region is used as the capacitor C2.

In the configuration described above, the n-type impurity diffused region 929 forming the capacitor C1 corresponds to the electrode A in FIG. 1, and the p-type impurity diffused region 922 forming the capacitor C2 corresponds to the electrode D in FIG. 1. Furthermore, the p-type impurity diffused region 928 and the n-type impurity diffused region 924 connected to each other correspond to the electrode B of the capacitor C1 and the electrode C of the capacitor C2, respectively.

According to the configuration described above, a circuit area required for the capacitors C1 to C3 included in the analog memory circuit of the present invention can be reduced. As a result, a recording density is improved.

Figure 17:
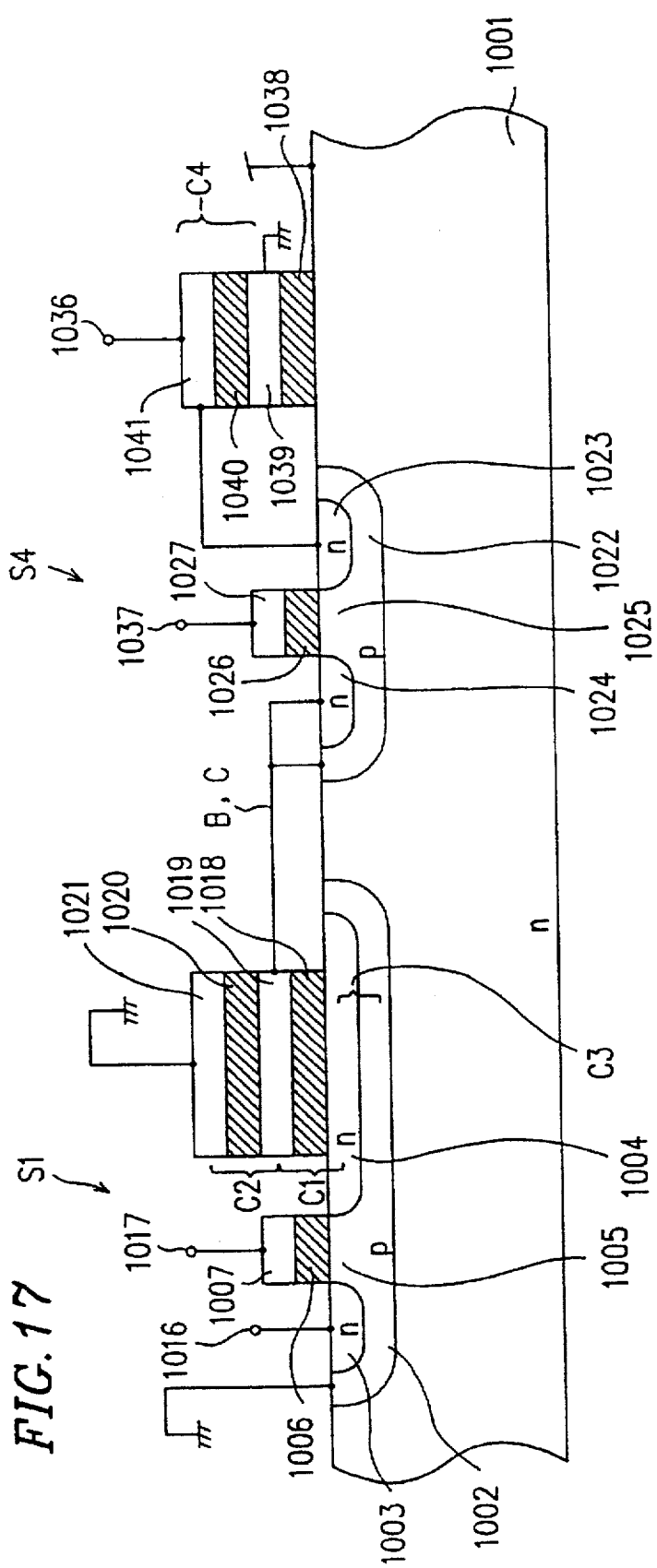
FIG. 17 is a cross-sectional view showing another example of the configuration of an analog memory circuit according to the present invention.

FIG. 17 shows another configuration of the switches S1 and S4 and the capacitors C1 to C4 included in the analog memory circuit of the present invention. FIG. 17 is a cross-sectional view showing the state where the switches S1 and S4 and the capacitors C1 to C4 are formed on a semiconductor substrate 1001.

In FIG. 17, the switches S1 and S4 are both n-MOS transistors. More specifically, each of the switches S1 and S4 has a structure similar to that previously described with reference to FIG. 16. The corresponding components are denoted by the corresponding reference numerals, and the detailed description thereof is omitted. It should be noted that a capacitor formed at a pn junction between an n-type impurity diffused region 1004 and a p-type impurity diffused region 1002 with respect to the switch S1 functions as the capacitor C3.

A lower silicon oxide film 1018, a lower polysilicon layer 1019, an upper layer silicon oxide film 1020 and an upper polysilicon layer 1021 are deposited in this order on the n-type impurity diffused region 1004 serving as a drain region of the switch S1, thereby constituting the capacitors C1 and C2.

An p-type impurity diffused region 1022 serving as a well of the switch S4 and an n-type impurity diffused region 1024 serving as a drain region are connected to each other.

On the n-type silicon substrate 1001, a layered structure including a lower silicon oxide film 1038, a lower polysilicon layer 1039, an upper silicon oxide film 1040 and an upper polysilicon layer 1041 in this order is formed in the region on which the switches S1 and S4 are not formed. The n-type impurity diffused region 1023 serving as a source region of the switch S4 is connected to the upper polysilicon layer 1041. A capacitor formed by the lower polysilicon layer 1039 and the upper polysilicon layer 1041 interposing the upper silicon oxide film 1040 therebetween is used as the capacitor C4. Furthermore, a terminal 1036 to be connected to the inverted input terminal of the operational amplifier 152 shown in FIG. 1 is connected to the upper polysilicon layer 1041.

In the configuration as described above, the n-type impurity diffused region 1004 forming the capacitor C1 corresponds to the electrode A in FIG. 1, while the upper polysilicon layer 1021 forming the capacitor C2 corresponds to the electrode D in FIG. 1. The lower polysilicon layer 1019 corresponds to an electrode serving as both the electrode B of the capacitor C1 and the electrode C of the capacitor C2.

According to the configuration described above, a circuit area, which is required by each of the capacitors C1 to C4 included in the analog memory of the present invention, can be reduced, resulting in improvement of a recording density.

The conductivity types of the impurity diffused regions and the substrate in the above description can be exchanged with each other.

Although the insulating film is made of a silicon oxide film and the electrode is made of polysilicon in the above example, the materials thereof are not limited thereto. For example, a silicon nitride ($Si_3N_4$) film or an $SiO_2$—$P_2O_5$ film may be used as an insulating film. The materials of the electrode may include molybdenum (Mo) or tungsten (W).

Furthermore, the substrate is not limited to a silicon substrate. For example, a substrate made of another material, for example, germanium (Ge) or GaAs can be used.

As described above, according to the analog memory circuit of the present invention, even if an analog signal recorded in a first capacitor of a recording circuit as a charge is attenuated due to charge leakage during a holding period, the leaked charge is stored in a second capacitor. Then, a corresponding amount of charge is restored in the first capacitor based on the amount of the leaked charge, and the analog signal can be read out after the deterioration thereof is eliminated.

In the case where the analog signal is held over a long period of time, the deterioration of the recorded analog signal can be eliminated (the analog signal can be refreshed). Therefore, a period of time in which the recorded signal is held can be prolonged.

By using an operational amplifier in a driving circuit, a reproducing function of the leaked charge can be realized with a simple circuit.

When a switch for connecting an inverted input terminal of an operational amplifier is included in a driving circuit with a reference potential, or a switch for connecting the connection point between the first and the second capacitors and the reference potential is further provided, a period of time required to initialize the second capacitor for storing the leaked charge can be reduced.

When a third capacitor for connecting a first electrode of the first capacitor included in the recording circuit and the reference potential is further provided, various adverse effects of a parasitic capacitor present in connection with the first electrode of the first capacitor are alleviated, thereby realizing a holding operation of the analog signal in a stable manner.

When a fourth capacitor for connecting an inverted input terminal of the operational amplifier included in the driving circuit with the reference potential is further provided, the potential of the inverted input terminal of the operational amplifier is held at the same voltage level as that of the reference potential connected to the positive input terminal even when a negative feedback loop connected thereto is not constituted. As a result of this, when a negative feedback loop connected to the inverted input terminal is constituted, the inverted input terminal is immediately set at a constant voltage determined by the reference potential. Thus, the speed of a recording operation and a reading operation of an analog signal is improved.

In forming a capacitor, when the capacitor is formed by utilizing a pn junction formed in the periphery of an impurity diffused region of an MOS transistor constituting a switch included in the analog memory circuit, a circuit area required to form a capacitor is reduced. As a result, a recording density is improved.

Moreover, when two input/output terminals for an analog signal, two capacitors for storing the analog signal as a charge, and another capacitor for storing the charges leaked from the two capacitors connected in series between the two capacitors are provided, an analog signal supplied as a differential signal can be handled.

When a plurality of recording circuits are arranged in a matrix and each driving circuit is arranged for each row of the matrix of the recording circuits, a recording operation, a holding operation, a reproducing operation and a reading operation can be performed in time series for each row of the matrix of the recording circuits. By this operation, a plurality of recording circuits are driven by one driving circuit. As a result, a circuit area required to realize the analog memory circuit and power consumption can be reduced. Moreover, according to this configuration, a plurality of analog signals can be recorded.

Furthermore, by providing a plurality of storing circuits including a plurality of capacitors having respectively different capacitance values in a predetermined proportion so as to be connected to a matrix of the recording circuits, a multiplicational computation and an additional computation can be performed for a plurality of analog signals recorded in a plurality of recording circuits.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An analog memory circuit comprising:
   a recording circuit for recording and holding an input analog signal as a charge and for reading out the analog signal after deterioration of the analog signal caused by a leakage of the charge in a holding operation is eliminated;
   a selecting circuit for controlling an operation of the recording circuit; and
   a driving circuit for supplying a predetermined constant voltage to the recording circuit,
   wherein the recording circuit includes:
      an input/output terminal for inputting and outputting the analog signal;
      a first capacitor, having a first electrode coupled to the input/output terminal and a second electrode, for recording and holding the analog signal as the charge; and
      a second capacitor connected between the second electrode of the first capacitor and a reference potential, for holding a charge leaked from the first capacitor,
   wherein an amount of charge corresponding to an amount of leaked charge held in the second capacitor is restored to the first capacitor with predetermined timing.

2. An analog memory circuit according to claim 1, wherein the driving circuit supplies the reference potential to the second electrode of the first capacitor in a recording operation of the analog signal, and supplies an amount of charge corresponding to the amount of charge leaked from the first capacitor to the first electrode of the first capacitor, thereby restoring the leaked charge to the first capacitor.

3. An analog memory circuit according to claim 1, wherein the driving circuit includes: an operational amplifier having an inverted input terminal, a positive input terminal and an output terminal; and a switch for connecting the inverted input terminal and the output terminal of the operational amplifier, and
   wherein the positive input terminal of the operational amplifier is connected to the reference potential.

4. An analog memory circuit according to claim 3, wherein the selecting circuit includes a first switch for connecting the first electrode of the first capacitor with the output terminal of the operational amplifier included in the driving circuit; and a second switch for connecting a connection point between the first capacitor and the second capacitor with the inverted input terminal of the operational amplifier.

5. An analog memory circuit according to claim 3, further comprising a switch for connecting the inverted input terminal of the operational amplifier included in the driving circuit with the reference potential.

6. An analog memory circuit according to claim 1, further comprising a switch for connecting a connection point between the first capacitor and the second capacitor with the reference potential.

7. An analog memory circuit according to claim 1, further comprising a third capacitor, wherein one electrode of the third capacitor is connected to the first electrode of the first capacitor, and the other electrode of the third capacitor is connected to the reference potential.

8. An analog memory circuit according to claim 7,
   wherein the recording circuit further includes a switch constituted by an MOS transistor,
   wherein the MOS transistor includes: a first impurity diffused region of a second conductivity type formed in a semiconductor substrate of a first conductivity type; and a second impurity diffused region of the first conductivity type formed in the first impurity diffused region, and
   wherein the third capacitor is obtained by applying a reverse bias voltage across the first impurity diffused region and the second impurity diffused region.

9. An analog memory circuit according to claim 3, further comprising a fourth capacitor, wherein one electrode of the fourth capacitor is connected to the inverted input terminal of the operational amplifier included in the driving circuit, while the other electrode of the fourth capacitor is connected to the reference potential.

10. An analog memory circuit according to claim 1, wherein at least one of the first capacitor and the second capacitor is formed by an impurity diffused region of a second conductivity type formed in a semiconductor substrate of a first conductivity type, and an insulating film and a conductor layer which are sequentially formed on the impurity diffused region.

11. An analog memory circuit according to claim 1, wherein the first capacitor and the second capacitor are formed by two impurity diffused regions of a second conductivity type formed in a semiconductor substrate of a first conductivity type, interposing a heavily doped impurity diffused region of the first conductivity type therebetween, and an insulating layer and a conductor layer which are sequentially formed on the heavily doped impurity diffused region and the two impurity diffused regions.

12. An analog memory circuit according to claim 1, wherein the first capacitor and the second capacitor are formed by two conductor regions placed adjacent to each other on an impurity diffused region of a second conductivity type formed in a semiconductor substrate of a first conductivity type, and an insulating layer and a conductor layer which are sequentially formed on the two conductor regions.

13. An analog memory circuit according to claim 4,
wherein an MOS transistor constituting the second switch of the selecting circuit includes:
a first impurity diffused region of a second conductivity type formed in a semiconductor substrate of a first conductivity type; and
a second impurity diffused region of the first conductivity type formed in the first impurity diffused region,
wherein a third impurity diffused region of the second conductivity type is further formed in the second impurity diffused region, and a fourth impurity diffused region of the first conductivity is further formed in the third impurity diffused region,
wherein the first capacitor is a capacitor obtained by applying a reverse bias voltage across the fourth impurity diffused region and the third impurity diffused region, and the second capacitor is a capacitor obtained by applying a reverse bias voltage across the second impurity diffused region and the first impurity diffused region, and
wherein the second impurity diffused region and the third impurity diffused region are electrically connected to each other.

14. An analog memory circuit according to claim 4,
wherein the recording circuit includes a switch constituted by an MOS transistor,
wherein the MOS transistor includes: a lower insulating layer formed on a first impurity diffused region; a lower conductor layer formed on the lower insulating layer; an upper insulating layer formed on the lower conductor layer; and an upper conductor layer formed on the upper insulating layer,
wherein the first capacitor is formed by the first impurity diffused region, the lower insulating layer and the lower conductor layer, and the second capacitor is formed by the lower conductor layer, the upper insulating layer and the upper conductor layer, and
wherein the lower conductor layer is connected to an impurity diffused region forming another MOS transistor constituting the second switch of the selecting circuit.

15. An analog memory circuit according to claim 1, wherein the driving circuit includes an inverted amplifier having an inverted input terminal and an output terminal.

16. An analog memory circuit according to claim 1, wherein the driving circuit includes:
a detecting section for detecting an amount of change in a voltage of the analog signal recorded in the recording circuit, which is caused due to an occurrence of the charge leakage, so as to supply an output signal indicating the detected amount of change in the voltage; and
a supplying section for receiving the output signal of the detecting section so as to supply an amount of charge corresponding to the detected amount of change in the voltage to the first capacitor.

17. An analog memory circuit according to claim 16,
wherein the detecting section is a differential voltage detecting circuit for detecting a potential difference between two input terminals, one of the two input terminals being connected to a connection point between the first capacitor and the second capacitor included in the recording circuit, while the other input terminal is coupled to a predetermined standard potential, and
wherein the supplying section is a current output circuit for outputting a current having a magnitude in accordance with an input signal, and for supplying a current having a magnitude in accordance with an output signal of the differential voltage detection circuit to the first capacitor so as to supply the charge thereto.

18. An analog memory circuit according to claim 16, wherein the detecting section is connected between the first capacitor and the second capacitor included in the recording circuit, and has a charge movement amount detecting circuit for detecting an amount of charge transferred between the first capacitor and the second capacitor.

19. An analog memory circuit according to claim 1,
wherein the driving circuit includes:
a variable impedance circuit connected between a connection point between the first capacitor and the second capacitor included in the recording circuit and a predetermined reference potential, having an impedance varying in accordance with a potential difference between a supplied input potential and the predetermined reference potential; and
a converting section for detecting an amount of change in a voltage of the analog signal recorded in the recording circuit, which is caused due to occurrence of the charge leakage, from the predetermined reference potential so as to supply a current having a magnitude corresponding to the detected amount of change in voltage across the first capacitor.

20. An analog memory circuit according to claim 19, wherein the variable impedance circuit is further connected to the converting section.

21. An analog memory circuit according to claim 1, wherein the reference potential is a ground potential.

22. An analog memory circuit according to claim 1,
wherein the analog signal is a differential signal containing a first signal component and a second signal component,
wherein the first capacitor records and holds the first signal component of the differential signal as a charge,
wherein the recording circuit further includes a third capacitor for recording and holding the second signal component of the differential signal as a charge,
wherein the second capacitor holds a charge leaked from the third capacitor, and
wherein an amount of charge corresponding to the amount of the leaked charge held in the second capacitor is restored to the first capacitor and the third capacitor with predetermined timing.

23. An analog memory circuit according to claim 1, wherein a plurality of the recording circuits are arranged in a matrix, and each of a plurality of the driving circuits is arranged for each row of the matrix so as to be connected thereto, thereby recording a plurality of the analog signals.

24. An analog memory circuit according to claim 23, further comprising a plurality of storing circuits,
wherein each of the plurality of the storing circuits is connected to each row of the matrix, and has a plurality of capacitors, wherein the plurality of the storing circuits have respectively different capacitance values in a predetermined proportion, and wherein the analog signals recorded in a predetermined recording circuit among the plurality of recording circuits arranged in the matrix are selectively charged to the plurality of the capacitors of the storing circuits as charge in a sequential manner, and the stored charge is distributed to the plurality of the recording circuits, thereby performing a multiplicational computation and an additional computation for the plurality of the analog signals.

25. A method for recording an analog signal, comprising the steps of:

inputting an analog signal to an analog memory circuit;

recording the input analog signal on a recording section in the analog memory circuit as a charge;

holding the recorded analog signal over a predetermined period of time;

storing a charge which is leaked from the recording section in the holding operation to a predetermined portion and then restoring an amount of charge corresponding to an amount of the stored leaked charge to the recording section; and reading out the analog signal from the analog memory circuit.

26. A method for recording an analog signal according to claim 25, further comprising the step of detecting the amount of charge leaked from the recording section.

27. A method for recording an analog signal according to claim 25, wherein the analog signal is plural, and wherein the method comprises the steps of:

selectively storing a predetermined analog signal among the plurality of the recorded analog signals as a charge into a plurality of capacitors having respectively different capacitance values in a predetermined proportion in a sequential manner; and distributing the stored charge to the plurality of the recording circuits, thereby performing a multiplication computation and an additional computation for the plurality of the analog signals.

* * * * *